US012777711B2

(12) United States Patent
Reboh et al.

(10) Patent No.: US 12,777,711 B2

(45) Date of Patent: Oct. 27, 2026

(54) STACKED TRANSISTOR STRUCTURES WITH ALIGNED CELL BOUNDARIES AND SHIFTED CHANNELS

(71) Applicant: International Business Machines Corporation, Armonk, NY (US)

(72) Inventors: Shay Reboh, Guilderland, NY (US); Ruilong Xie, Niskayuna, NY (US); James P Mazza, Saratoga Springs, NY (US); Shahrukh Khan, Sandy Hook, CT (US); Chen Zhang, Santa Clara, CA (US); Junli Wang, Slingerlands, NY (US); Albert M. Chu, Nashua, NH (US); Utkarsh Bajpai, Delmar, NY (US)

(73) Assignee: International Business Machines Corporation, Armonk, NY (US)

( * ) Notice: Subject to any disclaimer, the term of this patent is extended or adjusted under 35 U.S.C. 154(b) by 384 days.

(21) Appl. No.: 18/391,845

(22) Filed: Dec. 21, 2023

(65) Prior Publication Data

US 2025/0212508 A1 Jun. 26, 2025

(51) Int. Cl.

| | |
|---|---|
| ***H10D 84/85*** | (2025.01) |
| ***H10D 30/01*** | (2025.01) |
| ***H10D 30/43*** | (2025.01) |
| ***H10D 30/67*** | (2025.01) |
| ***H10D 62/10*** | (2025.01) |
| ***H10D 64/01*** | (2025.01) |
| ***H10D 84/01*** | (2026.01) |
| ***H10D 84/03*** | (2025.01) |

(Continued)

(52) U.S. Cl.

CPC ......... *H10D 84/856* (2025.01); *H10D 30/014* (2025.01); *H10D 30/43* (2025.01); *H10D 30/6735* (2025.01); *H10D 62/121* (2025.01); *H10D 64/017* (2025.01); *H10D 84/0186* (2025.01); *H10D 84/038* (2025.01); *H10D 88/01* (2025.01); *H10W 20/427* (2026.01)

(58) Field of Classification Search

CPC .................................................... H10D 84/856

See application file for complete search history.

(56) References Cited

U.S. PATENT DOCUMENTS 10,164,121 B2 * 12/2018 Hatcher ............... H10D 30/031
10,192,819 B1 * 1/2019 Chanemougame .... B82Y 10/00

(Continued)

FOREIGN PATENT DOCUMENTS

| | | | |
|---|---|---|---|
| CN | 116435306 | A | 7/2023 |
| WO | 2025/133722 | A1 | 6/2025 |
| WO | 2025/133723 | A1 | 6/2025 |

OTHER PUBLICATIONS

List of IBM Patents or Patent Applications Treated as Related.

(Continued)

*Primary Examiner* — William A Harriston

(74) *Attorney, Agent, or Firm* — Kimberly Zillig; Ryan, Mason & Lewis, LLP

(57) ABSTRACT

A semiconductor structure includes a first transistor and a second transistor vertically stacked over the first transistor. The first transistor and the second transistor have horizontally aligned cell boundaries. A first set of one or more channels of the first transistor are horizontally offset from a second set of one or more channels of the second transistor within the horizontally aligned cell boundaries.

25 Claims, 29 Drawing Sheets

(51) Int. Cl.
*H10D 88/00* (2026.01)
*H10W 20/41* (2026.01)

(56) References Cited

U.S. PATENT DOCUMENTS

| | | | | |
|---|---|---|---|---|
| 10,192,867 | B1 | 1/2019 | Frougier et al. | |
| 10,297,513 | B1 * | 5/2019 | Yamashita | H10D 30/025 |
| 10,381,438 | B2 * | 8/2019 | Zhang | B82Y 10/00 |
| 10,510,622 | B1 | 12/2019 | Frougier et al. | |
| 10,868,193 | B2 | 12/2020 | Sengupta et al. | |
| 11,177,258 | B2 * | 11/2021 | Xie | H10D 30/014 |
| 11,239,232 | B2 * | 2/2022 | Lilak | B82Y 10/00 |
| 11,355,640 | B1 * | 6/2022 | Hong | H10D 30/014 |
| 11,502,167 | B2 * | 11/2022 | Hong | H10D 30/43 |
| 2009/0050941 | A1 * | 2/2009 | Yamazaki | H10D 30/0323 257/E29.004 |
| 2009/0142888 | A1 * | 6/2009 | Tsuchiya | H10D 84/038 438/763 |
| 2014/0003148 | A1 * | 1/2014 | Sun | G11C 16/0466 257/E27.06 |
| 2016/0141366 | A1 * | 5/2016 | Lai | H10D 30/023 438/157 |
| 2017/0243866 | A1 * | 8/2017 | Then | H10D 62/117 |
| 2018/0061766 | A1 * | 3/2018 | Goktepeli | H04W 88/02 |
| 2018/0108577 | A1 * | 4/2018 | Zhu | B82Y 10/00 |
| 2019/0131396 | A1 * | 5/2019 | Zhang | B82Y 10/00 |
| 2019/0229021 | A1 * | 7/2019 | Ando | B82Y 10/00 |
| 2020/0294998 | A1 | 9/2020 | Lilak et al. | |
| 2022/0115372 | A1 * | 4/2022 | Lilak | B82Y 10/00 |
| 2023/0037833 | A1 * | 2/2023 | Hong | H10D 30/43 |
| 2023/0116288 | A1 | 4/2023 | Kim | |
| 2023/0170352 | A1 | 6/2023 | Bao et al. | |
| 2023/0178436 | A1 * | 6/2023 | Gardner | H10D 30/014 |
| 2023/0178619 | A1 | 6/2023 | Chu et al. | |
| 2023/0268388 | A1 * | 8/2023 | Xie | H10D 30/43 257/288 |
| 2023/0299085 | A1 * | 9/2023 | Xie | H10D 30/014 257/351 |
| 2023/0369217 | A1 | 11/2023 | Xie et al. | |
| 2023/0387007 | A1 * | 11/2023 | Xie | H10D 30/6757 |
| 2023/0411386 | A1 * | 12/2023 | Xie | H10D 30/014 |
| 2023/0420460 | A1 * | 12/2023 | Huang | H10D 30/6735 |
| 2024/0355879 | A1 | 10/2024 | Song et al. | |
| 2024/0429102 | A1 | 12/2024 | Loh et al. | |
| 2025/0212483 | A1 | 6/2025 | Xie et al. | |

OTHER PUBLICATIONS

P. Schuddinck et al., “PPAC of Sheet-Based CFET Configurations for 4 Track Design with 16nm Metal Pitch,” Symposium on VLSI Technology & Circuits Digest of Technical Papers, Jun. 2022, pp. 365-366.

D. Draper, “Breakthroughs in 3D Stacked FinFETS and 3D Sequential Integration,” https://www.3dincites.com/2019/01/breakthroughs-in-3d-stacked-finfets-and-3d-sequential-integration/, Jan. 28, 2019, 7 pages.

T. Song, “Many-Tier Vertical Gaafet (V-FET) for Ultra-Miniaturized Standard Cell Designs Beyond 5 nm,” IEEE Access, Aug. 10, 2020, pp. 149984-149998, vol. 8.

P. Alcorn, “Imec Reveals Sub-1nm Transistor Roadmap, 3D-Stacked CMOS 2.0 Plans,” https://www.tomshardware.com/news/imec-reveals-sub-1nm-transistor-roadmap-3d-stacked-cmos-20-plans, May 26, 2023, 5 pages.

S. Ye et al., “Ultimate Vertical Gate-all-around metal-oxide-semiconductor Field-effect Transistor and its Three-dimensional Integrated Circuits,” Materials Science in Semiconductor Processing, Nov. 2021, 10 pages, vol. 134.

N.Horiguchi et al., “Imec Puts Complementary FET (CFET) on the Logic Technology Roadmap,” https://www.imec-int.com/en/articles/imec-puts-complementary-fet-cfet-logic-technology-roadmap, Jun. 16, 2022, 16 pages.

J. Ryckaert et al., “The Complementary FET (CFET) for CMOS Scaling Beyond N3,” Symposium on VLSI Technology, Jun. 2018, pp. 141-142.

International Searching Authority, “Notification of Transmittal of the International Search Report and the Written Opinion of the International Searching Authority, or Declaration,” Patent Cooperation Treaty, Jan. 7, 2025, 20 pages, International Application No. PCT/ IB2024/057081.

International Searching Authority, “Notification of Transmittal of the International Search Report and the Written Opinion of the International Searching Authority, or Declaration,” Patent Cooperation Treaty, Jan. 2, 2025, 19 pages, International Application No. PCT/ IB2024/057080.

* cited by examiner

STACKED TRANSISTOR STRUCTURES WITH ALIGNED CELL BOUNDARIES AND SHIFTED CHANNELS

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater amount of structural features for a given chip size. Miniaturization, in general, allows for increased performance at lower power levels and lower cost. Present technology is at or approaching atomic level scaling of certain micro-devices such as logic gates, field-effect transistors (FETs), and capacitors.

A field-effect transistor (FET) is a three-terminal device having a source, a gate, and a drain, and having action that depends on the flow of carriers (electrons or holes) along a channel that runs between the source and drain. Current through the channel between the source and drain may be controlled by a transverse electric field under the gate.

FETs are widely used for switching, amplification, filtering, and other tasks. FETs include metal-oxide-semiconductor (MOS) FETs (MOSFETs). Complementary MOS (CMOS) devices are widely used, where both n-type and p-type transistors (nFET and pFET) are used to fabricate logic and other circuitry. Source and drain regions of a FET are typically formed by adding dopants to target regions of a semiconductor body on either side of a channel, with the gate being formed above the channel. The gate includes a gate dielectric over the channel and a gate conductor over the gate dielectric. The gate dielectric is an insulator material that prevents large leakage current from flowing into the channel when voltage is applied to the gate conductor while allowing applied gate voltage to produce a transverse electric field in the channel.

Various techniques may be used to reduce the area of FETs. One technique is through the use of fin-shaped channels in FinFET devices. Before the advent of FinFET arrangements, CMOS devices were typically substantially planar along the surface of the semiconductor substrate, with the exception of the FET gate disposed over the top of the channel. FinFETs utilize a vertical channel structure, increasing the surface area of the channel exposed to the gate. Thus, in FinFET structures the gate can more effectively control the channel, as the gate extends over more than one side or surface of the channel. In FinFET arrangements, the gate encloses three surfaces of the three-dimensional channel, rather than being disposed over just the top surface of a traditional planar channel.

Another technique useful for reducing the size of FETs is through the use of stacked nanosheet channels formed over a semiconductor substrate. Stacked nanosheets may be two-dimensional nanostructures, such as sheets having a thickness range on the order of 1 to 100 nanometers (nm). Nanosheets and nanowires are viable options for scaling to 7 nm node and beyond. A general process flow for formation of a nanosheet stack involves removing sacrificial layers, which may be formed of Silicon Germanium (SiGe), between sheets of channel material, which may be formed of Silicon (Si).

For continued scaling and area improvement, stacked transistor structures may be used. A stacked transistor structure may include multiple transistors stacked over one another vertically.

SUMMARY

Embodiments of the invention provide techniques for forming stacked transistor structures where top and bottom transistor devices have aligned cell or device boundaries, and where channels for the top and bottom transistor devices are shifted relative to one another within the aligned cell or device boundaries.

In one embodiment, a semiconductor structure includes a first transistor and a second transistor vertically stacked over the first transistor. The first transistor and the second transistor have horizontally aligned cell boundaries. A first set of one or more channels of the first transistor are horizontally offset from a second set of one or more channels of the second transistor within the horizontally aligned cell boundaries.

In another embodiment, a semiconductor structure includes a first stacked transistor cell including a first transistor and a second transistor vertically stacked over the first transistor, where a first set of one or more channels of the first transistor are horizontally offset from a second set of one or more channels of the second transistor within cell boundaries of the first stacked transistor cell. The semiconductor structure also includes a second stacked transistor cell including a third transistor and a fourth transistor vertically stacked over the third transistor, where a third set of one or more channels of the third transistor are horizontally offset from a fourth set of one or more channels of the fourth transistor within cell boundaries of the second stacked transistor cell. The second stacked transistor cell is laterally adjacent the first stacked transistor cell.

In another embodiment, a semiconductor structure includes a first transistor, a second transistor vertically stacked over the first transistor, a first dielectric spacer at a first lateral edge of the first and second transistors, and a second dielectric spacer at a second lateral edge of the first and second transistors. A first set of one or more channels of the first transistor are laterally closer to the first dielectric spacer than the second dielectric spacer. A second set of one or more channels of the second transistor are laterally closer to the second dielectric spacer than the first dielectric spacer.

In another embodiment, a stacked transistor structure includes a first stacked transistor cell including a first transistor and a second transistor stacked vertically over the first transistor, a second stacked transistor cell including a third transistor and a fourth transistor stacked vertically over the third transistor, and a dielectric wall separating the first stacked transistor cell and the second stacked transistor cell. A first set of one or more channels of the first transistor have a first lateral distance to the dielectric wall and a second set of one or more channels of the second transistor have a second lateral distance to the dielectric wall, the first lateral distance being different than the second lateral distance. A third set of one or more channels of the third transistor have a third lateral distance to the dielectric wall and a fourth set of one or more channels of the fourth transistor have a fourth lateral distance to the dielectric wall, the third lateral distance being different than the fourth lateral distance.

In another embodiment, an integrated circuit includes a semiconductor structure including a first transistor and a second transistor vertically stacked over the first transistor. The first transistor and the second transistor have horizontally aligned cell boundaries. A first set of one or more channels of the first transistor are horizontally offset from a second set of one or more channels of the second transistor within the horizontally aligned cell boundaries.

DETAILED DESCRIPTION

Figure 1B:
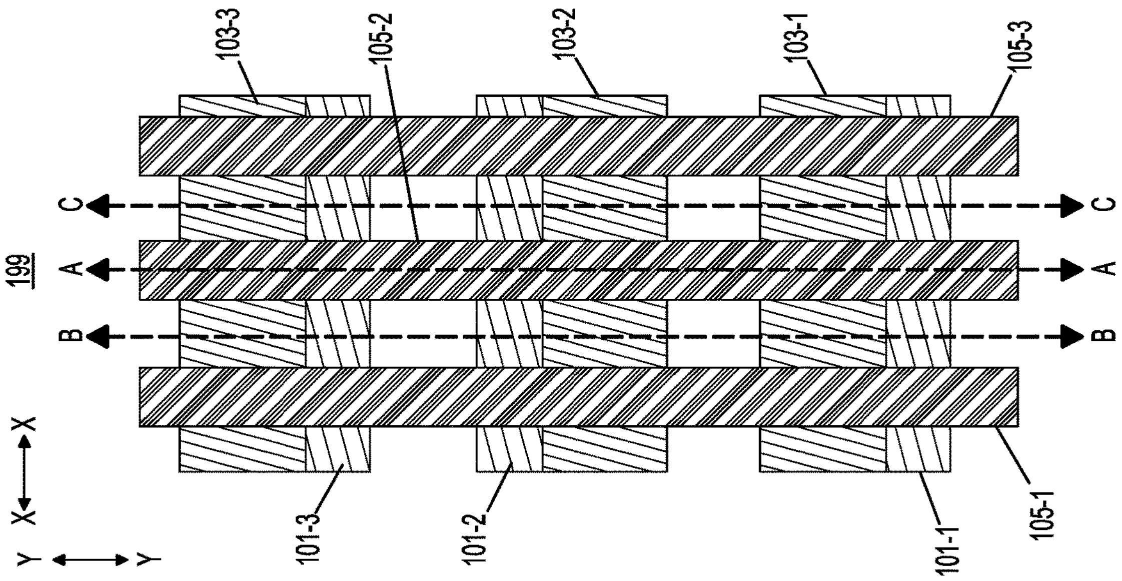
FIG. 1B depicts a layout view illustrating where the cross-sectional view of FIG. 1A is taken, according to an embodiment of the invention.

Illustrative embodiments of the invention may be described herein in the context of illustrative methods for forming stacked transistor structures with aligned cell or device boundaries and shifted channels, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

It is to be understood that the various features shown in the accompanying drawings are schematic illustrations that are not necessarily drawn to scale. Moreover, the same or similar reference numbers are used throughout the drawings to denote the same or similar features, elements, or structures, and thus, a detailed explanation of the same or similar features, elements, or structures will not be repeated for each of the drawings. Further, the terms "exemplary" and "illustrative" as used herein mean "serving as an example, instance, or illustration." Any embodiment or design described herein as "exemplary" or "illustrative" is not to be construed as preferred or advantageous over other embodiments or designs.

According to an aspect of the invention, there is provided a semiconductor structure including a first transistor and a second transistor vertically stacked over the first transistor. The first transistor and the second transistor have horizontally aligned cell boundaries. A first set of one or more channels of the first transistor are horizontally offset from a second set of one or more channels of the second transistor within the horizontally aligned cell boundaries. The shifted first and second sets of one or more channels of the semiconductor structure advantageously allows for integrating connections to the first and second transistors within the horizontally aligned cell boundaries.

In embodiments, the first set of one or more channels of the first transistor have a first distance to the horizontally aligned cell boundaries at a first lateral side of the semiconductor structure and a second distance to the horizontally aligned cell boundaries at a second lateral side of the semiconductor structure opposite the first lateral side of the semiconductor structure, the first distance being greater than the second distance. The second set of one or more channels of the second transistor have a third distance to the horizontally aligned cell boundaries at the first lateral side of the semiconductor structure and a fourth distance to the horizontally aligned cell boundaries at the second lateral side of the semiconductor structure opposite the first lateral side of the semiconductor structure, the third distance being less than the fourth distance. Such spacing of the first and second sets of one or more channels from the horizontally aligned cell boundaries advantageously allows for forming backside contacts to the second transistor within the horizontally aligned cell boundaries.

In embodiments, the semiconductor structure further includes a gate merge contact between a first gate region of the first transistor and a second gate region of the second transistor, where the gate merge contact is disposed within the horizontally aligned cell boundaries on a first side of the second set of channels and over a portion of the first set of channels. The gate merge contact advantageously allows for combined connections or contacts to the first and second gate regions which saves area.

In embodiments, the first transistor is proximate a backside of the semiconductor structure and the second transistor is proximate a frontside of the semiconductor structure, and the semiconductor structure further includes at least one contact extending from a backside power delivery network of the semiconductor structure to at least one semiconductor terminal of the second transistor, the at least one contact being underneath at least a portion of the at least one semiconductor terminal, the portion of the at least one semiconductor terminal being laterally adjacent to the second set of one or more channels. The at least one contact which extends from the backside of the semiconductor structure advantageously allows for reduced area footprint of the semiconductor structure. Further advantages are provided in that the at least one contact may be hidden or tucked under the second transistor within the horizontally aligned cell boundaries.

In embodiments, the first transistor is proximate a backside of the semiconductor structure and the second transistor is proximate a frontside of the semiconductor structure, and the semiconductor structure further includes a contact which connects to a semiconductor terminal of the first transistor at the backside of the semiconductor structure, the contact having a first portion with a first width proximate a bottom surface of the first semiconductor terminal of the first transistor and a second portion with a second width proximate a backside of the first portion, the first width being greater than the second width. The structure of the first contact having the different first and second widths for first and second portions thereof advantageously can reduce the risk of shorting with other electrical contacts.

In embodiments, the semiconductor structure further includes at least one contact to at least one of the first transistor and the second transistor which is within the horizontally aligned cell boundaries. The at least one contact being within the horizontally aligned cell boundaries advantageously provides area savings for the semiconductor structure.

In embodiments, the semiconductor structure further includes a first power rail which connects to a first semiconductor terminal of one of the first transistor and the second transistor and a second power rail which connects to a second semiconductor terminal of one of the first transistor and the second transistor, where the first power rail has a different width than the second power rail. The first and second power rails having different widths (also referred to having asymmetric first and second power rails) advantageously allows for optimizing the overlap of contacts to the first and second semiconductor terminals.

According to an aspect of the invention, there is provided a semiconductor structure including a first stacked transistor cell including a first transistor and a second transistor vertically stacked over the first transistor, where a first set of one or more channels of the first transistor are horizontally offset from a second set of one or more channels of the second transistor within cell boundaries of the first stacked transistor cell. The semiconductor structure also includes a second stacked transistor cell including a third transistor and a fourth transistor vertically stacked over the third transistor, where a third set of one or more channels of the third transistor are horizontally offset from a fourth set of one or more channels of the fourth transistor within cell boundaries of the second stacked transistor cell. The second stacked transistor cell is laterally adjacent the first stacked transistor cell. The shifted first and second sets of one or more channels of the first and second transistors of the first stacked transistor cell and the shifted third and fourth sets of one or more channels of the third and fourth transistors of the second stacked transistor cell advantageously allow for integrating connections to the first, second, third and fourth transistors both within the cell boundaries of the first and second stacked transistor cells as well as for one or more connections or contacts which span the laterally adjacent first and second stacked transistor cells.

In embodiments, the first set of one or more channels of the first transistor have a first lateral distance from the third set of one or more channels of the third transistor, the second set of one or more channels of the second transistor have a second lateral distance from the fourth set of one or more channels of the fourth transistor, and the first lateral distance is different than the second lateral distance. Such spacing of the first, second, third and fourth sets of one or more channels advantageously allows for forming backside contacts to the second and fourth transistors.

In embodiments, a first lateral distance between the first set of one or more channels of the first transistor and the third set of one or more channels of the third transistor than second set of one or more channels is less than a second lateral distance between the second set of one or more channels of the first transistor and the fourth set of one or more channels of the fourth transistor. The semiconductor structure further includes at least one of: a first semiconductor terminal of the first transistor which is merged with a second semiconductor terminal of the third transistor; and a merged contact to the first semiconductor terminal of the first transistor and the second semiconductor terminal of the third transistor. Such merged semiconductor terminals and/ or merged contacts advantageously enable improved connections for the first and third transistors.

In embodiments, a first lateral distance between the first set of one or more channels of the first transistor and the third set of one or more channels of the third transistor than second set of one or more channels is greater than a second lateral distance between the second set of one or more channels of the first transistor and the fourth set of one or more channels of the fourth transistor. The semiconductor structure further includes at least one of: a first semiconductor terminal of the second transistor which is merged with a second semiconductor terminal of the fourth transistor; and a merged contact to the first semiconductor terminal of the second transistor and the second semiconductor terminal of the fourth transistor. Such merged semiconductor terminals and/or merged contacts advantageously enable improved connections for the second and fourth transistors.

In embodiments, the semiconductor structure further includes at least one power rail that is merged across the cell boundaries of the first stacked transistor cell and the second stacked transistor cell. The merged power rail is advantageously wider than separate power rails, providing benefits in terms of electrical resistance and capacitance.

According to an aspect of the invention, there is provided a semiconductor structure including a first transistor, a second transistor vertically stacked over the first transistor, a first dielectric spacer at a first lateral edge of the first and second transistors, and a second dielectric spacer at a second lateral edge of the first and second transistors. A first set of one or more channels of the first transistor are laterally closer to the first dielectric spacer than the second dielectric spacer. A second set of one or more channels of the second transistor are laterally closer to the second dielectric spacer than the first dielectric spacer. The semiconductor structure advantageously allows for integrating connections to the first and second transistors between the first and second dielectric spacers, which define cell boundaries for the first and second transistors.

In embodiments, the first dielectric spacer includes a first portion surrounding the first set of one or more channels of the first transistor and a second portion above the first portion, where the first portion of the first dielectric spacer has a first width, where the second portion of the first dielectric spacer has a second width, and where the second width is greater than the first width. In embodiments, the first portion of the first dielectric spacer has a high-k dielectric liner and the second portion of the first dielectric spacer does not have the high-k dielectric liner. In embodiments, the second dielectric spacer includes a first portion surrounding the second set of one or more channels of the second transistor and a second portion below the first portion, where the first portion of the second dielectric spacer has a third width, where the second portion of the second dielectric spacer has a fourth width, and where the third width is less than the fourth width. These structures of the first and second dielectric spacers enable forksheet-like sequential integration processing for stacked transistors with aligned cell boundaries and shifted channels.

According to an aspect of the invention, there is provided a stacked transistor structure including a first stacked transistor cell including a first transistor and a second transistor stacked vertically over the first transistor, a second stacked transistor cell including a third transistor and a fourth transistor stacked vertically over the third transistor, and a dielectric wall separating the first stacked transistor cell and the second stacked transistor cell. A first set of one or more channels of the first transistor have a first lateral distance to the dielectric wall and a second set of one or more channels of the second transistor have a second lateral distance to the dielectric wall, the first lateral distance being different than the second lateral distance. A third set of one or more channels of the third transistor have a third lateral distance to the dielectric wall and a fourth set of one or more channels of the fourth transistor have a fourth lateral distance to the dielectric wall, the third lateral distance being different than the fourth lateral distance. The stacked transistor structure advantageously allows for integrating connections to the first, second, third and fourth transistors within the cell boundaries of the first and second stacked transistor cells, where the cell boundary of the adjacent first and second stacked transistor cells is defined by the dielectric wall.

In embodiments, the first lateral distance is smaller than the second lateral distance and the third lateral distance is smaller than the fourth lateral distance. Such spacing advantageously enables formation of backside contacts to the second and fourth transistors.

In embodiments, at least one of: the first lateral distance is different than the third lateral distance; and the second lateral distance is different than the fourth lateral distance. Such spacing allows for different spacing between the first, second, third and fourth transistors and the dielectric wall, advantageously allowing for processing flexibility.

In embodiments, the first transistor and the third transistor are one of n-type transistors and p-type transistors, and the second transistor and the fourth transistor are the other one of n-type transistors and p-type transistors. Such configurations allow for the first and second stacked transistor cells to provide complementary field-effect transistors (CFET) cells.

According to an aspect of the invention, there is provided an integrated circuit including a semiconductor structure including a first transistor and a second transistor vertically stacked over the first transistor. The first transistor and the second transistor have horizontally aligned cell boundaries. A first set of one or more channels of the first transistor are horizontally offset from a second set of one or more channels of the second transistor within the horizontally aligned cell boundaries. The shifted first and second sets of one or more channels of the semiconductor structure advantageously allows for integrating connections to the first and second transistors within the horizontally aligned cell boundaries.

In embodiments, the first set of one or more channels of the first transistor have a first distance to the horizontally aligned cell boundaries at a first lateral side of the semiconductor structure and a second distance to the horizontally aligned cell boundaries at a second lateral side of the semiconductor structure opposite the first lateral side of the semiconductor structure, the first distance being greater than the second distance, and the second set of one or more channels of the second transistor have a third distance to the horizontally aligned cell boundaries at the first lateral side of the semiconductor structure and a fourth distance to the horizontally aligned cell boundaries at the second lateral side of the semiconductor structure opposite the first lateral side of the semiconductor structure, the third distance being less than the fourth distance. Such spacing of the first and second sets of one or more channels from the horizontally aligned cell boundaries advantageously allows for forming backside contacts to the second transistor within the horizontally aligned cell boundaries.

In embodiments, the semiconductor structure further includes a gate merge contact between a first gate region of the first transistor and a second gate region of the second transistor, wherein the gate merge contact is disposed within the horizontally aligned cell boundaries on a first side of the second set of channels and over a portion of the first set of channels. The gate merge contact advantageously allows for combined connections or contacts to the first and second gate regions which saves area.

In embodiments, the semiconductor structure further includes at least one contact to at least one of the first transistor and the second transistor which is within the horizontally aligned cell boundaries. The at least one contact being within the horizontally aligned cell boundaries advantageously provides area savings for the semiconductor structure.

As discussed above, stacked transistor structures provide an opportunity for continued scaling and area improvement. Stacked transistor structures may utilize sequential integration fabrication processes. Sequential integration includes forming "bottom" (also referred to as "lower") transistors of a stacked transistor structure, followed by wafer bonding and formation of "top" (also referred to as "upper") transistors of the stacked transistor structure. The bottom and top transistors of the stacked transistor structure may also be referred to as being different "tiers" or "levels" of the stacked transistor structure (e.g., where the bottom transistors are a first tier or level of the stacked transistor structure and the top transistors are a second tier or level of the stacked transistor structure). Sequential integration fabrication processes provide various advantages relative to monolithic fabrication processes. For example, sequential integration allows for: an increased effective width (Weff) with the same device footprint; increasing the number of channels (e.g., nanosheet channels); and further critical dimension (CD) scaling. Since the top and bottom tiers are integrated separately, sequential integration allows for unique transistor architectures (e.g., shifted, staggered, etc.), split gate schemes, multiple threshold voltage (multi-Vt) replacement metal gate (RMG) learning from nanosheets, channel engineering for the top and bottom tiers (e.g., mobility), and reduced process complexity.

Stacked transistor structures may use different transistor architectures, such as a "stepped" architecture (e.g., where nanosheet channels for the top transistors of a stacked transistor structure are narrower than nanosheet channels for the bottom transistors of the stacked transistor structure) and an "aligned" architecture (e.g., where nanosheet channels for the top and bottom transistors of a stacked transistor structure have the same size and are horizontally or laterally aligned with one another). Wafer bonding approaches used in sequential integration fabrication processes further allow for a "shifted" architecture (e.g., where the active regions or nanosheet channels for the top and bottom transistors of the stacked transistor structure are horizontally or laterally offset from one another) and a "staggered" architecture (e.g., where cell or device boundaries for the top and bottom transistors of the stacked transistor structure are offset from one another). Both the shifted and staggered architectures provide for lower aspect ratio (AR) for middle-of-line (MOL) contact formation, and also provide a Weff benefit with respect to the aligned active regions.

In some embodiments, a stacked transistor structure includes top transistors and bottom transistors with aligned cell boundaries (e.g., within lithography tolerance), where the top and bottom transistors in the stacked transistor structure have gate-all-around (GAA) channels (e.g., nanosheet channels) which are horizontally shifted relative to one another along the gate axis. The top and bottom transistors may have a first smaller distance to laterally adjacent transistors on a first lateral side and a second larger distance to laterally adjacent transistors on a second lateral side. For example, the top transistors may have the first smaller distance to first laterally adjacent transistors on the first lateral side and the second larger distance to laterally adjacent transistors on the second lateral side, while the bottom transistors have the second larger distance to the first laterally adjacent transistors on the first lateral side and the first smaller distance to laterally adjacent transistors on the second lateral side, or vice versa. The laterally adjacent transistors with the first smaller distance may be of the same polarity (e.g., n-type or p-type) while the laterally adjacent transistors with the second larger distance may be of different polarity. The aligned cell boundaries of the top and bottom transistors of the stacked transistor structure may be defined by gate cut dielectric layers.

In some embodiments, a first dielectric wall separates the gates of laterally adjacent transistors which are the first smaller distance away, with the first dielectric wall being at least partially covered by a high-k dielectric material. A second dielectric wall may separate the gates of laterally adjacent transistors which are the second larger distance away, and the second dielectric wall may not be covered by a high-k dielectric material. Dielectric walls between adjacent transistors having the first smaller distance from one another may have a bottom portion which is covered with a high-k dielectric material and a top portion which is not covered with the high-k dielectric material. The top portion may be wider than the bottom portion. A first distance between the channels and a dielectric wall of transistors of a same polarity may be different than a second distance between the channels and a dielectric wall of transistors with a different polarity. In some embodiments, distances between the channels and dielectric walls of the bottom transistors are different than the distances between the channels and dielectric walls of the top transistors.

In some embodiments, in a bottom region of the stacked transistor structure where the bottom transistors are formed, a backbone dielectric wall is covered by a silicon oxide material (e.g., with a thickness of 2 nm or greater), while in a top region of the stacked transistor structure where the top transistors are formed the backbone dielectric wall is not covered by the silicon oxide material or is covered with a silicon oxide material having a thickness less than 2 nm.

A process flow for forming a stacked transistor structure with aligned cell boundaries and shifted channels includes forming a nanosheet stack (e.g., of alternating Si/SiGe layers, or more generally nanosheet channel layers and sacrificial layers), and patterning the nanosheet stack so as to have the first smaller distance and the second larger distance between laterally adjacent active regions. Shallow trench isolation (STI) regions are then formed, followed by conformal deposition of an oxide layer (e.g., with a thickness that is about the same as a combined thickness of a gate dielectric layer and a gate work function metal (WFM) layer which will be used in a gate stack), followed by deposition of a nitride layer such that it pinches off the first smaller distance forming a dielectric "backbone" or wall.

The stacked transistor structures with aligned cell boundaries and shifted channels advantageously solve critical issues of integrating connections for stacked transistor structures, and advantageously enables both merged gates and split gates with significant area gains.

In some embodiments, a stacked transistor structure includes top and bottom transistors with channels that are horizontally or laterally shifted relative to one another within aligned cell boundaries for the top and bottom transistors. The stacked transistor structure may include a gate merge contact structure where gate regions for the top and bottom transistors within a stacked transistor cell are merged. This may be achieved through forming the gate contact structure in large gate extension regions, where the large gate extension regions for the top and bottom transistors are on opposed sides.

In some embodiments, a semiconductor terminal of the top transistor (e.g., a top source) is contacted from the bottom by a via which extends to a backside of the structure. Adjacent stacked transistor cells may have adjacent vias connecting to the top transistors of the stacked transistor cells. The adjacent vias may, in some embodiments, by merged to form a single large via rather than individualized vias. Further, in some embodiments, there may be only a single via for adjacent stacked transistor cells, such that only the "right" or "left" top transistor is connected through the single via to the backside of the structure. Still further, in some embodiments, only one via connects to the bottom of a semiconductor terminal of the top transistor (e.g., a top source), where the semiconductor terminal is merged with a semiconductor terminal for an adjacent top transistor.

In some embodiments, both top and bottom transistors of the stacked transistor structure are contacted from the bottom or backside of the structure. For example, sources of the top and bottom transistors of the stacked transistor structure may be contacted from the bottom or backside of the structure.

In some embodiments, power rail contacts are formed "inbound" within cell boundaries for the stacked transistor cells. In other embodiments, power rail contacts are formed "outbound" at least partially outside cell boundaries for the stacked transistor cells. Such power rail contacts may be symmetric or asymmetric.

In some embodiments, contacts to bottom transistors of the stacked transistor structure have kinks to avoid shorting to power rails from the top transistors. Such kinks may be formed by having backside contacts with two portions, a first wider portion adjacent to bottom or backside surfaces of sources of the bottom transistors of the stacked transistor structure, and a second narrower portion adjacent power rails of a backside power delivery network (BSPDN), where the second narrower portion is surrounded by a backside interlayer dielectric (ILD) layer.

In some embodiments, power rails for top and bottom transistors of the stacked transistor structure are merged across cell boundaries. Further, in some embodiments, different ones of the power rails may have different cross-section dimensions or widths. Backside contacts in the stacked transistor structure may be used for power delivery (e.g., VDD and VSS).

In some embodiments, source/drain regions of adjacent transistors (either bottom or top transistors of the stacked transistor structure) with a short separation distance can be merged with one another.

In some embodiments, two separate vias or contacts extending from the top transistors of the stacked transistor structure touch the same power rail. Similarly, in some embodiments two separate contacts from the bottom transistors of the stacked transistor structure may touch the same power rail.

FIGS. 1-17C show process flows for forming stacked transistor structures with aligned cell boundaries and shifted channels.

Figure 1A:
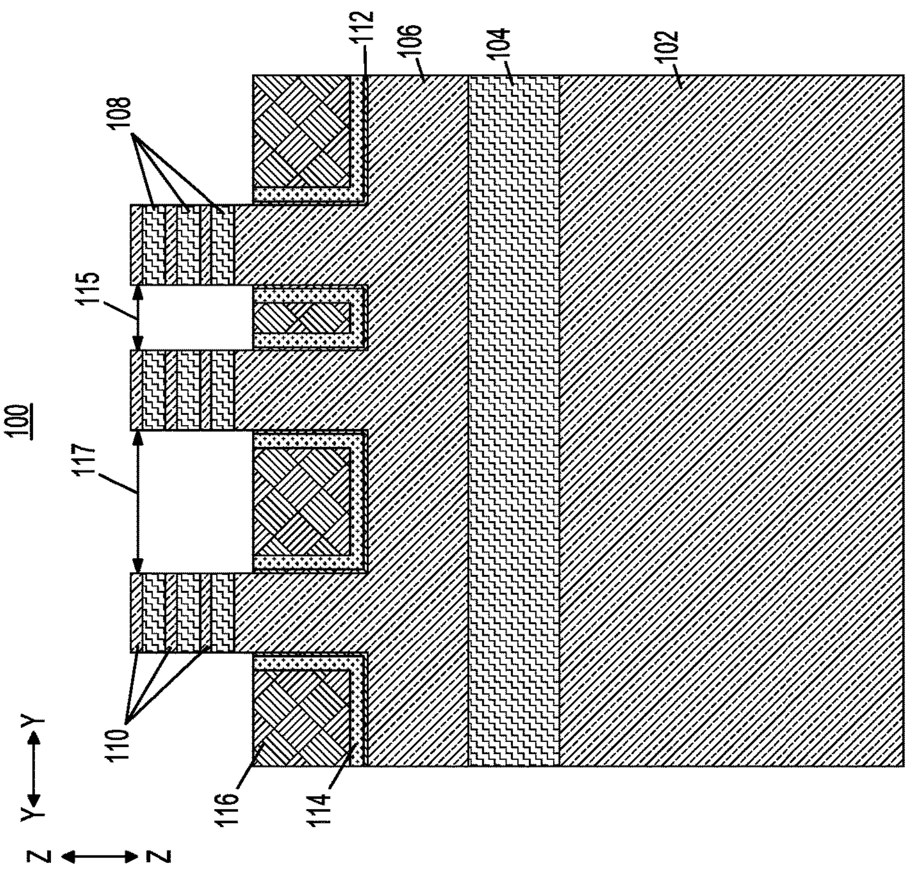
FIG. 1A depicts a cross-sectional view of a semiconductor structure including a nanosheet stack formed over a substrate following formation of shallow trench isolation regions, according to an embodiment of the invention.

FIG. 1A shows a cross-sectional view 100 of a semiconductor structure, including a first substrate 102, an etch stop layer 104, a second substrate 106, a nanosheet stack including alternating sacrificial layers 108 and nanosheet channel layers 110, an oxide layer 112, a nitride layer 114 and shallow trench isolation (STI) regions 116. FIG. 1B shows a layout view 199, illustrating where the cross-sectional view 100 of FIG. 1A is taken. FIG. 1B shows active (e.g., channel) regions 101-1, 101-2 and 101-3 for bottom transistors of a stacked transistor structure, active (e.g., channel) regions 103-1, 103-2 and 103-3 for top transistors of the stacked transistor structure, and gate regions 105-1, 105-2 and 105-3. The cross-sectional view 100 of FIG. 1A is taken along the gate axis, which may be where the gate regions or source/drain regions for the top and bottom transistors of the stacked transistor structure will be formed (e.g., along any of the lines A-A, B-B and C-C shown in the layout view 199 of FIG. 1B).

The first substrate 102 and the second substrate 106 may be formed of any suitable semiconductor structure, including various silicon-containing materials including but not limited to silicon (Si), silicon germanium (SiGe), silicon germanium carbide (SiGeC), silicon carbide (SiC) and multi-layers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), etc. The first substrate 102 and the second substrate 106 may have respective heights (in direction Z) and widths (in directions X/Y) which vary as needed based on the type of structures to be formed.

The etch stop layer 104 may comprise a buried oxide (BOX) layer formed of silicon dioxide ($SiO_2$) or a layer formed by silicon germanium (SiGe), or another suitable material such as a III-V semiconductor epitaxial layer. The etch stop layer 104 may have a height (in direction Z) in the range of 10 to 50 nm.

The sacrificial layers 108 may be formed of SiGe. Each of the sacrificial layers 108 may have a thickness (in direction Z) in the range of 5-15 nm.

In some embodiments, both the etch stop layer 104 and the sacrificial layers 108 are formed of SiGe, with a germanium (Ge) concentration in the range of 20-40%. It should be noted, however, that this is not a requirement, and that the etch stop layer 104 and the sacrificial layers 108 may be formed of different materials, or may both be formed of SiGe but with different percentages of Ge.

The nanosheet channel layers 110 will provide channels for bottom transistors (e.g., nanosheet transistors) of the stacked transistor structure. The nanosheet channel layers 110 may be formed of Si or another suitable material (e.g., a material similar to that used for the first substrate 102 and the second substrate 106). Each of the nanosheet channel layers 110 may have a thickness (in direction Z) in the range of 4-15 nm.

The oxide layer 112 may have a thickness in the range of 1-4 nm, and may be formed of any suitable oxide such as $SiO_2$.

The nitride layer 114 is deposited over the oxide layer 112. The nitride layer 114 may have a thickness in the range of 2-8 nm, and may be formed of any suitable nitride such as SiN.

The STI regions 116 are deposited over the nitride layer 114. The STI regions 116 may be formed of a dielectric material such as silicon dioxide ($SiO_2$), silicon oxycarbide (SiOC), silicon oxynitride (SiON), etc. The STI regions 116 may have a thickness (in direction Z) in the range of 15-100 nm.

To form the STI regions 116, a hard mask (HM) may be patterned over the structure, followed by etching (e.g., using reactive-ion etching (RIE) or other suitable etch processing)

portions of the structure exposed by the patterned HM to pattern active regions for the bottom transistors of the stacked transistor structure. The oxide layer 112 and nitride layer 114 may then be deposited, followed by deposition, planarization (e.g., using chemical mechanical planarization (CMP)) and recess of the material of the STI regions 116 below a bottommost one of the sacrificial layers 108. The HM may then be removed.

As illustrated in FIG. 1A, the patterning of the active regions for the bottom transistors results in different inter-device separation distances 115 and 117, with the inter-device separation distance 115 being smaller than the inter-device separation distance 117. For example, the inter-device separation distance 115 may be in the range of 18-40 nm, and the inter-device separation distance 117 may be in the range of 50-200 nm, or 60-100 nm. The inter-device separation distance 115 is an example of the "first smaller distance" discussed above, and the inter-device separation distance 117 is an example of the "second larger distance" discussed above.

Figure 2B:
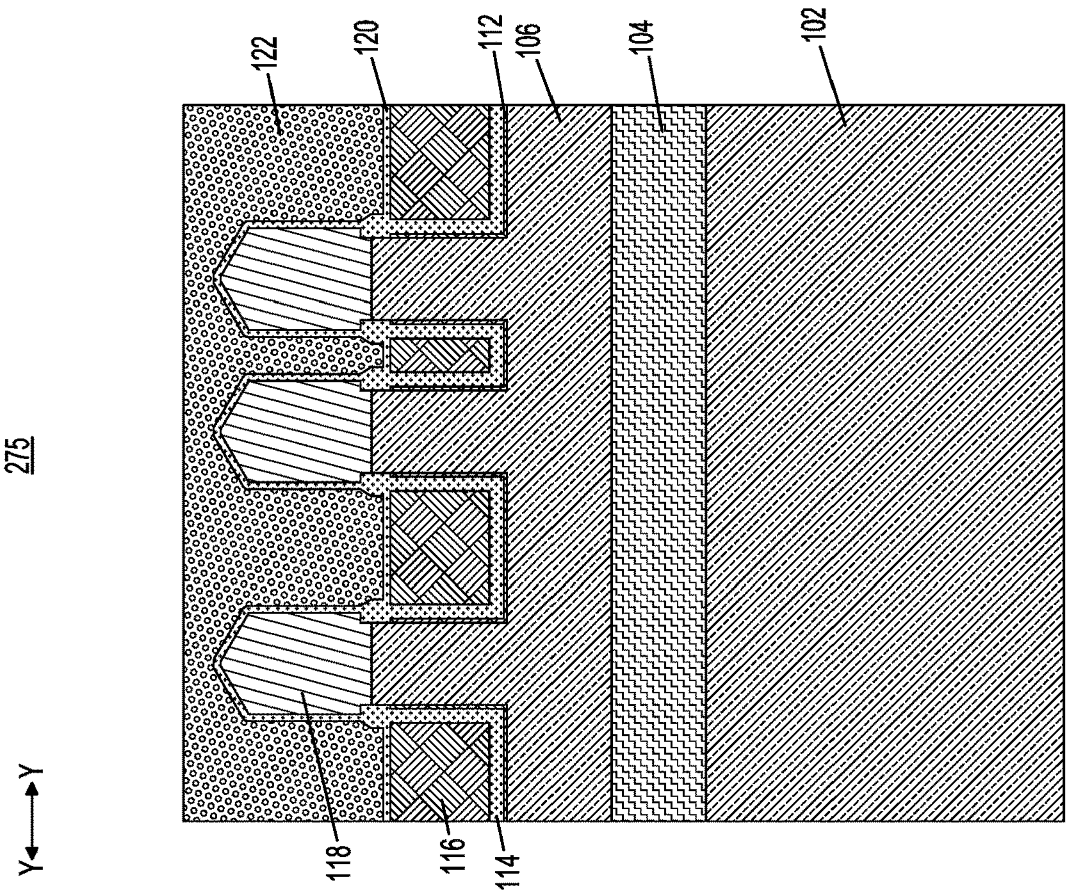
FIG. 2B depicts a second cross-sectional view of the structure of FIGS. 1A and 1B following the formation of the source/drain regions and the gate stack for the bottom transistors of the stacked transistor structure, according to an embodiment of the invention.
Figure 2A:
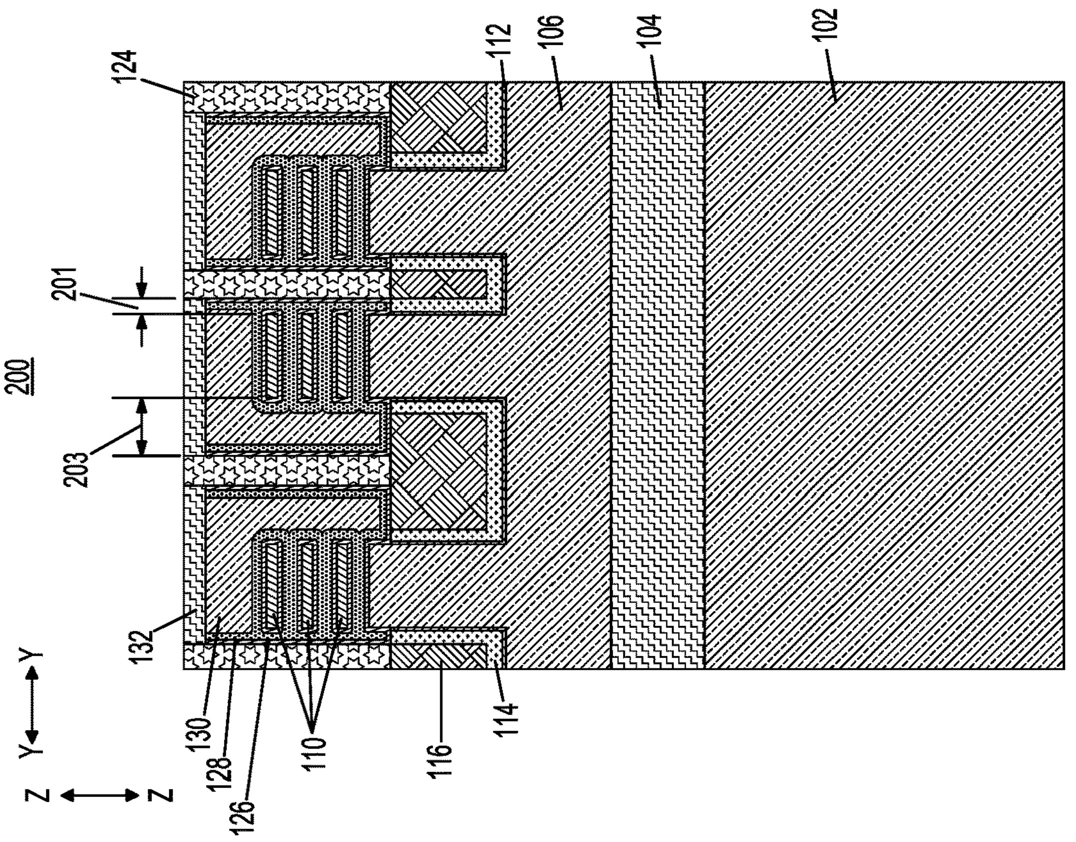
FIG. 2A depicts a first cross-sectional view of the structure of FIGS. 1A and 1B following formation of source/drain regions and a gate stack for bottom transistors of a stacked transistor structure, according to an embodiment of the invention.

FIGS. 2A and 2B show different views of the structure of FIGS. 1A and 1B following formation of source/drain regions 118 and a gate stack for the bottom transistors of the stacked transistor structure. FIG. 2A shows a first cross-sectional view 200 taken along the gate axis where gate regions for the bottom transistors of the stacked transistor structure are formed (e.g., along the line A-A in the layout view 199 of FIG. 1B). FIG. 2B shows a second cross-sectional view 275 taken along the gate axis where the source/drain regions 118 for the bottom transistors of the stacked transistor structure are formed (e.g., along the line B-B or the line C-C in the layout view 199 of FIG. 1B).

Prior to formation of the source/drain regions 118, dummy gate structures (not shown) may be formed. The dummy gate structures may include dummy gates and a gate HM. The dummy gates may be formed of amorphous silicon (a-Si) or another suitable material such as amorphous silicon germanium (a-SiGe), etc. The gate HM (e.g., which may be formed of a multi-layer structure, such as an oxide-nitride-oxide multi-layer structure) may be patterned over the dummy gates. Although not shown, an outer spacer may deposited over the structure (e.g., formed of silicon boron carbide nitride (SiBCN) or another suitable material such as SiN, SiCO, etc.), with the outer spacer then being etched-back followed by an indent etch of the sacrificial layers 108 of the nanosheet stack and formation of inner spacers (not shown) in the indent regions formed by the indent etch of the sacrificial layers 108 of the nanosheet stack. The inner spacers may be formed of SiN, SiBCN, SiCO, combinations thereof, etc. The inner spacers may include an oxide liner with a thickness in the range of 1-2 nm before the nitride-base material deposition.

Following formation of the inner spacers, the source/drain regions 118 may be formed using an epitaxial growth process. The source/drain regions 118 may be suitably doped, such as using ion implantation, gas phase doping, plasma doping, plasma immersion ion implantation, cluster doping, infusion doping, liquid phase doping, solid phase doping, etc. N-type dopants may be selected from a group of phosphorus (P), arsenic (As) and antimony (Sb), and p-type dopants may be selected from a group of boron (B), gallium (Ga), indium (In), and thallium (Tl). In some embodiments, the epitaxy process used to form the source/drain regions 132 comprises in-situ doping (dopants are incorporated in epitaxy material during epitaxy). Epitaxial materials may be grown from gaseous or liquid precursors. Epitaxial materials may be grown using vapor-phase epitaxy (VPE), molecular-beam epitaxy (MBE), liquid-phase epitaxy (LPE), rapid thermal chemical vapor deposition (RTCVD), metal organic chemical vapor deposition (MOCVD), ultra-high vacuum chemical vapor deposition (UHVCVD), low-pressure chemical vapor deposition (LPCVD), limited reaction processing CVD (LRPCVD), or other suitable processes. Epitaxial silicon, silicon germanium (SiGe), germanium (Ge), and/or carbon doped silicon (Si:C) silicon can be doped during deposition (in-situ doped) by adding dopants, such as n-type dopants (e.g., phosphorus or arsenic) or p-type dopants (e.g., boron or gallium), depending on the type of transistor to be formed. The dopant concentration in the source/drain can range from $1\times10^{19}$ $cm^{-3}$ to $3\times10^{21}$ $cm^{-3}$, or preferably between $2\times10^{20}$ $cm^{-3}$ to $3\times10^{21}$ $cm^{-3}$. The source/drain regions 118 may have widths (in direction Y) which are at least the widths of the nanosheet channel layers 110 and heights (in direction Z) which are at least the height of the nanosheet stack for the bottom transistors of the stacked transistor structure.

Following formation of the source/drain regions 118, optional source/drain cut processing may be performed. The source/drain cut is an optional process, which may be advantageous for very scaled cells in order to mitigate shorting to metal contacts of the top transistors of the stacked transistor structure which connect to the backside of the structure, as will be discussed in further detail below. The source/drain cut process can be asymmetric with respect to the channel position, in the sense that the source/drain cut process may cut the source and/or the drain closer to channels on one side than the other side. The source/drain cut may also be done only on one side of the source and/or the drain for a particular transistor or multiple transistors. The source/drain cut can also be used to separate merged source/drain regions if desired. In some embodiments, the source/drain cut width and position may be different for the source and the drain of the same transistor, in order to facilitate contact formation as described in further detail below. The source/drain cut processing may include a fill material and planarization over the source/drain regions 118 and patterning a mask layer over the structure, where the mask layer may comprise photoresist, an organic planarization layer (OPL) or a HM, a combination of an OPL and a HM, etc. Portions of the source/drain regions 118 exposed by the patterned mask layer are then etched to result in cut or patterned source/drain regions 118.

Following the optional source/drain cut processing, a liner layer 120 is deposited over the structure. The liner layer 120 may be formed of materials similar to that of the nitride layer 114. The liner layer 120 may have a thickness in the range of 2-4 nm. An oxide layer 122 is formed using flowable chemical vapor deposition (FCVD) or other suitable processing to overfill the structure, followed by planarization (e.g., using CMP). The oxide layer 122 may be formed of an oxide plasma material, such as HARP or HDP oxides, or another suitable material.

Gate cut processing may then be performed to form the gate cut dielectric layers 124. The gate cut processing may include patterning of a HM (not shown) over the structure, followed by etching portions of the structure exposed by the HM down to the STI regions 116 to form gate cut trenches. The gate cut trenches are then filled with a dielectric material to form the gate cut dielectric layers 124, followed by removal of the HM. In some embodiments, the HM is removed before fill of the gate cut trenches. The dielectric material used for the gate cut dielectric layers 124 may be an oxide (e.g., $SiO_2$) formed using chemical vapor deposition (CVD) processing, or another suitable material such as SiN or a multilayer of SiN and $SiO_2$. The gate cut dielectric layers 124 are examples of "dielectric walls" which define cell boundaries in stacked transistor structures as discussed elsewhere herein.

As illustrated in FIG. 2A, the gate cut processing forms gate cut trenches at different distances from the nanosheet channel layers 110 for different active regions. For example, some of the gate cut dielectric layers 124 have a smaller distance 201 (in direction Y) from the nearest nanosheet channel layers 110, while other ones of the gate cut dielectric layers 124 have a larger distance 203 (in direction Y) from the nearest nanosheet channel layers 110. Although not shown in FIG. 2A for clarity of illustration, the ones of the gate cut dielectric layers 124 having the smaller distance 201 from the nearest nanosheet channel layers 110 and the ones of the gate cut dielectric layers 124 having the larger distance 203 from the nearest nanosheet channel layers 110 may have different widths (in direction Y). For example, the ones of the gate cut dielectric layers 124 having the smaller distance 201 from the nearest nanosheet channel layers 110 may have a first width (e.g., in the range of 10-25 nm) which is substantially slimmer than a second width (e.g., in the range of 15-50 nm) of the ones of the gate cut dielectric layers 124 having the larger distance 203 from the nearest nanosheet channel layers 110. It should also be noted that, when laterally adjacent transistors (in direction Y) have gates in common, a gate cut is not performed between such laterally adjacent transistors. This is applicable for both the gate cuts having the smaller distance 201 and the larger distance 203 from the nearest nanosheet channel layers 110 illustrated in FIG. 2A.

The gate stack for the bottom transistors of the stacked transistor structure is then formed. The gate stack for the bottom transistors of the stacked transistor structure includes a gate dielectric layer 126, a gate work function metal (WFM) layer 128 and a gate metal layer 130. Optional gate self-aligned contact (SAC) capping layers 132 may be formed over the gate stack for the bottom transistors of the stacked transistor structure.

The gate stacks for the bottom transistors of the stacked transistor structure may be formed using replacement metal gate (RMG) processing. The dummy gate structures (e.g., the gate HM and the underlying dummy gates, not shown) are removed using CMP and any suitable etch processing. A channel release is then performed by etching or otherwise removing the sacrificial layers 108 of the nanosheet stack. The gate stacks are then formed. The gate stacks include an interlayer (IL) oxide layer (not shown), the gate dielectric layer 126, the gate WFM layer 128, and the gate metal layer 130. The gate stacks may then be recessed, followed by formation of the gate SAC capping layers 132. It should be noted that, in some embodiments, the gate SAC capping layers 1326 are not used. In other words, the gate SAC capping layers 132 are optional layers. The gate SAC capping layers 132 are advantageously used in some embodiments for enabling self-aligned contacts in ultra scaled cells.

The IL oxide (not labeled) may be formed of $SiO_2$ or another suitable material, and may have a thickness in the range of 1-5 nm. The gate dielectric layer 126 may be conformally deposited in the structure, and may be formed of a high-k material. Examples of high-k materials include but are not limited to metal oxides such as $HfO_2$, hafnium silicon oxide (Hf—Si—O), hafnium silicon oxynitride (HfSiON), lanthanum oxide ($La_2O_3$), lanthanum aluminum oxide ($LaAlO_3$), zirconium oxide ($ZrO_2$), zirconium silicon oxide, zirconium silicon oxynitride, tantalum oxide ($Ta_2O_5$), titanium oxide ($TiO_2$), barium strontium titanium oxide, barium titanium oxide, strontium titanium oxide, yttrium oxide ($Y_2O_3$), aluminum oxide ($Al_2O_3$), lead scandium tantalum oxide, and lead zinc niobate. The high-k material may further include dopants such as lanthanum (La), aluminum (Al), and magnesium (Mg). The gate dielectric layer 126 may have a uniform thickness in the range of 1 nm to 3 nm.

The gate conductor includes the gate WFM layer 128 and the gate metal layer 130. The gate WFM layer 128 may be formed of a WFM such as titanium (Ti), titanium nitride (TiN), tantalum (Ta), tantalum nitride (TaN), aluminum (Al), titanium aluminum (TiAl), titanium aluminum carbon (TiAlC), a combination of Ti and Al alloys, a stack which includes a barrier layer (e.g., of TiN, TaN, etc.) followed by one or more of the aforementioned WFM materials, etc. The gate WFM layer 128 may have a uniform thickness in the range of 5-10 nm. The gate metal layer 130 may comprise a conductive metal (e.g., tungsten (W)).

The gate SAC capping layers 132 may be formed of SiN, silicon carbide (SiC) or another suitable material. The gate SAC capping layers 132 may have a height (in direction Z) in the range of 10-20 nm.

Figure 3B:
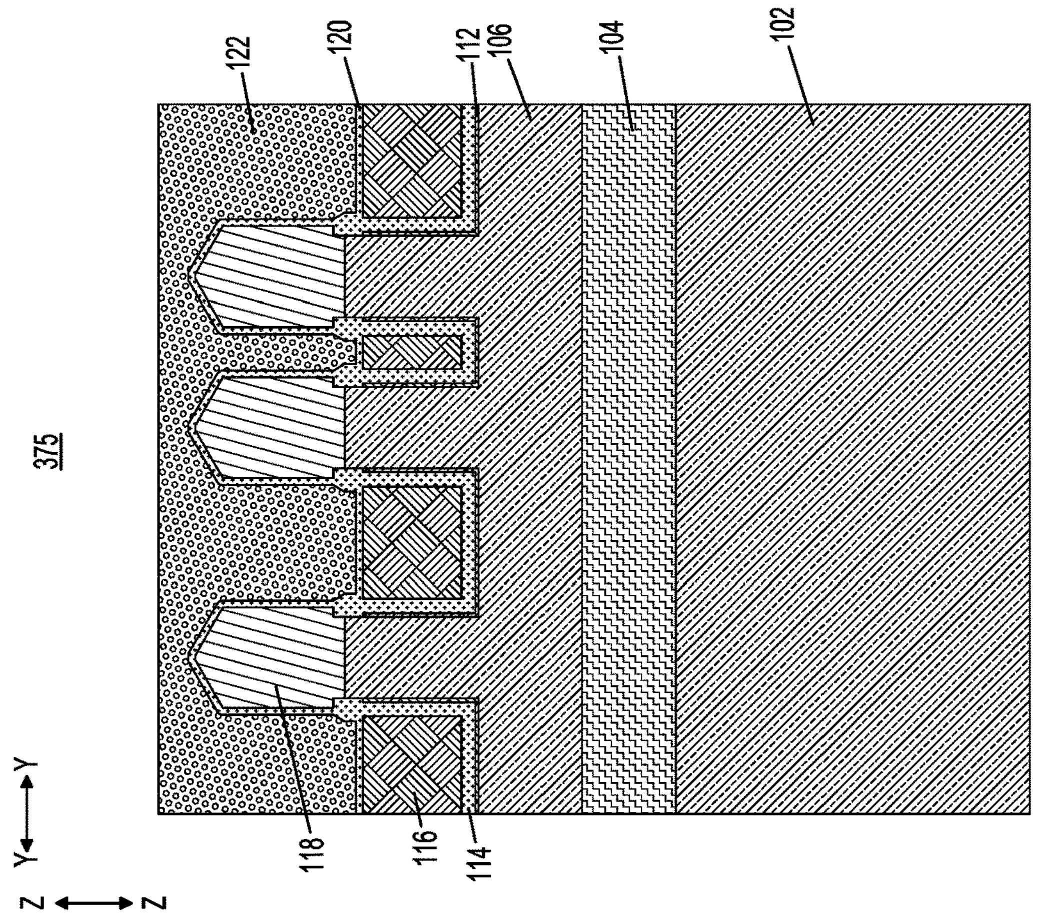
FIG. 3B depicts a second cross-sectional view of the structure of FIGS. 2A and 2B following the formation of the placeholder layers for backside contacts to the top transistors of the stacked transistor structure, according to an embodiment of the invention.
Figure 3A:
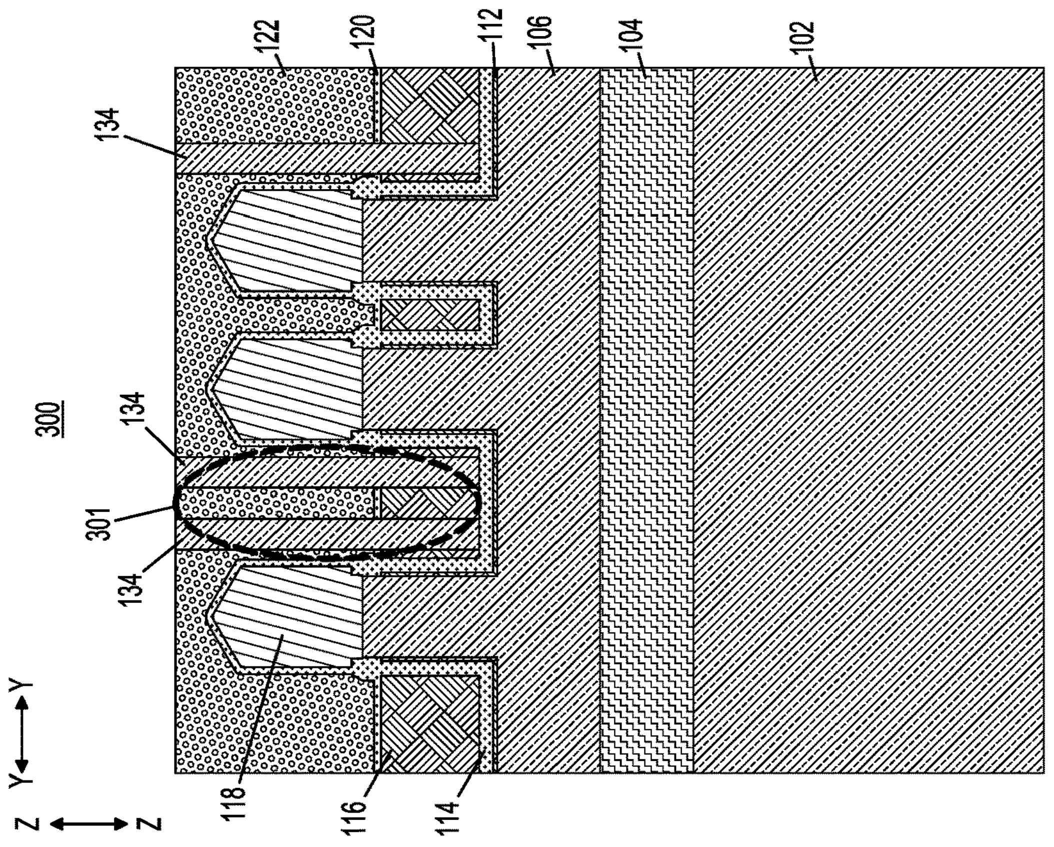
FIG. 3A depicts a first cross-sectional view of the structure of FIGS. 2A and 2B following formation of placeholder layers for backside contacts to top transistors of the stacked transistor structure, according to an embodiment of the invention.

FIGS. 3A and 3B show different views of the structure of FIGS. 2A and 2B following formation of placeholder layers 134 for backside contacts to the top transistors of the stacked transistor structure. FIG. 3A shows a first cross-sectional view 300 taken along the gate axis where source ones of the source/drain regions 118 for the bottom transistors of the stacked transistor structure are formed (e.g., along the line B-B in the layout view 199 of FIG. 1B). FIG. 3B shows a second cross-sectional view 375 taken along the gate axis where drain ones of the source/drain regions 118 for the bottom transistors of the stacked transistor structure are formed (e.g., along the line C-C in the layout view 199 of FIG. 1B).

The placeholder layers 134 may be formed by patterning a HM (which may comprise a multi-layer structure, such as an oxide-nitride or oxide-nitride-oxide multi-layer structure, not shown) over the structure, followed by etching through exposed portions of the structure down to the nitride layer 114 to form placeholder vias. Material for the placeholder layers 134 is then deposited in the placeholder vias and planarized (e.g., using CMP). The HM used in patterning of the placeholder vias may be removed using WET or dry etch processing, using CMP or other planarization techniques, combinations thereof, etc. The placeholder layers 134 advantageously allow for contacting terminals of the top transistors of the stacked transistor structure from the backside without using additional cell space, as the placeholder layers 134 are "hidden" or tucked under the top transistors.

In some embodiments, some of the placeholder layers 134 illustrated in FIG. 3A are merged to form lager vias. For example, in the region 301 shown in FIG. 3A, two of the placeholder layers 134 may be merged to form a larger via which contacts a semiconductor terminal of a single one of the top transistors, or which contacts semiconductor terminals of two adjacent ones of the top transistors. In other embodiments, only a single one of the placeholder layers 134 in the region 301 is utilized rather than forming a single large merged via.

The placeholder layers 134 may be filled in the placeholder vias using various deposition methods, including but not limited to CVD, plasma enhanced CVD (PECVD), atomic layer deposition (ALD), epitaxy processing, metal-organic CVD (MOCVD), etc. After deposition of the material for the placeholder layers 134, a thermal treatment may be applied. CMP may be used to planarize the surface of the placeholder layers 134 and remove excess deposited material. The placeholder layers 134 may comprise Si, SiGe, a doped semiconductor such as boron-doped silicon (Si:B) or boron-doped silicon germanium (SiGe:B). In some embodiments, the placeholder layers 134 are formed of a dielectric material with a different composition than surrounding dielectrics, such that the placeholder layers 134 may later be selectively etched from the backside.

Figure 4A:
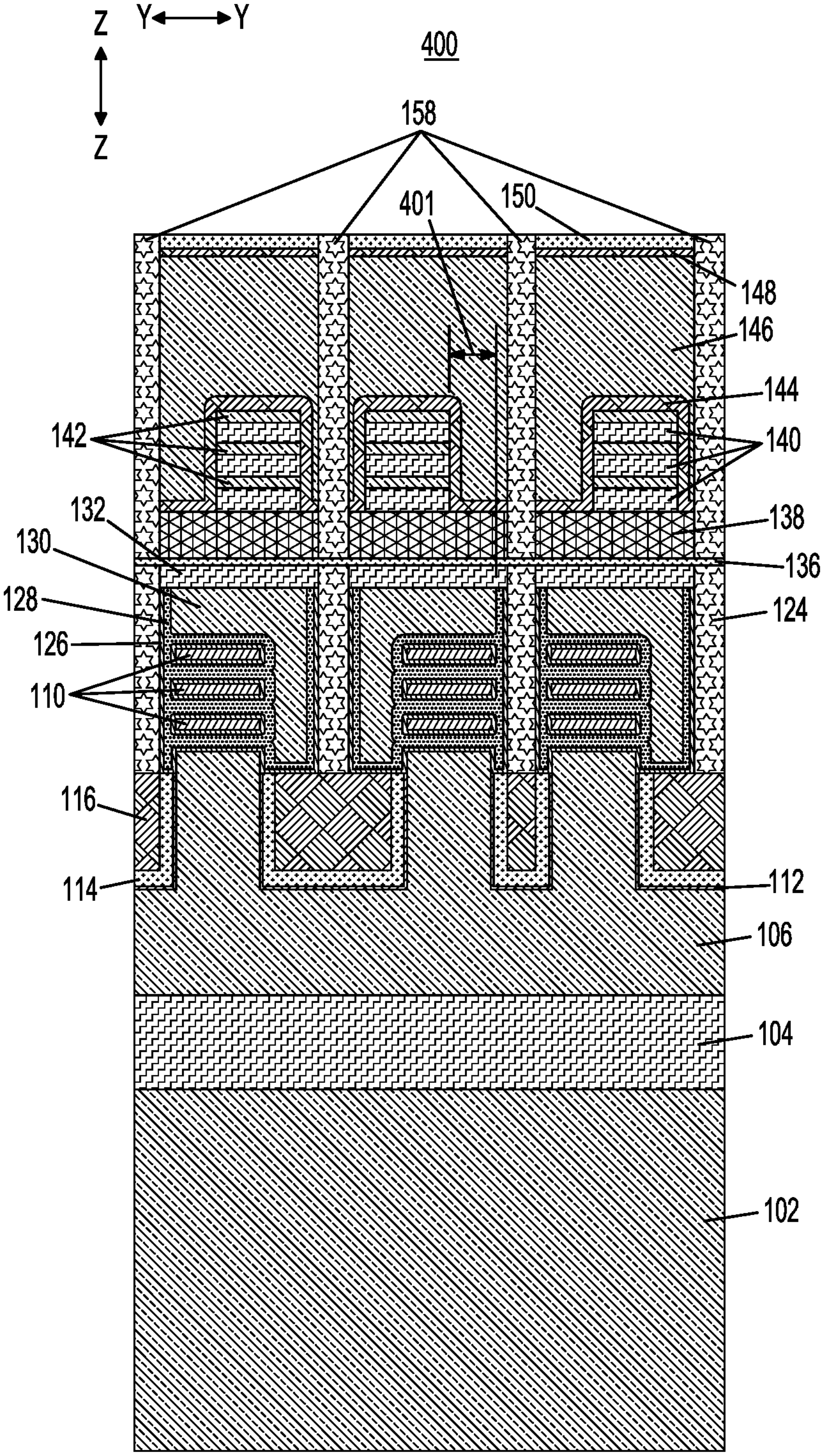
FIG. 4A depicts a first cross-sectional view of the structure of FIGS. 3A-3C following formation of a nanosheet stack, source/drain regions, dummy gate structures and gate cut dielectric layers for top transistors of the stacked transistor structure, according to an embodiment of the invention.
Figure 4B:
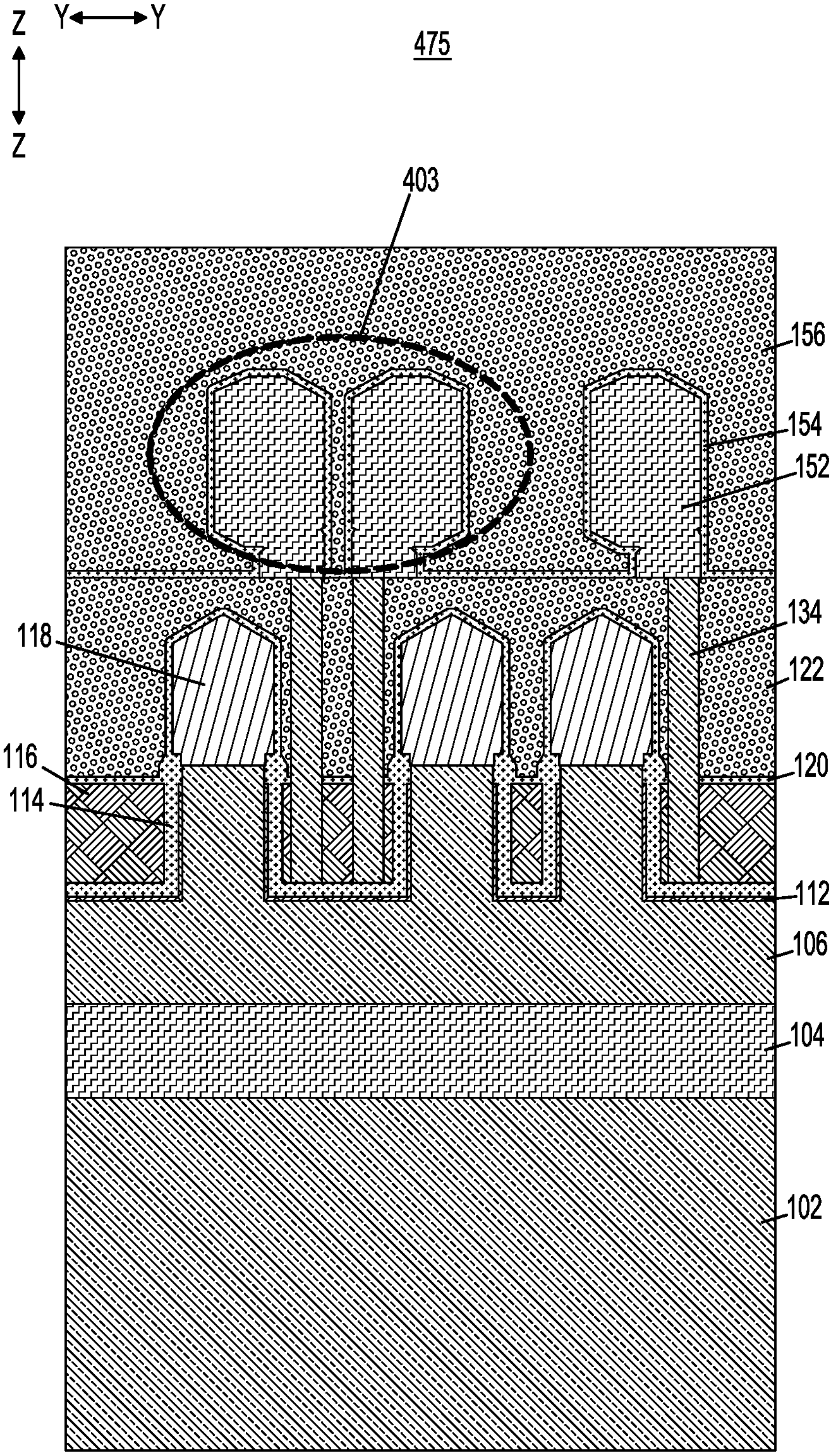
FIG. 4B depicts a second cross-sectional view of the structure of FIGS. 3A-3C following the formation of the nanosheet stack, the source/drain regions, the dummy gate structures and the gate cut dielectric layers for the top transistors of the stacked transistor structure, according to an embodiment of the invention.
Figure 4C:
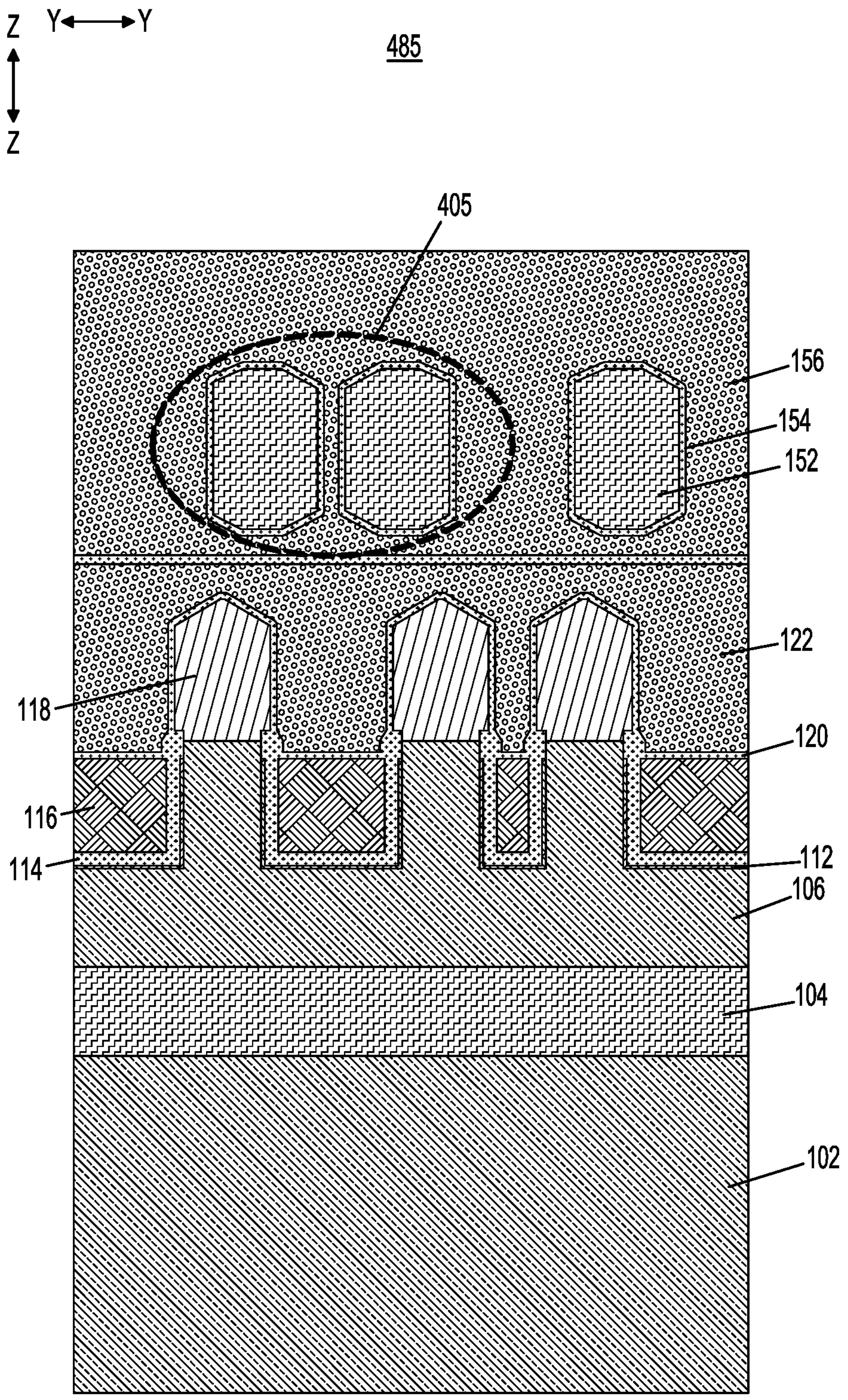
FIG. 4C depicts a third cross-sectional view of the structure of FIGS. 3A-3C following the formation of the nanosheet stack, the source/drain regions, the dummy gate structures and the gate cut dielectric layers for the top transistors of the stacked transistor structure, according to an embodiment of the invention.

FIGS. 4A-4C show different views of the structure of FIGS. 3A and 3B following formation of a nanosheet stack including sacrificial layers 140 and nanosheet channel layers 142, source/drain regions 152, dummy gate structures, and gate cut dielectric layers 158 for the top transistors of the stacked transistor structure. FIG. 4A shows a first cross-sectional view 400 taken along the gate axis where gate regions for the bottom transistors of the stacked transistor structure are formed (e.g., along the line A-A in the layout view 199 of FIG. 1B). FIG. 4B shows a second cross-sectional view 475 taken along the gate axis where source ones of the source/drain regions 118 and 152 for the bottom and top transistors of the stacked transistor structure are formed (e.g., along the line B-B in the layout view 199 of FIG. 1B). FIG. 4C shows a third cross-sectional view 485 taken along the gate axis where drain ones of the source/drain regions 118 and 152 for the bottom and top transistors of the stacked transistor structure are formed (e.g., along the line C-C in the layout view 199 of FIG. 1B).

A liner layer 136 is deposited over the structure, followed by formation of a bonding dielectric layer 138. The liner layer 136 may be formed of SiN or another suitable material such as SiBCN, SiC, SiCO, SiON or other combinations of Si, oxygen (O), carbon (C) and nitrogen (N). The bonding dielectric layer 138 may be formed of one or more dielectric layers, such as SiN and $SiO_2$, SiC, SiBCN, SiON, or other combinations of Si, oxygen (O), carbon (C) and nitrogen (N). In some embodiments, the liner layer 136 includes a 1-10 nm thick layer of SiN, SiCN or SiBCN, and the bonding dielectric layer 138 includes a 5-50 nm thick layer of $SiO_2$.

The nanosheet stack for the top transistors of the stacked transistor structure includes the alternating sacrificial layers 140 and nanosheet channel layers 142, which may be formed of similar materials and with similar sizing as the sacrificial layers 108 and the nanosheet channel layers 110, respectively. The nanosheet stack for the top transistors of the stacked transistor structure may be grown on a donor substrate (not shown), followed by bonding of the donor substrate to the existing structure and removing the donor substrate from the back side. In some embodiments, the donor substrate comprises 001-Si or 110-Si. The backside removal of the donor substrate may include: (1) backside grinding from typically 775 micrometers (μm) to about 5-30 μm; (2) polishing such as using CMP to remove grinding defects such as scratches to obtain a mirror-like surface; and (3) removal of the remaining Si using a wet etch chemistry such as an ammonia-based chemistry, TEAH or TMAH. Such wet etch chemistries are advantageously selective to the sacrificial layers 154 (e.g., formed of SiGe). One or more etch stopping layers (not shown) may be used to obtain a flat surface, with the last etch stopping layer then being removed to expose the topmost one of the nanosheet channel layers 142.

In some embodiments, a process that can be used to detach the surface layer from the donor substrate is Smart-cut, which is based on a controlled cleavage layer made by implantation of hydrogen (H), which may be combined with helium (He) implantation, and thermal treatment. The ion implantation may be done before bonding of the donor substrate to the bonding dielectric layer 138, and the thermal treatment may be done after such bonding to cleave and separate the nanosheet stack for the top transistors of the stacked transistor structure from the donor substrate. This may be followed by CMP and wet etch removal of any remaining portion of the donor substrate and the etch stopping layer.

Once the nanosheet stack for the top transistors of the stacked transistor structure is attached to the bonding dielectric layer 138, it may be patterned using processing similar to that described above with respect to patterning of the nanosheet stack for the bottom transistors of the stacked transistor structure. As illustrated in FIG. 4A, the nanosheet stack for the top transistors of the stacked transistor structure is patterned such that the nanosheet channel layers 142 are laterally offset by a distance 401 from the nanosheet channel layers 110. The nanosheet channel layers 142 and the nanosheet channel layers 110 are still within aligned cell boundaries defined by the gate cut dielectric layers 124 and 158. It should be noted that, as used herein, a layer or component being "within" aligned cell boundaries refers to a layer or component which is between the lateral cell boundaries (e.g., between two of the gate cut dielectric layers 124/158, not necessarily contained within the boundaries of a single one of the gate cut dielectric layers 124/158). As further illustrated in FIG. 4B, the placeholder layers 134 are situated in the region between the terminals of the bottom transistors of the stacked transistor structure in the large separation region (e.g., inter-device separation distance 103) allowing for backside contacts to terminals of the top transistors of the stacked transistor structure as will be described in further detail below.

The dummy gate structures include an oxide layer 144, a dummy gate layer 146, and a gate HM including oxide layer 148 and nitride layer 150. Such layers may be formed using similar processing, and with similar materials, as the dummy gate structures for the bottom transistors (not shown, discussed above). However, following etch-through of the nanosheet stack for the top transistors of the stacked transistor structure, the bonding dielectric layer 138 and the liner layer 136 are etched through, exposing the top of the placeholder layers 134, before the source/drain epitaxy processing for the source/drain regions 152 for the top transistors of the stacked transistor structure (which may use processing similar to that described above with respect to the source/drain regions 118 for the bottom transistors of the stacked transistor structure). Thus, the placeholder layers 134 provide a template for the epitaxy of the terminal to grow directly from the placeholder layers 134 in addition to growing from the exposed edges of the nanosheet channel layers 142. Further, as shown in the regions 403 and 405 of FIGS. 4B and 4C, some of the source/drain regions 152 may be electrically merged or separated after the source/drain epitaxy processing. In some embodiments, the source/drain regions 152 may merge in region 403 depending on the proximity of the underlying placeholder layers 134 and the epitaxy amount. Further, the source/drain regions 152 in region 403 have lower portions that extend toward the underlying placeholder layers 134. A liner layer 154, an oxide layer 156, and the gate cut dielectric layers 158 may then be formed using similar processing, and with similar sizing and materials, as the liner layer 120, the oxide layer 122 and the gate cut dielectric layers 124, respectively. As shown in FIG. 4A, the gate cut dielectric layers 158 and the gate cut dielectric layers 124 are horizontally aligned with one another (e.g., in direction Y), defining cell boundaries for stacked transistor cells.

Figure 5A:
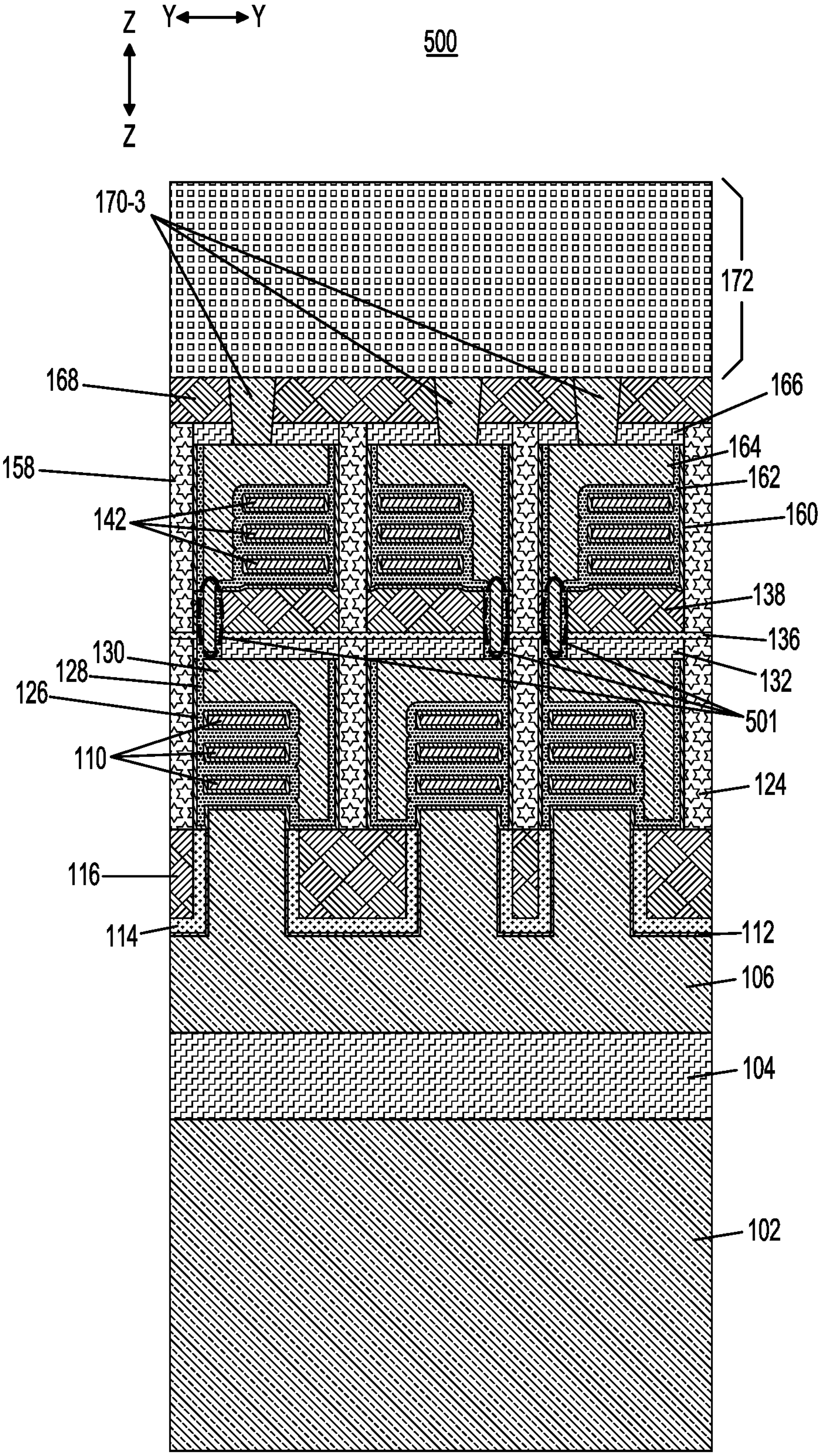
FIG. 5A depicts a first cross-sectional view of the structure of FIGS. 4A-4C following formation of a gate stack for the top transistors of the stacked transistor structure, middle-of-line contacts and back-end-of-line interconnects, according to an embodiment of the invention.
Figure 5B:
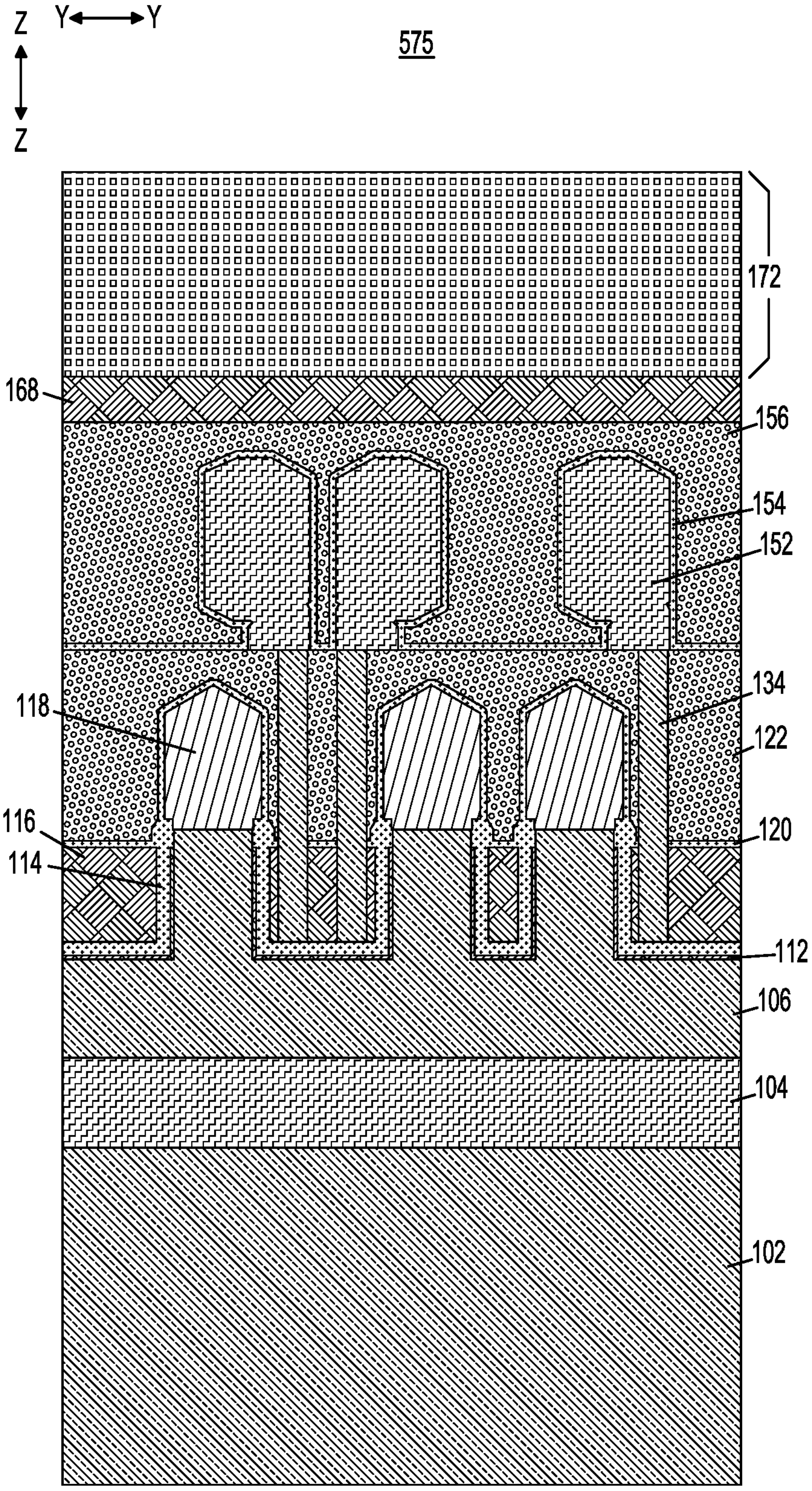
FIG. 5B depicts a second cross-sectional view of the structure of FIGS. 4A-4C following the formation of the gate stack for the top transistors of the stacked transistor structure, the middle-of-line contacts and the back-end-of-line interconnects, according to an embodiment of the invention.
Figure 5C:
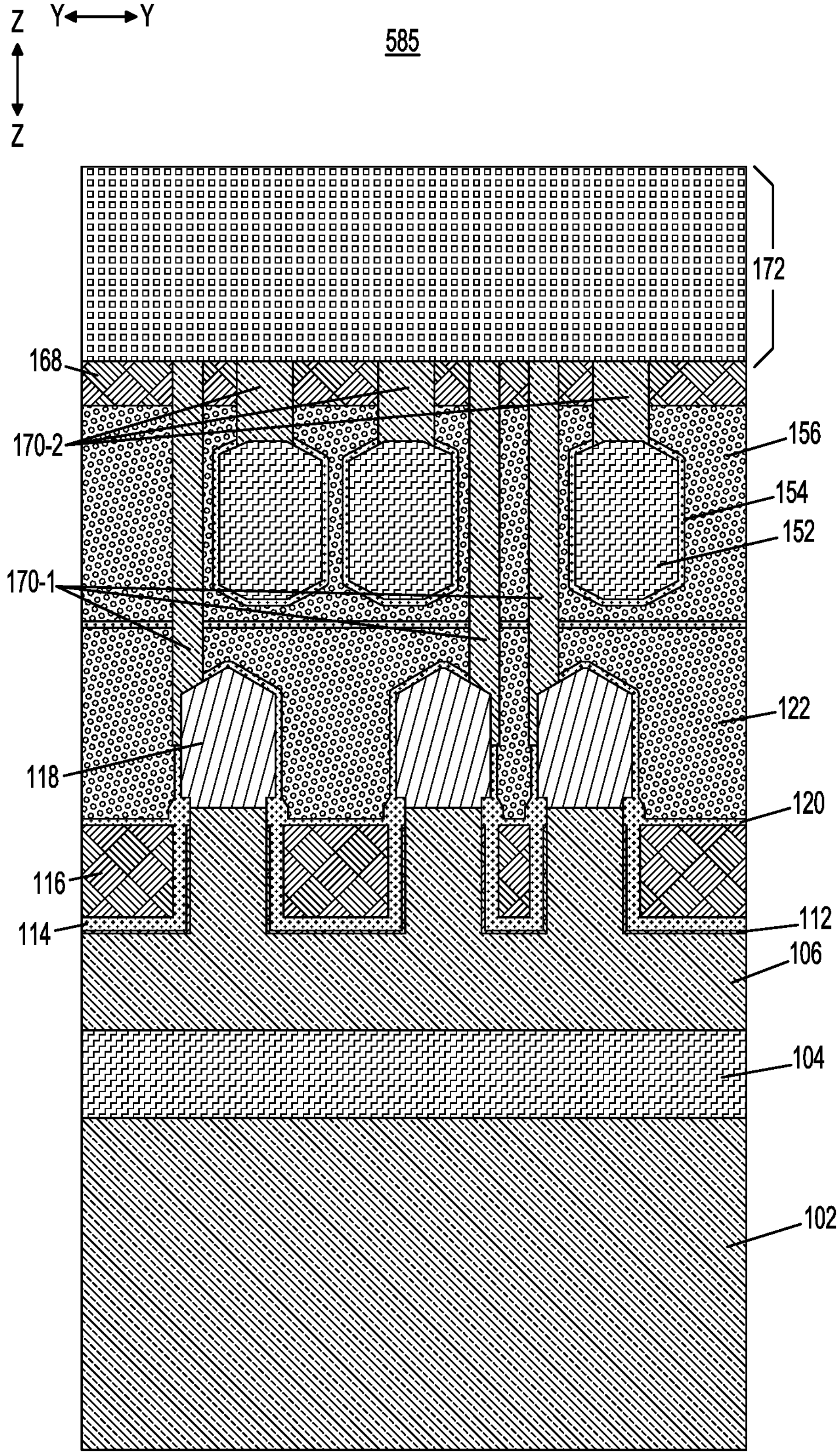
FIG. 5C depicts a third cross-sectional view of the structure of FIGS. 4A-4C following the formation of the gate stack for the top transistors of the stacked transistor structure, the middle-of-line contacts and the back-end-of-line interconnects, according to an embodiment of the invention.

FIGS. 5A-5C show different views of the structure of FIGS. 4A-4C following formation of a gate stack for the top transistors of the stacked transistor structure, and following formation of middle-of-line (MOL) contacts 170-1, 170-2 and 170-3 (collectively, MOL contacts 170) and back-end-of-line (BEOL) interconnects 172. FIG. 5A shows a first cross-sectional view 500 taken along the gate axis where gate regions for the top and bottom transistors of the stacked transistor structure are formed (e.g., along the line A-A in the layout view 199 of FIG. 1B). FIG. 5B shows a second cross-sectional view 575 taken along the gate axis where source ones of the source/drain regions 118 and 152 for the bottom and top transistors of the stacked transistor structure are formed (e.g., along the line B-B in the layout view 199 of FIG. 1B). FIG. 5C shows a third cross-sectional view 585 taken along the gate axis where drain ones of the source/drain regions 118 and 152 for the bottom and top transistors of the stacked transistor structure are formed (e.g., along the line C-C in the layout view 199 of FIG. 1B).

In some embodiments, optional gate merge vias may be formed. To form the gate merge vias, the dummy gate structures may be removed (e.g., the gate HM including oxide layer 148 and nitride layer 150, the dummy gate layers 146, and the oxide layer 144), followed by a channel release which removes the sacrificial layers 140. An IL oxide layer (not shown) is then conformally deposited, followed by formation of a gate dielectric layer 160 which is formed of similar materials and with similar sizing as the gate dielectric layer 126. A sacrificial layer may then be patterned over the structure, followed by etching through exposed portions of the structure down to the gate metal layer 138 for the bottom transistors of the stacked transistor structure to form gate merge vias. Subsequent metallization of the gate cavity for the top transistors of the stacked transistor structure creates a conductive metal connection between gates of the top and bottom transistors of the stacked transistor structure, as highlighted in regions 501 shown in FIG. 5A.

To complete formation of the gate stack for the top transistors of the stacked transistor structure, the sacrificial layer is removed, followed by formation of a gate WFM layer 162 and a gate metal layer 164 which are formed of similar materials and with similar sizing as the gate WFM layer 128 and the gate metal layer 130, respectively. Optional gate SAC capping layers 166 are then formed using similar processing, and with similar sizing and materials, as the gate SAC capping layers 132.

A dielectric layer 168 is then formed, which may be formed of a suitable dielectric such as an oxide material. To form the MOL contacts 170, one or more mask layers are patterned over the structure, followed by etching through portions of the structure exposed by such mask layers to form vias to the semiconductor terminals that the MOL contacts 170 connect to. A silicide layer is formed in the surface of the exposed semiconductor material of the source/drain terminals in the vias for the MOL contacts 170-1 and 170-2, followed by fill of a conductive material such as tungsten (W) or another suitable material. The vias for the MOL contacts 170-3 are filled of a conductive material such as tungsten (W) or another suitable material. The MOL contacts 170-1 connect to the source/drain regions 118 of the bottom transistors of the stacked transistor structure, the MOL contacts 170-2 connect to the source/drain regions 152 of the top transistors of the stacked transistor structure, and the MOL contacts 170-3 connect to the gate metal layer 164 of the gate stack of the top transistors of the stacked transistor structure. The gate merge vias in regions 501 allow the MOL contacts 170-3 to also connect to the gate metal layer 130 of the gate stack of the bottom transistors of the stacked transistor structure (e.g., the top and bottom transistors of the stacked transistor structure may have merged gates). BEOL interconnects 172 are then formed. The BEOL interconnects 172 may include one or more via and metal levels as needed to performed desired interconnections.

Figure 6A:
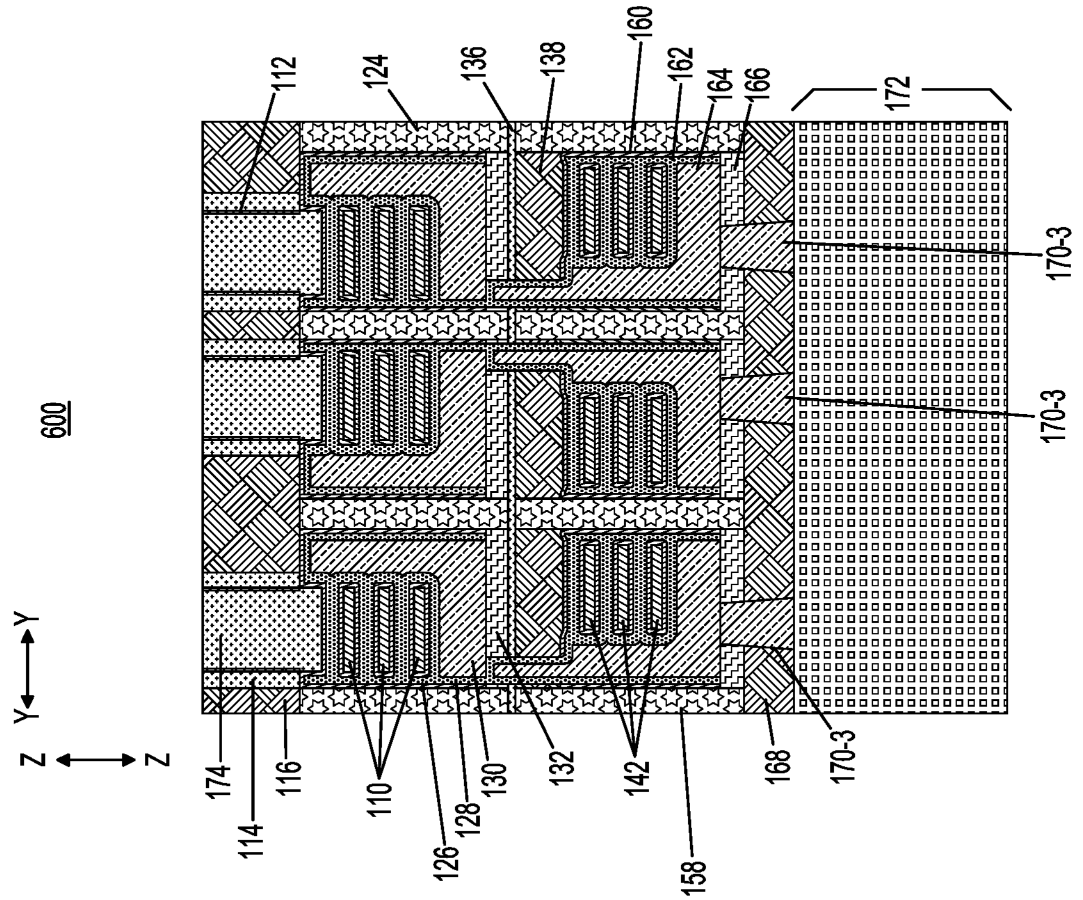
FIG. 6A depicts a first cross-sectional view of the structure of FIGS. 5A-5C following a wafer flip, backside removal of the substrate, formation of a backside interlayer dielectric layer, and formation of backside contacts to the source/drain regions of the bottom transistors of the stacked transistor structure, according to an embodiment of the invention.
Figure 6C:
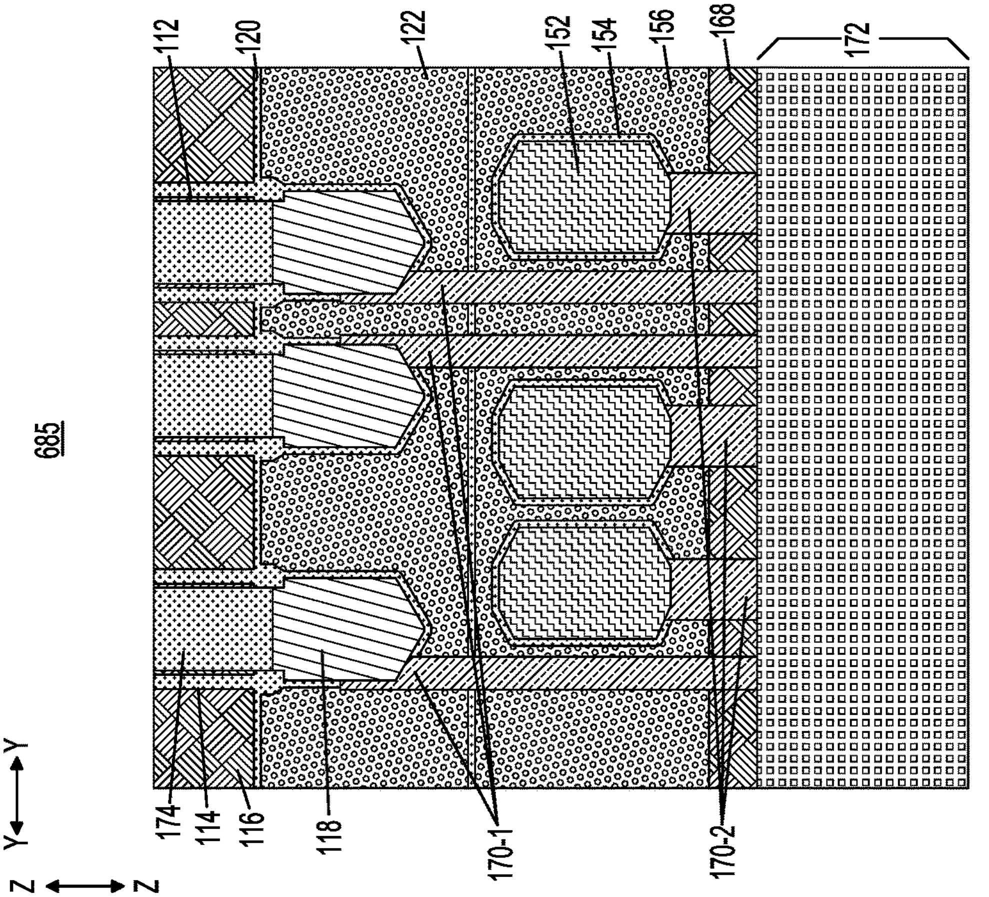
FIG. 6C depicts a third cross-sectional view of the structure of FIGS. 5A-5C following the wafer flip, the backside removal of the substrate, the formation of the backside interlayer dielectric layer, and the formation of backside contacts to the source/drain regions of the bottom transistors of the stacked transistor structure, according to an embodiment of the invention.
Figure 6B:
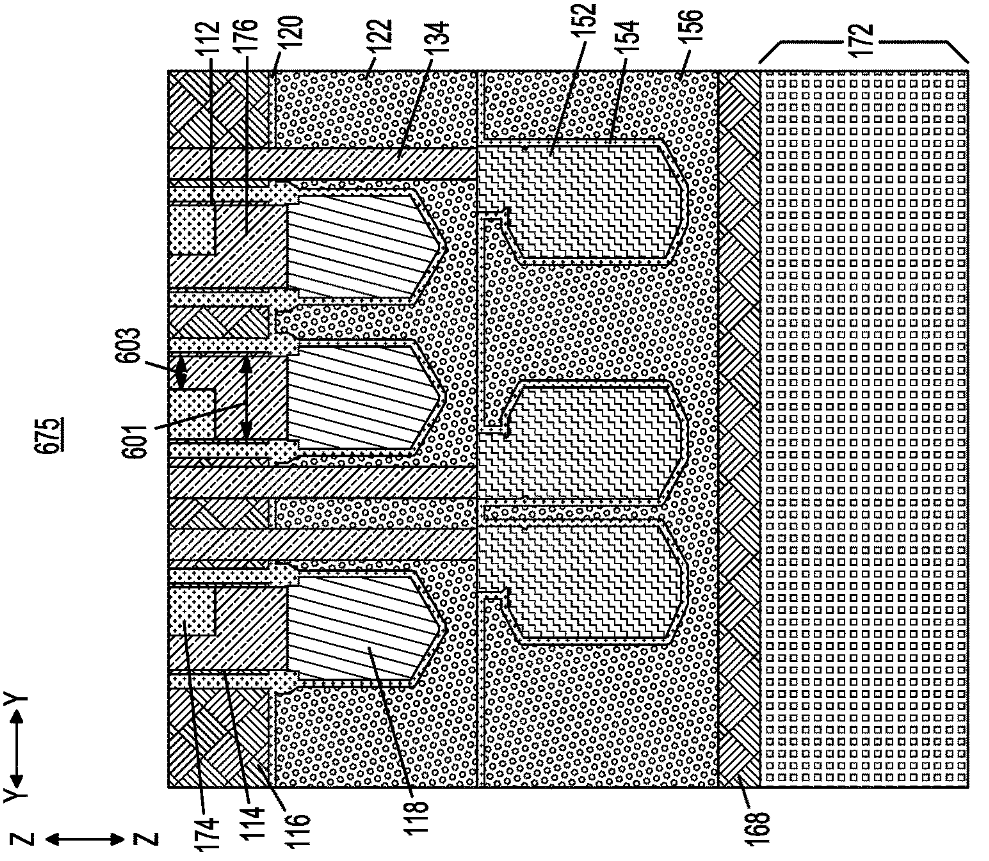
FIG. 6B depicts a second cross-sectional view of the structure of FIGS. 5A-5C following the wafer flip, the backside removal of the substrate, the formation of the backside interlayer dielectric layer, and the formation of backside contacts to the source/drain regions of the bottom transistors of the stacked transistor structure, according to an embodiment of the invention.

FIGS. 6A-6C show different views of the structure of FIGS. 5A-5C following a wafer flip, backside removal of the substrate 102, the etch stop layer 104 and the substrate 106, formation of a backside interlayer dielectric (ILD) layer 174, and formation of backside contacts 176 to the source/drain regions 118 of the bottom transistors of the stacked transistor structure. FIG. 6A shows a first cross-sectional view 600 taken along the gate axis where gate regions for the top and bottom transistors of the stacked transistor structure are formed (e.g., along the line A-A in the layout view 199 of FIG. 1B). FIG. 6B shows a second cross-sectional view 675 taken along the gate axis where source ones of the source/drain regions 118 and 152 for the bottom and top transistors of the stacked transistor structure are formed (e.g., along the line B-B in the layout view 199 of FIG. 1B). FIG. 6C shows a third cross-sectional view 685 taken along the gate axis where drain ones of the source/drain regions 118 and 152 for the bottom and top transistors of the stacked transistor structure are formed (e.g., along the line C-C in the layout view 199 of FIG. 1B).

The structure is bonded to a carrier wafer (not shown), which may be formed of Si or another suitable material, and is then flipped to perform backside processing. This includes etching (e.g., using grinding, CMP, RIE and WET) the first substrate 102, the etch stop layer 104, and the second substrate 106. Different WETs or other etching processes may be used to sequentially remove the first substrate 102 (e.g., formed of Si), the etch stop layer 104 (e.g., formed of SiGe), and the second substrate (e.g., formed of Si). Such processing exposes the source/drain regions 118 for the bottom transistors of the stacked transistor structure.

Material for the backside ILD layer 174 may be deposited to overfill the structure, followed by planarization (e.g., using CMP). The backside ILD layer 174 may be formed of a dielectric material such as SiN, a flowable oxide, Si—C—O—N based materials, etc.

The backside contacts 176 are formed in a multi-step process. First, a mask layer may be patterned over the backside of the structure, exposing portions of the backside ILD layer 174 where the backside contacts 176 will be formed. The exposed portions of the backside ILD layer 174 are then etched to expose the backside of the source/drain regions 118, followed by formation of a silicide and metal fill and planarization in the trenches formed by the removal of the exposed portions of the backside ILD layer 174, and recess of the metal filled in the trenches. This forms a first portion of the backside contacts 176 having the width 601 (e.g., the portion proximate the backside surfaces of the source/drain regions 118 for the bottom transistors of the stacked transistor structure). Material for the backside ILD layer 174 is then redeposited to fill the structure, and is planarized. Next, another mask layer is patterned over the structure to reveal only a portion of the backside ILD layer 174 filled over the first portion of the backside contacts 176. The exposed portions of the backside ILD layer 174 are then etched to form trenches for a second portion of the backside contacts 176. A metal fill and planarization process is then performed to form the second portion of the backside contacts 176 having the width 603 (e.g., the portion which is adjacent the backside ILD layer 176). The backside contacts 176 may be formed of W or another suitable material.

Figure 7:
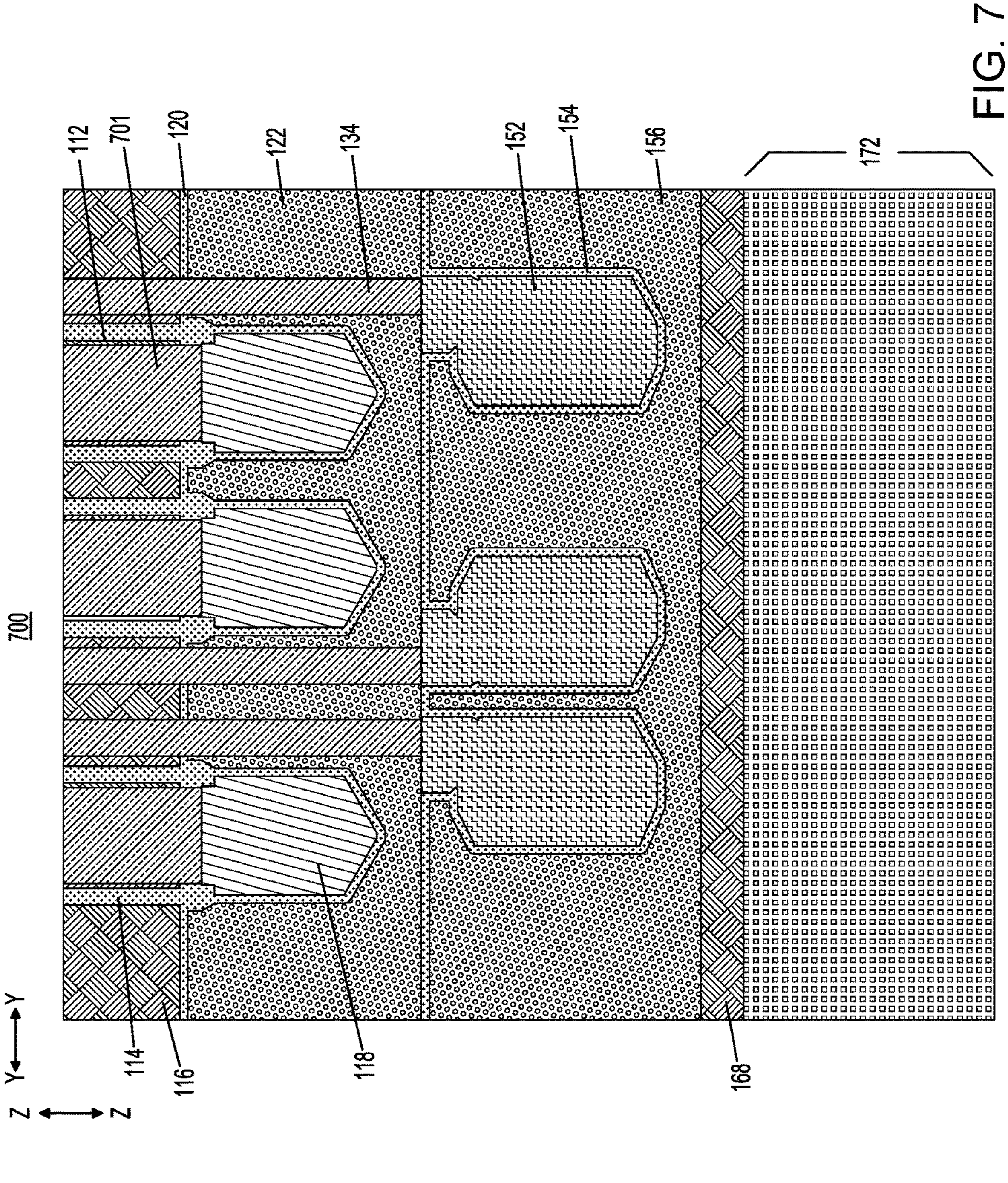
FIG. 7 shows a cross-sectional view of the structure of FIGS. 5A-5C following formation of backside contacts to the source/drain regions of the bottom transistors of the stacked transistor structure with a different shape than the backside contacts of FIGS. 6A-6C, according to an embodiment of the invention.

FIG. 7 shows a cross-sectional view 700 of the structure of FIGS. 5A-5C following formation of backside contacts 701 to the source/drain regions 118 of the bottom transistors of the stacked transistor structure, where the backside contacts 701 have a different shape than the backside contacts 176. The cross-sectional view 700 of FIG. 7, similar to the cross-sectional view 675 of FIG. 6B, is taken along the gate axis where source ones of the source/drain regions 118 and 152 for the bottom and top transistors of the stacked transistor structure are formed (e.g., along the line B-B in the layout view 199 of FIG. 1B).

The backside contacts 701 are formed by patterning a mask over the structure and removing exposed portions of the backside ILD layer 174 to reveal the backside surfaces of the source/drain regions 118 for the bottom transistors of the stacked transistor structure. The backside contacts 701 are then filled in the trenches formed by removal of the exposed portions of the backside ILD layer 174 as illustrated. The backside contacts 701 may be formed of similar materials as the backside contacts 176 (including a silicide layer and a conductive material such as W). The backside contacts 701 may also be formed by removing optional placeholder layers.

Figure 8A:
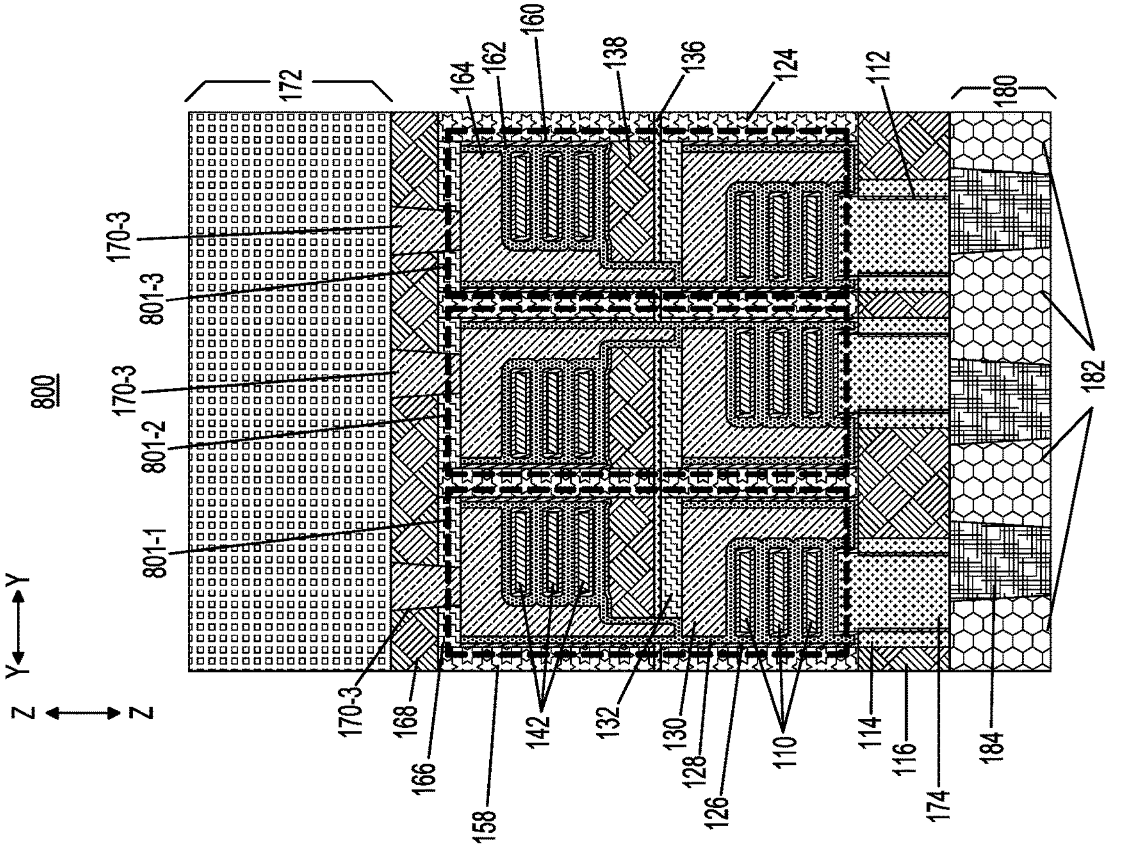
FIG. 8A depicts a first cross-sectional view of the structure of FIGS. 6A-6C following formation of backside contacts to the source/drain regions of the top transistors of the stacked transistor structure, formation of a backside power delivery network and flip of the structure, according to an embodiment of the invention.
Figure 8C:
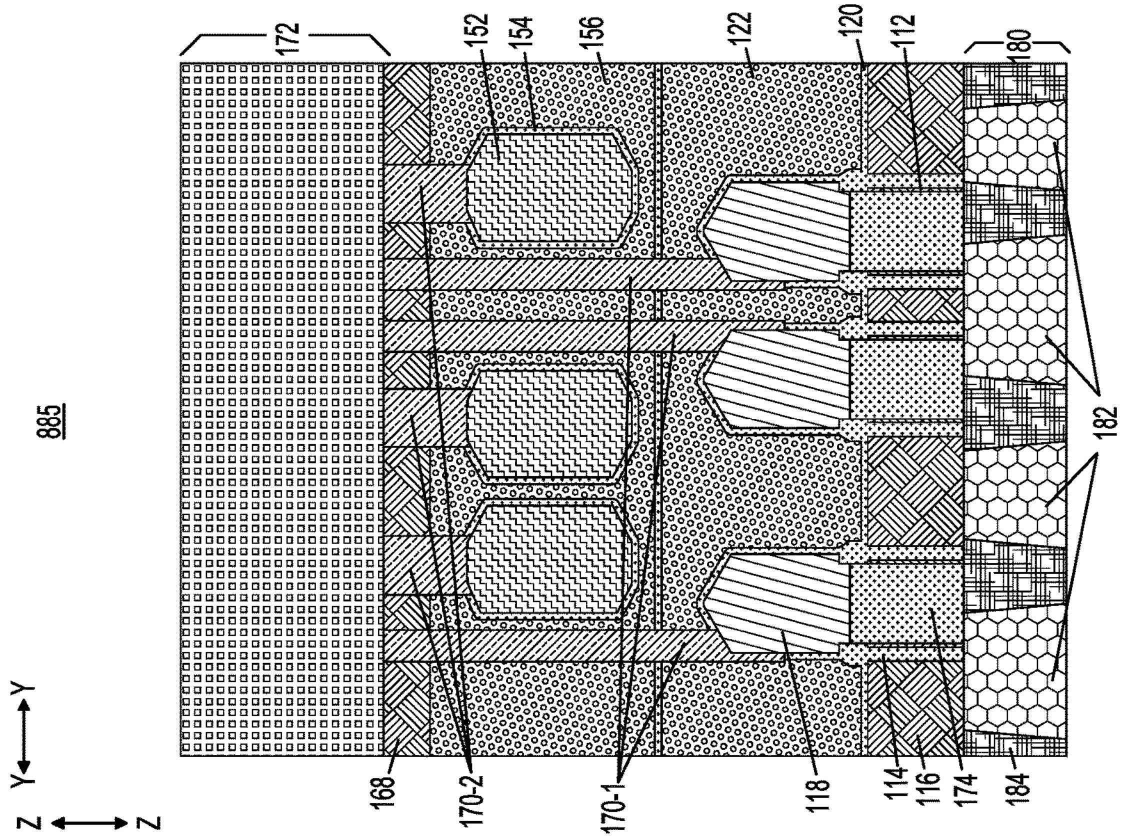
FIG. 8C depicts a third cross-sectional view of the structure of FIGS. 6A-6C following the formation of the backside contacts to the source/drain regions of the top transistors of the stacked transistor structure, the formation of the backside power delivery network and the flip of the structure, according to an embodiment of the invention.
Figure 8B:
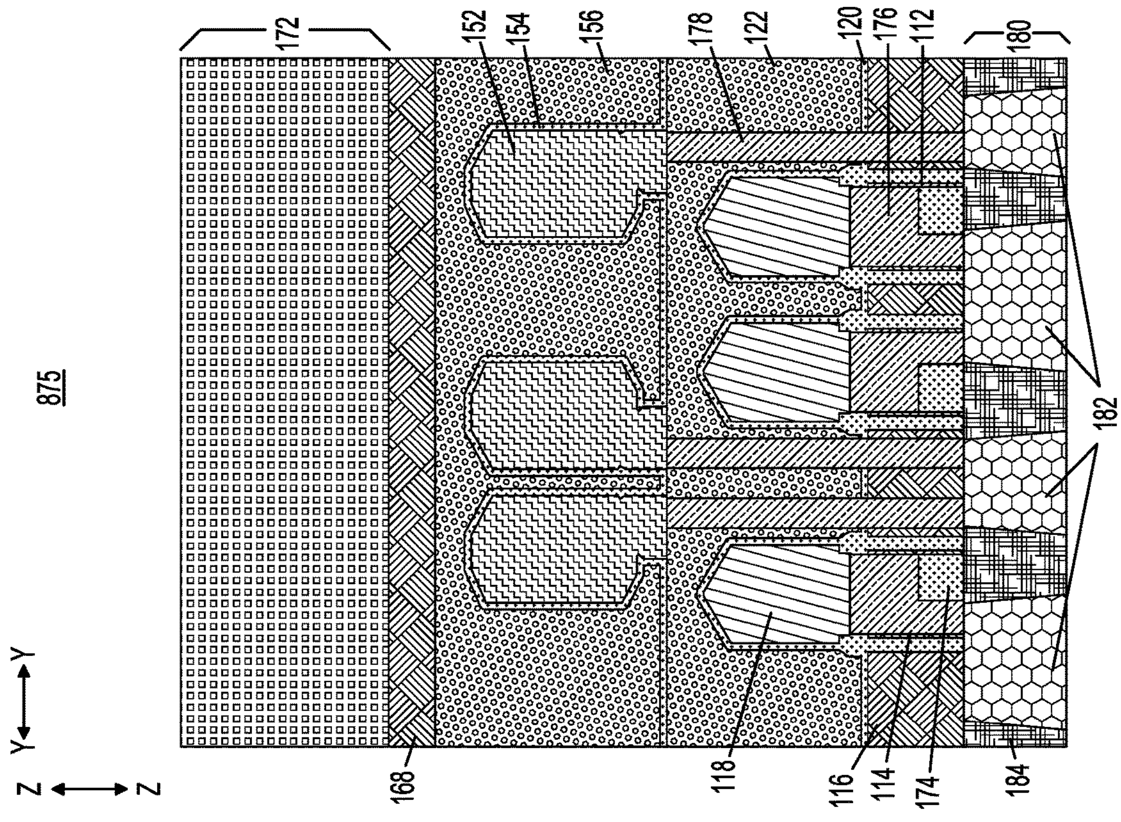
FIG. 8B depicts a second cross-sectional view of the structure of FIGS. 6A-6C following the formation of the backside contacts to the source/drain regions of the top transistors of the stacked transistor structure, the formation of the backside power delivery network and the flip of the structure, according to an embodiment of the invention.

FIGS. 8A-8C show different views of the structure of FIGS. 6A-6C following formation of backside contacts 178 to the source/drain regions 152 of the top transistors of the stacked transistor structure, formation of a backside power delivery network (BSPDN) 180, and flip of the structure. FIG. 8A shows a first cross-sectional view 800 taken along the gate axis where gate regions for the top and bottom transistors of the stacked transistor structure are formed (e.g., along the line A-A in the layout view 199 of FIG. 1B). FIG. 8B shows a second cross-sectional view 875 taken along the gate axis where source ones of the source/drain regions 118 and 152 for the bottom and top transistors of the stacked transistor structure are formed (e.g., along the line B-B in the layout view 199 of FIG. 1B). FIG. 8C shows a third cross-sectional view 885 taken along the gate axis where drain ones of the source/drain regions 118 and 152 for the bottom and top transistors of the stacked transistor structure are formed (e.g., along the line C-C in the layout view 199 of FIG. 1B).

To form the backside contacts 178, the placeholder layers 134 are first removed (e.g., using any suitable etch processing). Material for the backside contacts 178 is then deposited in the vias formed by removal of the placeholder layers 134. The backside contacts 178 may be formed of similar materials as the backside contacts 176. A silicidation of the exposed backside surfaces of the source/drain regions 152 of the top transistors of the stacked transistor structure may be performed prior to metal fill of the backside contacts 178. In some embodiments, the backside contacts 178 are formed prior to the backside contacts 176 (or, alternatively, the backside contacts 701 of FIG. 7 having the alternate shape). Similar processing may be used to form the backside contacts 178 in the structure of FIG. 7 having the backside contacts 701 to the source/drain regions 118 of the bottom transistors of the stacked transistor structure with the alternate shape.

The BSPDN 180 may include one or more metal levels, although only a single metal level is shown in FIGS. 8A-8C for clarity of illustration. The metal level shown in FIGS. 8A-8C includes power rails 182 formed of copper (Cu) or another suitable material. The metallization of the power rails 182 may include a liner formed of TaN, Co or another suitable material, followed by a metal fill of Cu or another suitable material. The power rails 182 are surrounded by one or more dielectric layers 184.

As shown in FIG. 8A, a set of mirrored stacked transistor cells 801-1, 801-2 and 801-3 (collectively, stacked transistor cells 801) are thus formed, where in this example the cell boundaries of the stacked transistor cells 801 are defined by the gate cut dielectric layers 124 and 158 which are horizontally aligned with one another. It should be noted that the cell boundaries of the stacked transistor cells 801 may be defined as a central axis or central plane of the aligned gate cut dielectric layers 124 and 158, as in some embodiments some gate cuts are larger than others. It should be noted, however, that in some embodiments gate cuts for the top and/or bottom transistors of laterally adjacent stacked transistor cells may be omitted to allow for gate merging between the top and/or bottom transistors thereof. In such cases where there are no gate cuts for the top and/or bottom transistors between two adjacent stacked transistor cells, the cell boundaries may be defined as a central vertical plane between the two adjacent stacked transistor cells It should be noted that, in some embodiments the bottom transistors of one or more of the stacked transistors cells 801 comprise one of nFETs and pFETs and the top transistors of the stacked transistor cells 801 comprise the other one of nFETs and pFETs (e.g., the bottom transistors may be nFETs and the top transistors may be pFETS, or the bottom transistors may be pFETs and the top transistors may be nFETs). The nFETs utilize nFET WFM materials in their gate stacks and n-type dopants in their source/drain regions, while the pFETS utilize pFET WFM materials in their gate stacks and p-type dopants in their source/drain regions. In other embodiments, the bottom transistors and top transistors of one or more of the stacked transistor cells 801 may be a same type (e.g., both nFETs or both pFETs).

Figure 9:
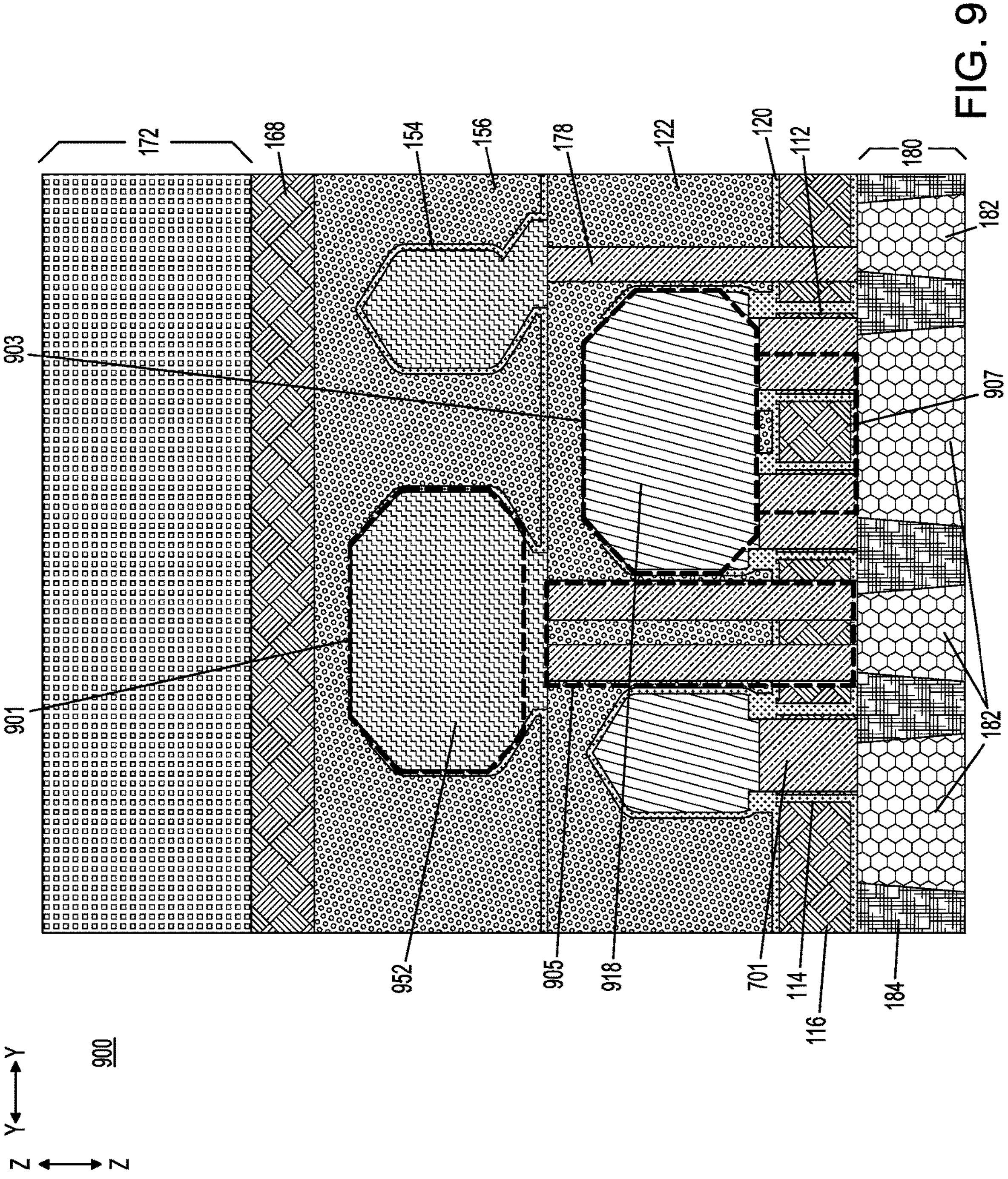
FIG. 9 depicts a cross-sectional view of the structure of FIGS. 8A-8C illustrating alternate configurations of the source/drain regions for the top and bottom transistors of the stacked transistor structure, as well as alternate configurations of the backside contacts to the source/drain regions for the top and bottom transistors of the stacked transistor structure, according to an embodiment of the invention.

FIG. 9 shows a cross-sectional view 900 illustrating possible alternate configurations for source/drain regions for top and bottom transistors of a stacked transistor structure. The cross-sectional view 900 of FIG. 9 is similar to the cross-sectional view 875 of FIG. 8B, although the alternate configuration for the backside contacts 701 is utilized.

The alternate configurations shown in FIG. 9 include differently-shaped source/drain regions 952 for the top transistors of the stacked transistor structure. The alternate configuration for the source/drain regions 952 may be provided by exposing the semiconductor placeholder during epitaxy of the source/drain regions 952 for the top transistors of the stacked transistor structure, causing the epitaxy to grow also from the placeholder such that it merges with the source for the top transistors of the stacked transistor structure. As a consequence, when the placeholder is removed from the backside, the source of the source/drain regions 952 for the top transistors of the stacked transistor structure is already exposed and an additional etch through dielectrics is not needed to reach the source for the top transistors of the stacked transistor structure. FIG. 9 shows another alternate configuration for the source/drain regions 952 highlighted by the dashed outline 901 where some of the source/drain regions 952 are merged. Similarly, some of the source/drain regions 918 for the bottom transistors of the stacked transistor structure may be merged as highlighted by the dashed outline 903.

FIG. 9 further shows possible alternate configurations for the backside contacts 701 (which may also be used for backside contacts 176) and 178, where instead of forming two individual instances of the backside contacts 701 (or 176) and 178, single large vias are formed (e.g., from the frontside) as highlighted by the dashed outline 905, such that the sources for the bottom and top transistors of the stacked transistor structure are merged. Similarly, single large vias may be formed (e.g., from the backside) as highlighted by the dashed outline 907.

Figure 10A:
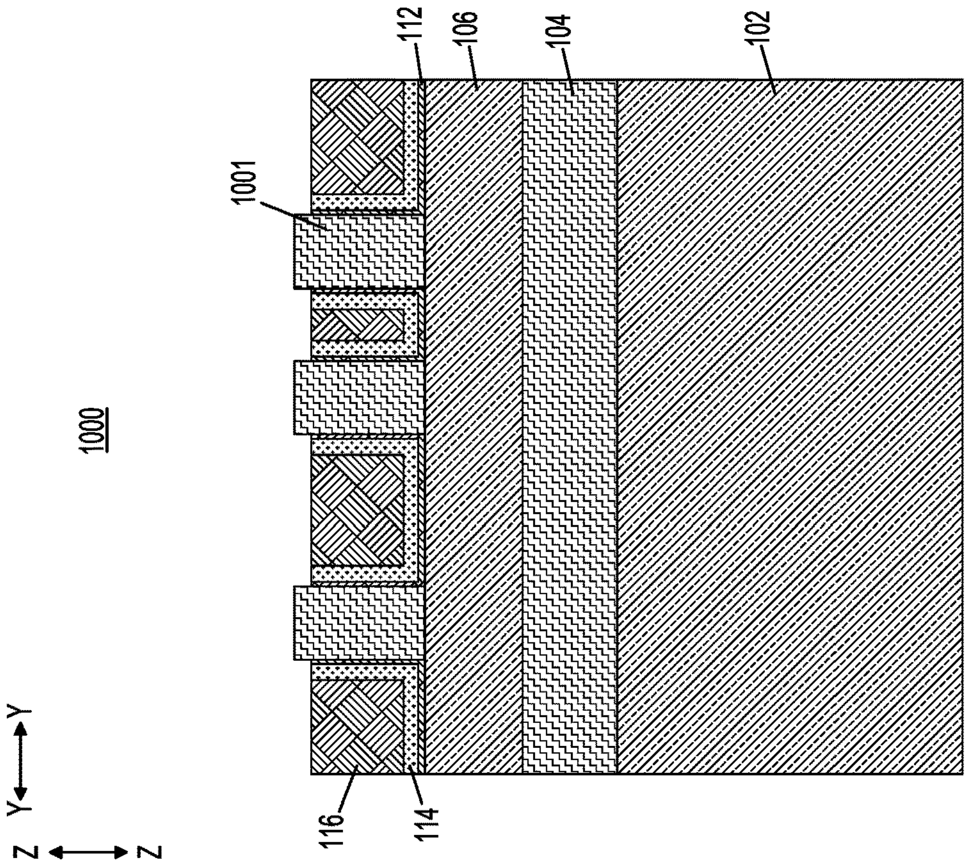
FIG. 10A depicts a first cross-sectional view of a structure following formation of placeholder layers facilitating formation of backside contacts to source/drain regions of bottom transistors of a stacked transistor structure, according to an embodiment of the invention.
Figure 10B:
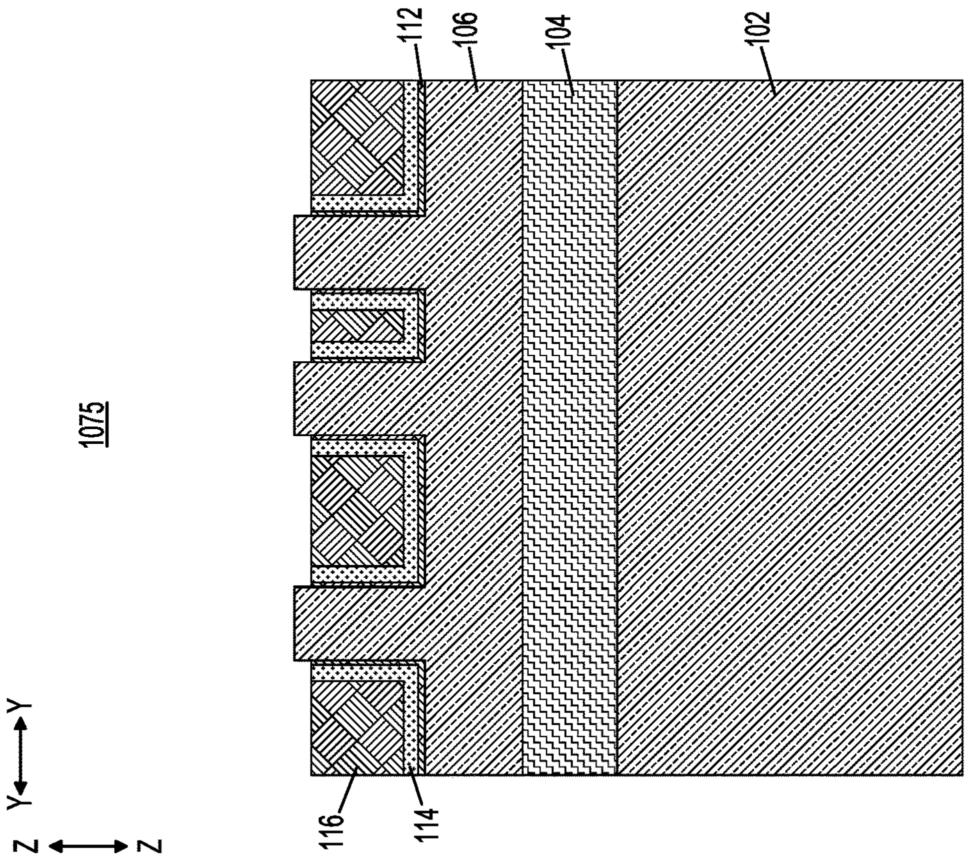
FIG. 10B depicts a second cross-sectional view of a structure following formation of the placeholder layers facilitating formation of backside contacts to source/drain regions of bottom transistors of a stacked transistor structure, according to an embodiment of the invention.

FIGS. 10A and 10B show different views of a structure following formation of placeholder layers 1001 which facilitate later formation of the backside contacts 176/701 to the bottom source/drain regions 118 of the stacked transistor structure. FIG. 10A shows a first cross-sectional view 1000 taken along the gate axis where source ones of the source/drain regions 118 for the bottom and top transistors of the stacked transistor structure will be formed (e.g., along the line B-B in the layout view 199 of FIG. 1B). FIG. 10B shows a second cross-sectional view 1075 taken along the gate axis where drain ones of the source/drain regions 118 for the bottom transistors of the stacked transistor structure will be formed (e.g., along the line C-C in the layout view 199 of FIG. 1B).

The placeholder layers 1001 may be formed following nanosheet source/drain recess, or after formation of the inner spacers. The placeholder layers 1001 may be formed by etching into the second substrate 106 to create trenches, followed by deposition of material for the placeholder layers 1001. The material for the placeholder layers 1001 may comprise a semiconductor material which may be obtained by the deposition or epitaxial growth of SiGe, SiGe:B, Si:B, combinations thereof, a dielectric material such as $SiO_2$ or SiN based materials, etc. If needed, the material of the placeholder layers 1001 may be etched back such that top surfaces thereof are under or below the bottommost one of the nanosheet channel layers 110. The placeholder layers 1001 may be formed in one or both sides of the transistors, and may include forming a spacer to protect gate regions. The placeholder layers 1001 facilitate later formation of the backside contacts (e.g., backside contacts 176/701).

Figure 11:
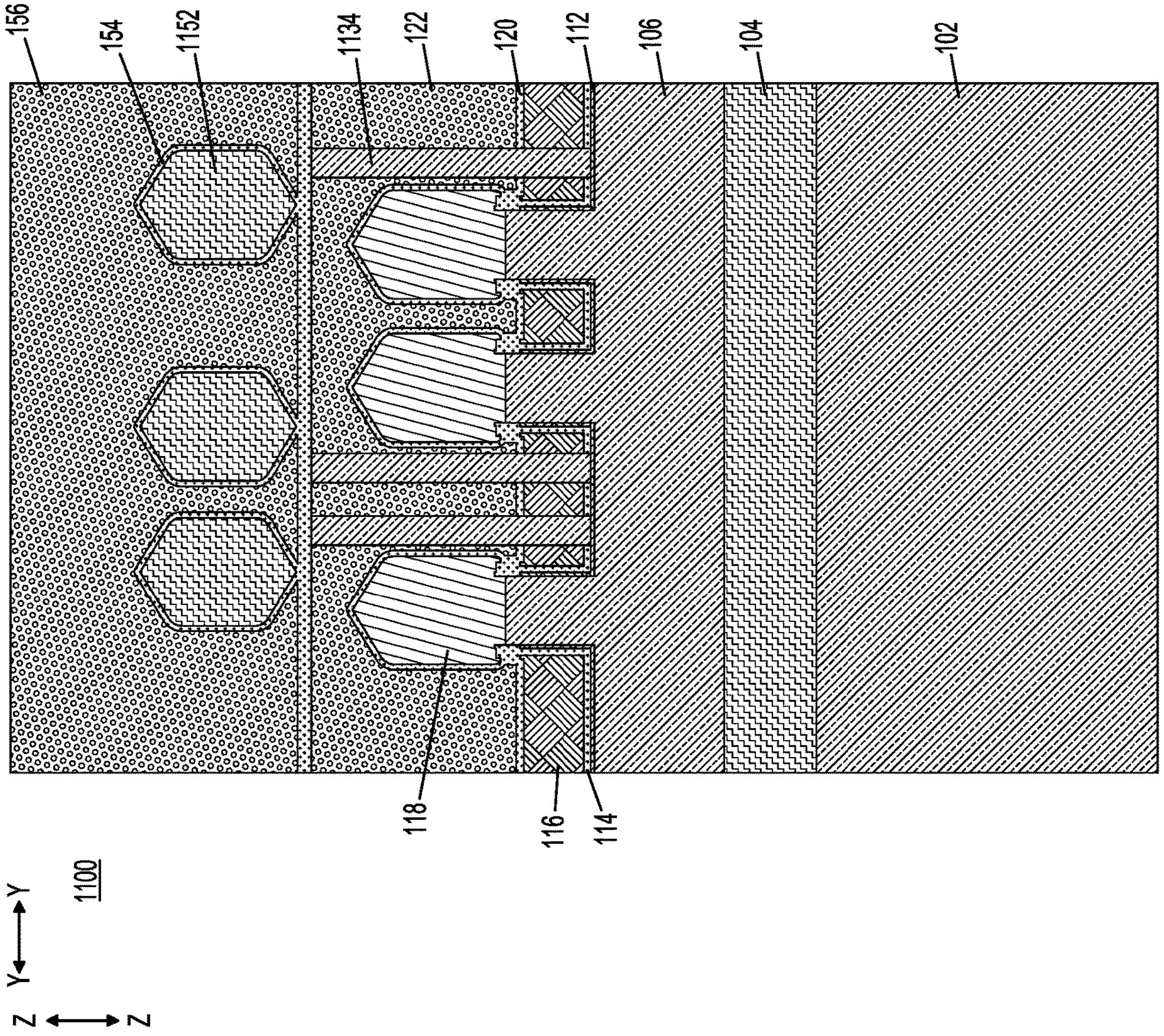
FIG. 11 depicts a cross-sectional view of a structure illustrating an alternate configuration for placeholder layers and source/drain regions for the top transistors of the stacked transistor structure, according to an embodiment of the invention.

FIG. 11 shows a cross-sectional view 1100 illustrating possible alternate configurations for placeholder layers and source/drain regions for top transistors of a stacked transistor structure. The cross-sectional view 1100 of FIG. 11 is similar to the cross-sectional view 475 of FIG. 4B. In this alternate configuration, the placeholder layers 1134 are not exposed during the epitaxial growth of source/drain regions 1152 for the top transistors of the stacked transistor structure, resulting in the differently-shaped source/drain regions 1152 (e.g., relative to the source/drain regions 152 shown in FIG. 4B). As a result, when the placeholder layers 1134 are later removed to form backside contacts to the source/drain regions 1152, additional etching is used to etch through the dielectric bonding materials to expose the bottom of the source/drain regions 1152 such that the backside contacts to the source/drain regions 1152 may be created through silicidation, metallization, and planarization.

Figure 12:
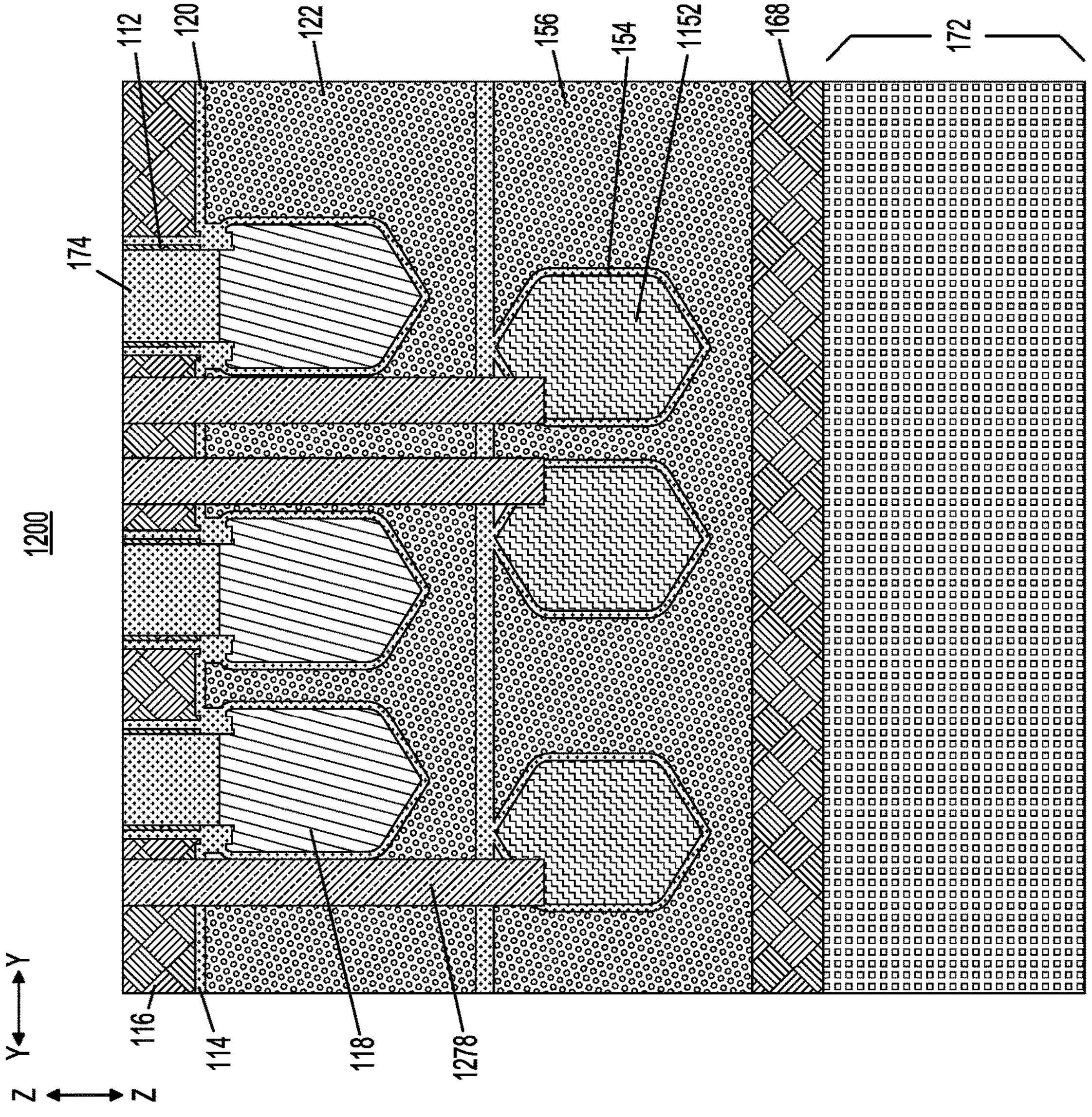
FIG. 12 depicts a cross-sectional view of the structure of FIG. 11 following formation of backside contacts to the source/drain regions for the top transistors of the stacked transistor structure, according to an embodiment of the invention.

FIG. 12 shows a cross-sectional view 1200 of the structure of FIG. 11, following formation of backside contacts 1278 to the source/drain regions 1152. The cross-sectional view 1200 of FIG. 12 is similar to the cross-sectional view 675 of FIG. 6B (though it is subsequent to formation of the backside contacts 178). In this alternate configuration, the backside contacts 1278 are formed as described above, by removal of the placeholder layers 1134 followed by etching through the bonding dielectrics to expose the bottom or backside surfaces of the source/drain regions 1152 for the top transistors of the stacked transistor structure. The backside contacts 1278 may be formed of similar materials as the backside contacts 178.

A process flow for forming stacked transistor structures with aligned cell boundaries and shifted channels with another type of gate-all-around (GAA) structure will now be described.

Figure 13:
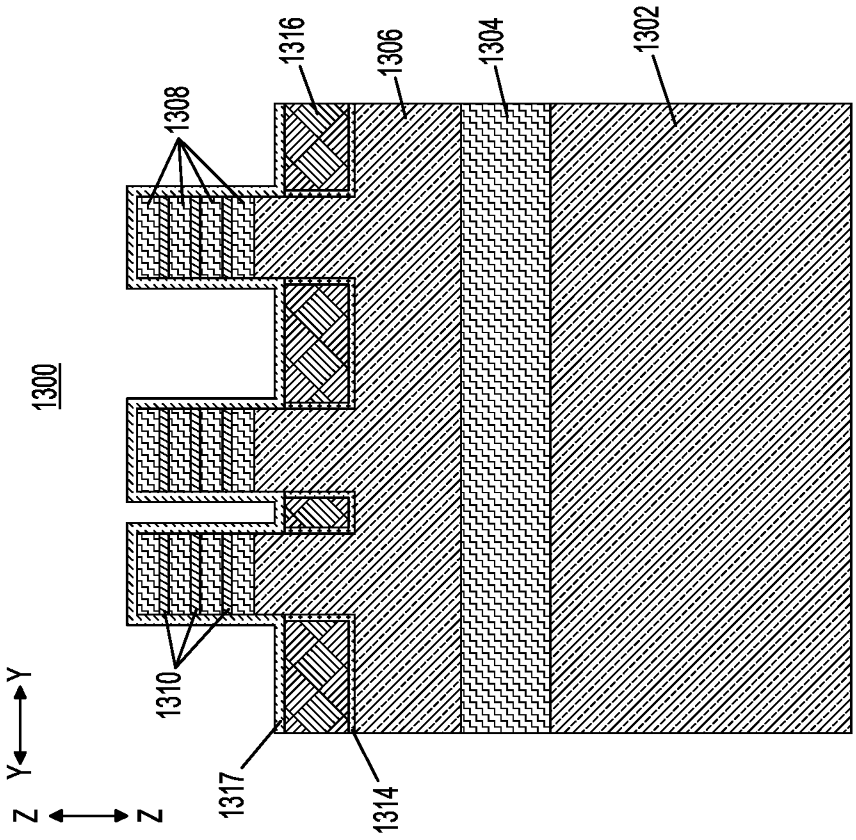
FIG. 13 depicts a cross-sectional view of a structure similar to that of FIG. 1A following formation of a dielectric wall liner for bottom transistors of a stacked transistor structure, according to an embodiment of the invention.

FIG. 13 shows a cross-sectional view 1300 of a structure similar to that of FIG. 1A, following formation of a liner layer 1317. The cross-sectional view 1300 of FIG. 13 is taken along the gate axis, which may be where the gate regions or source/drain regions for the bottom transistors of the stacked transistor structure will be formed (e.g., along any of the lines A-A, B-B and C-C in the layout view 199 of FIG. 1B).

The structure of FIG. 13 includes a first substrate 1302, an etch stop layer 1304, a second substrate 1306, a nanosheet stack for the bottom transistors of the stacked transistor structure including sacrificial layers 1308 and nanosheet channel layers 1310, a nitride layer 1314 and STI regions 1316, which are formed of similar materials and with similar sizing and processing as that described above with respect to the first substrate 102, the etch stop layer 104, the second substrate 106, the sacrificial layers 108, the nanosheet channel layers 110, the nitride layer 114 and the STI regions 116, respectively. In the structure of FIG. 13, the first small distance (e.g., inter-device separation distance 115) between two laterally adjacent transistors can be scaled with respect to the integration processing described above with respect to FIGS. 1-12. The structure of FIG. 13, for example, can shrink the distance between the laterally adjacent transistors down to the range of 8-30 nm.

Following formation of the STI regions 1316, a liner layer 1317 is deposited over the structure. The liner layer 1317 may be referred to as a dielectric wall liner for the bottom transistors of the stacked transistor structure, and may be formed of $SiO_2$. The liner layer 1317 may have a uniform thickness in the range of 4-10 nm.

Figure 14:
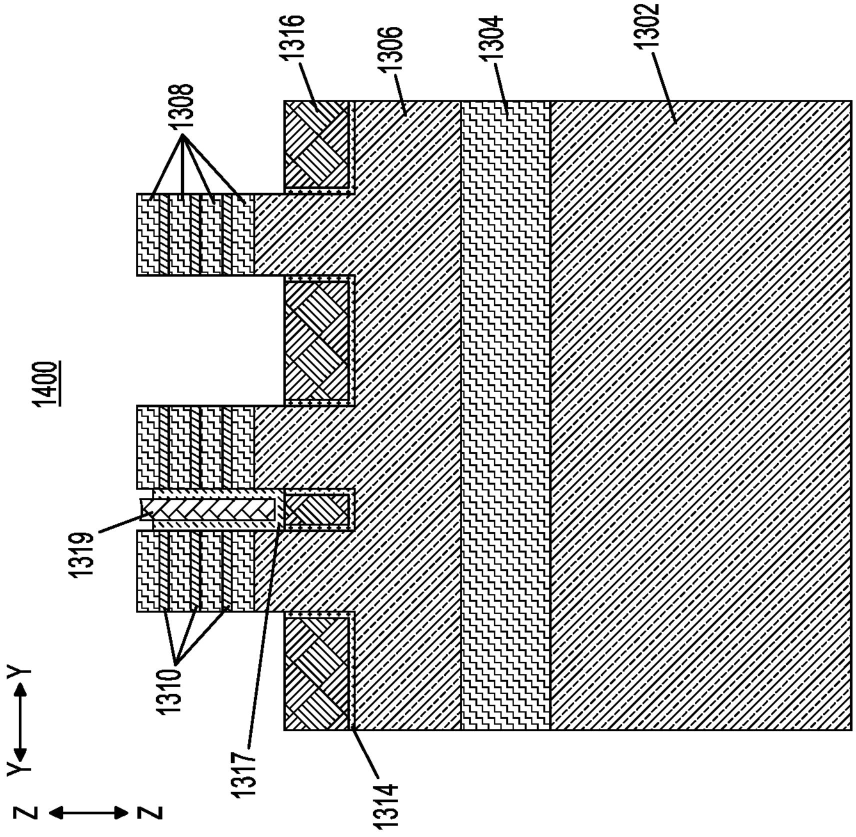
FIG. 14 depicts a cross-sectional view of the structure of FIG. 13 following formation of a dielectric wall layer for the bottom transistors of the stacked transistor structure, according to an embodiment of the invention.

FIG. 14 shows a cross-sectional view 1400 of the structure of FIG. 13 following formation of a dielectric wall layer 1319 for the bottom transistors of the stacked transistor structure. The cross-sectional view 1400 of FIG. 14 is taken along the gate axis, which may be where the gate regions or source/drain regions for the bottom transistors of the stacked transistor structure will be formed (e.g., along any of the lines A-A, B-B and C-C in the layout view 199 of FIG. 1B).

The dielectric wall layer 1319 may be formed of SiN or another suitable material such as SiBCN, SiCO, SiC, etc. The material for the dielectric wall layer 1319 may initially be deposited over the entire structure, followed by an isotropic etch of the material of the dielectric wall layer 1319 to reveal the nanosheet stack. The dielectric wall layer 1319 pinches off, and is thus not completely removed during this isotropic etch. Next, an isotropic etch of the liner layer 1317 is performed to reveal the top surfaces of the STI regions 116 and the nanosheet stack.

Figure 15B:
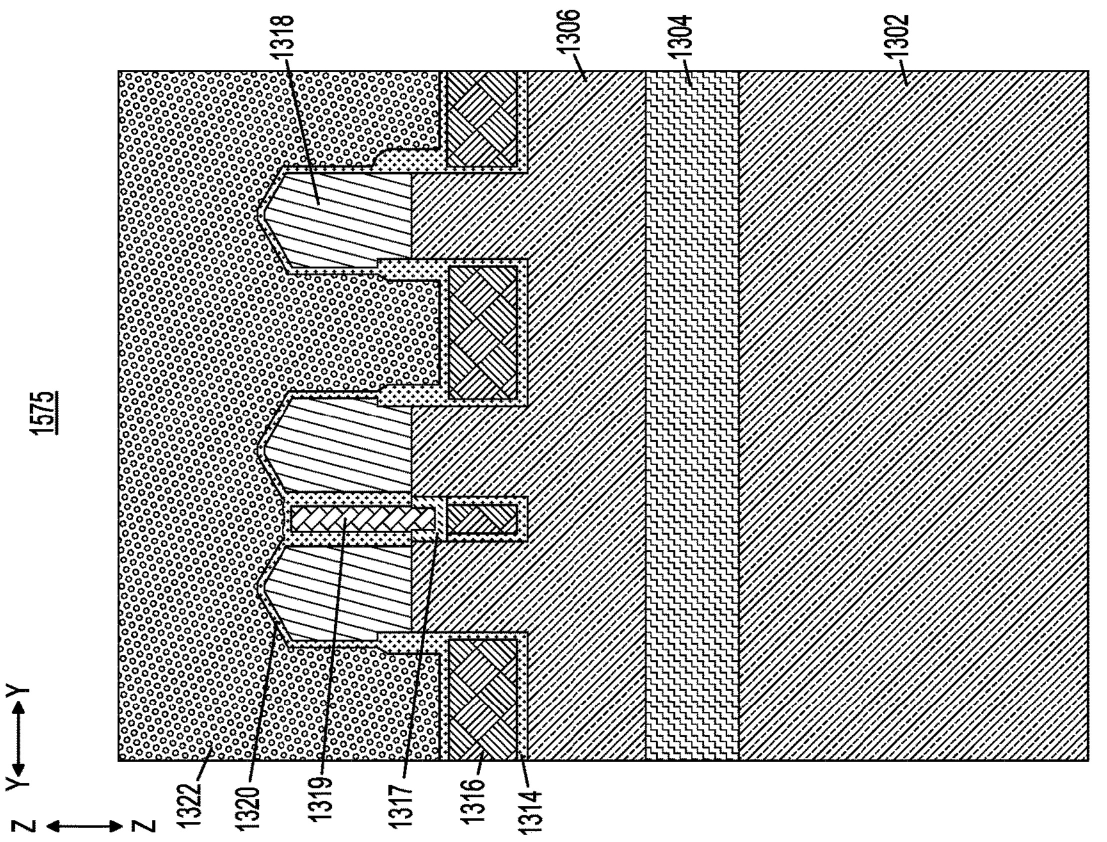
FIG. 15B depicts a second cross-sectional view of the structure of FIG. 14 following formation of source/drain regions for the bottom transistors of the stacked transistor structure, a liner layer, an oxide layer and gate cut dielectric layers, and following an isotropic etch which removes portions of the dielectric wall liner for the bottom transistors of the stacked transistor structure, according to an embodiment of the invention.
Figure 15A:
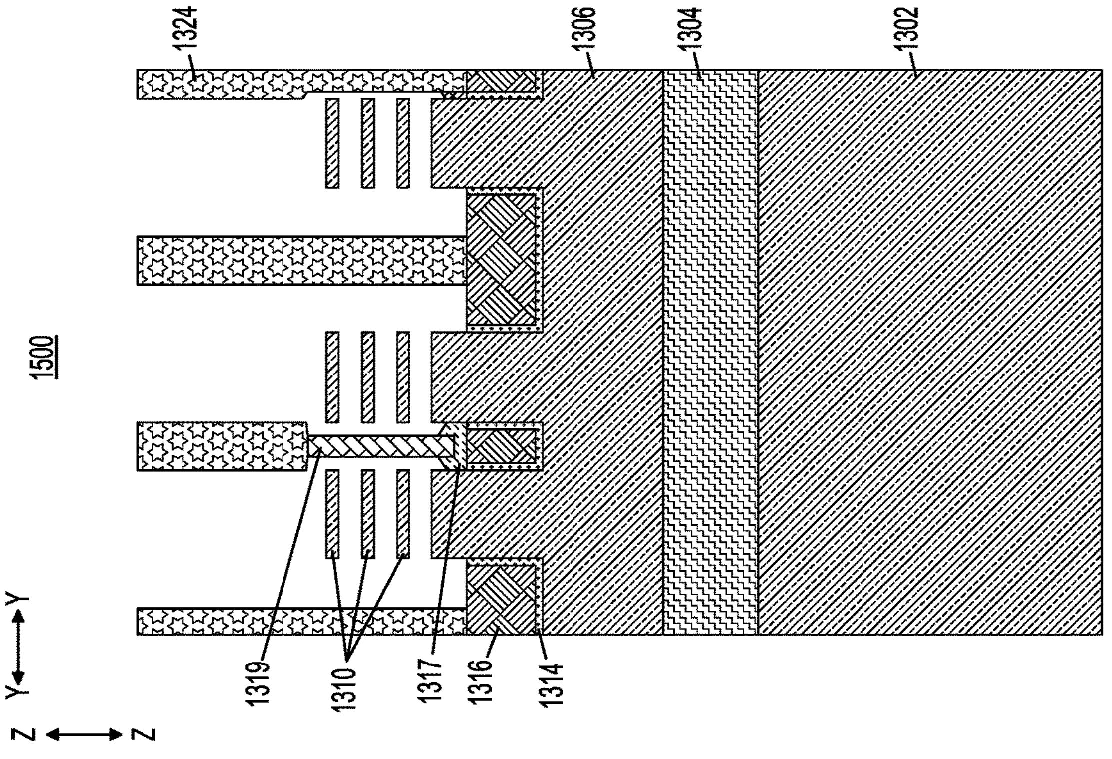
FIG. 15A depicts a first cross-sectional view of the structure of FIG. 14 following formation of source/drain regions for the bottom transistors of the stacked transistor structure, a liner layer, an oxide layer and gate cut dielectric layers, and following an isotropic etch which removes portions of the dielectric wall liner for the bottom transistors of the stacked transistor structure, according to an embodiment of the invention.

FIGS. 15A and 15B show different views of the structure of FIG. 14 following formation of dummy gate structures (not shown), inner spacers (not shown), source/drain regions 1318 for the bottom transistors of the stacked transistor structure, liner layer 1320, oxide layer 1322, gate cut dielectric layers 1324, removal of the dummy gate structures, and following an isotropic etch which removes portions of the liner layer 1317. FIG. 15A shows a first cross-sectional view 1500 taken along the gate axis where gate regions for the bottom transistors of the stacked transistor structure will be formed (e.g., along the line A-A in the layout view 199 of FIG. 1B). FIG. 15B shows a second cross-sectional view 1575 taken along the gate axis where the source/drain regions 1318 for the bottom transistors of the stacked transistor structure are formed (e.g., along the line B-B or the line C-C in the layout view 199 of FIG. 1B).

The source/drain regions 1318, the liner layer 1320, the oxide layer 1322, and the gate cut dielectric layers 1324 may be formed of similar materials and using similar processing as that described above with respect to the source/drain regions 118, the liner layer 120, the oxide layer 122 and the gate cut dielectric layers 124, respectively. Following removal of the dummy gate structures, an isotropic etch which removes portions of the liner layer 1317 is then performed.

Figure 16:
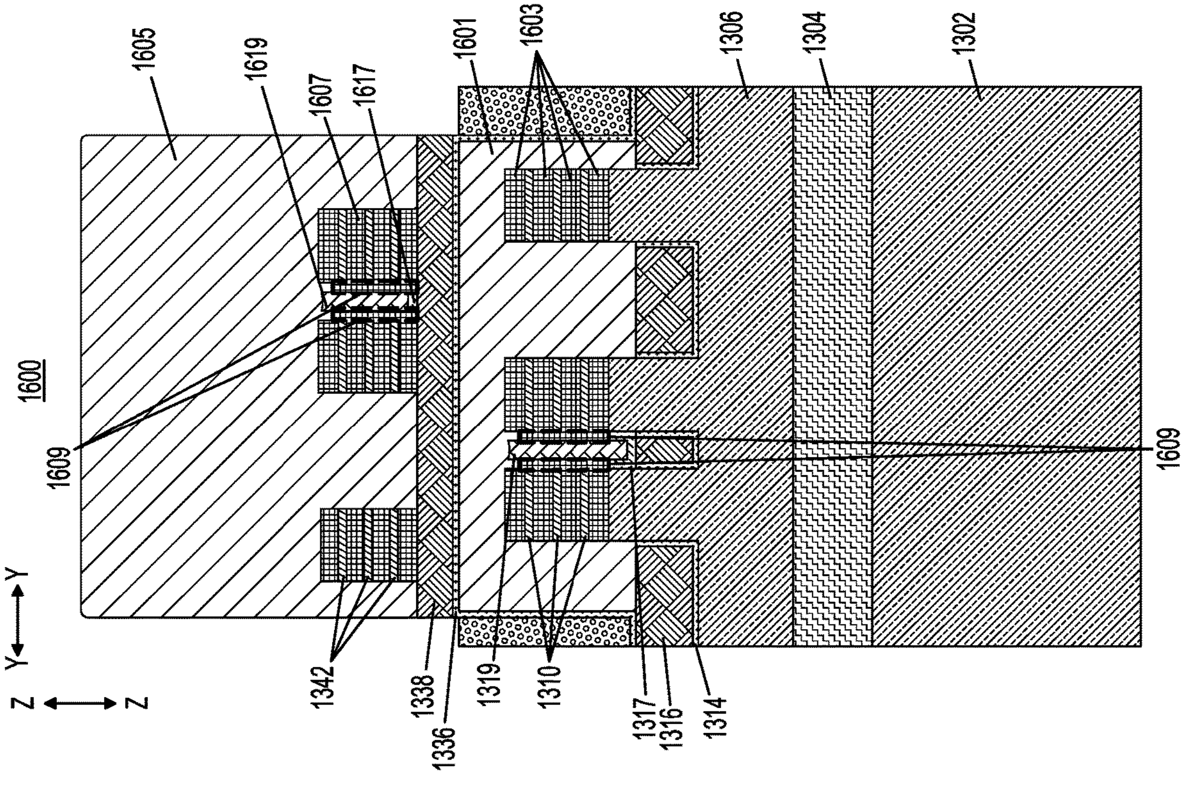
FIG. 16 depicts a cross-sectional view of the structure of FIGS. 15A and 15B following formation of inner spacers for top transistors of the stacked transistor structure, according to an embodiment of the invention.

FIG. 16 shows a cross-sectional view 1600 of the structure of FIGS. 15A and 15B showing an outer spacer layer 1601 and inner spacers 1603 for the bottom transistors of the stacked transistor structure, following formation of a liner layer 1336, a bonding dielectric layer 1338, a nanosheet stack including nanosheet channel layers 1342, an outer spacer layer 1605 and inner spacers 1607 for the top transistors of the stacked transistor structure. The liner layer 1336, the bonding dielectric layer 1338, and the nanosheet channel layers 1342 may be formed of similar materials and with similar sizing and processing as that described above with respect to the liner layer 136, the bonding dielectric layer 138 and the nanosheet channel layers 142, respectively. The outer spacer layer 1601 and the outer spacer layer 1605 may be formed of SiBCN or another suitable material such as SiN, SiCO, etc. The inner spacers 1603 and 1607 may be formed of SiN, SiBCN, SiCO, combinations thereof, etc.

FIG. 16 also shows formation of a liner layer 1617 (also referred to as a dielectric wall liner) and dielectric wall layer 1619 for the top transistors of the stacked transistor structure, which are formed of similar materials and with similar sizing and processing as that described above with respect to the liner layer 1317 and dielectric wall layer 1319. The cross-sectional view 1600 of FIG. 16 is taken along the gate axis where the inner spacers 1603 and 1607 for the bottom and top transistors of the stacked transistor structure are formed. FIG. 16 shows detailed features of the inner spacers 1603 and 1607, illustrating how the inner spacers 1603 and 1607 extend and contact the dielectric wall layers 1319 and 1619, respectively. The inner spacers 1603 and 1607 include vertical portions, highlighted by the dashed outlines 1609, adjacent the dielectric wall layer 1619. Without these vertical portions of the inner spacers 1603 and 1607, gate oxide removal processing would create a free path for the gate stack to blow out of the gate cavity and “touch” the source/drain terminals.

Figure 17A:
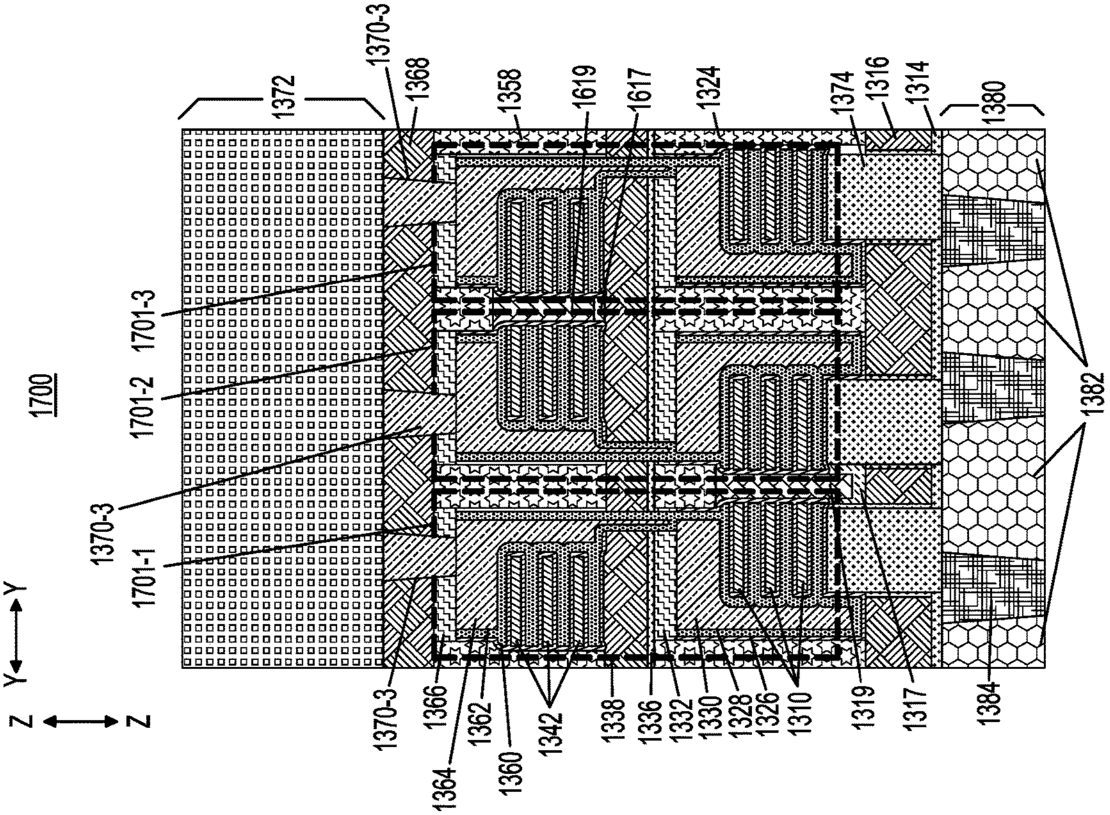
FIG. 17A depicts a first cross-sectional view of the structure of FIG. 16 following formation of source/drain regions for the top transistors of the stacked transistor structure, a liner layer, an oxide layer, gate cut dielectric layers for the top transistors of the stacked transistor structure, a dielectric wall liner for the top transistors of the stacked transistor structure, a dielectric wall layer for the top transistors of the stacked transistor structure, a gate stack for the top transistors of the stacked transistor structure, middle-of-line contacts, back-end-of-line interconnects and a backside power delivery network, according to an embodiment of the invention.
Figure 17C:
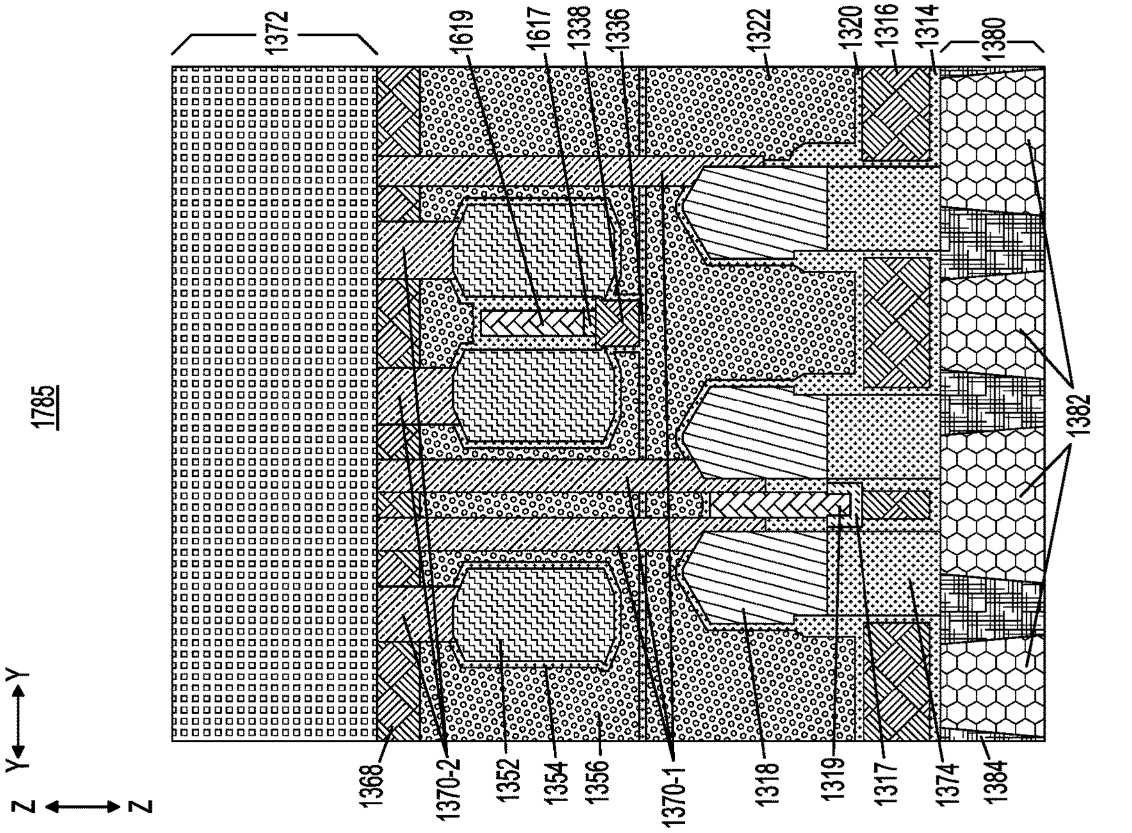
FIG. 17C depicts a third cross-sectional view of the structure of FIG. 16 following the formation of the source/drain regions for the top transistors of the stacked transistor structure, the liner layer, the oxide layer, the gate cut dielectric layers for the top transistors of the stacked transistor structure, the dielectric wall liner for the top transistors of the stacked transistor structure, the dielectric wall layer for the top transistors of the stacked transistor structure, the gate stack for the top transistors of the stacked transistor structure, the middle-of-line contacts, the back-end-of-line interconnects and the backside power delivery network, according to an embodiment of the invention.
Figure 17B:
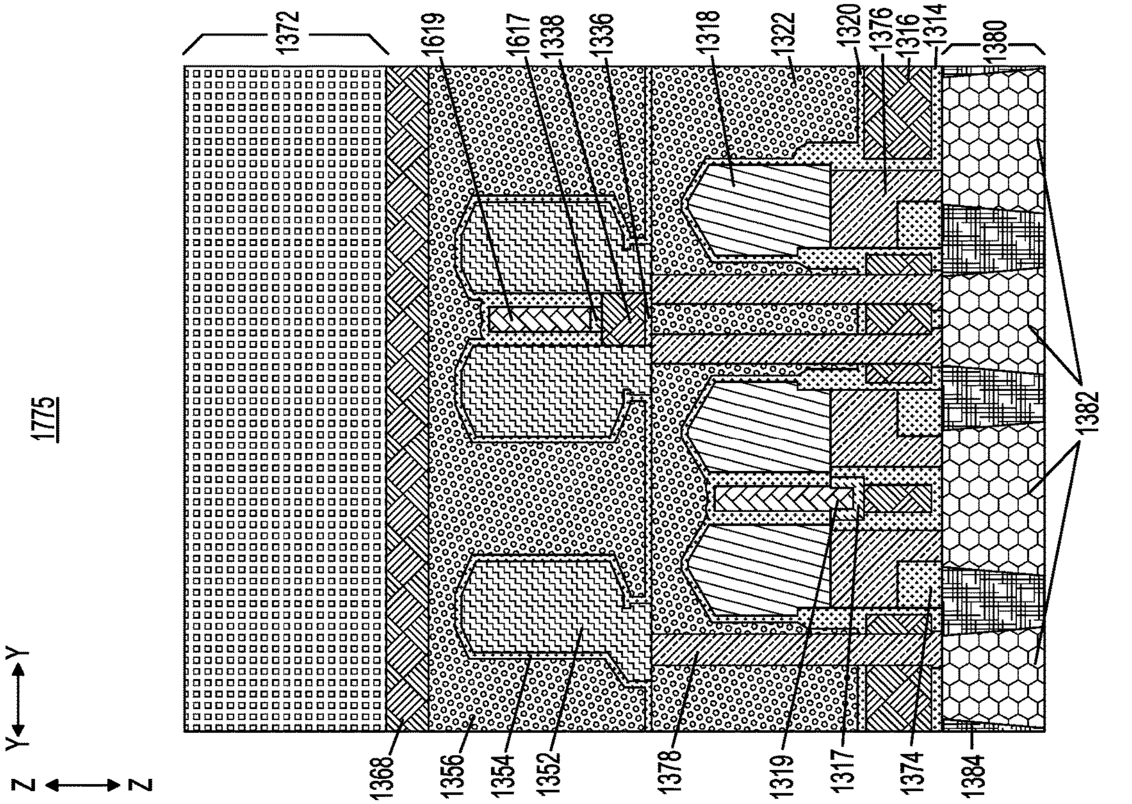
FIG. 17B depicts a second cross-sectional view of the structure of FIG. 16 following the formation of the source/drain regions for the top transistors of the stacked transistor structure, the liner layer, the oxide layer, the gate cut dielectric layers for the top transistors of the stacked transistor structure, the dielectric wall liner for the top transistors of the stacked transistor structure, the dielectric wall layer for the top transistors of the stacked transistor structure, the gate stack for the top transistors of the stacked transistor structure, the middle-of-line contacts, the back-end-of-line interconnects and the backside power delivery network, according to an embodiment of the invention.

FIGS. 17A-17C show different views of the structure of FIG. 16 following formation of source/drain regions 1352 for the top transistors of the stacked transistor structure, a liner layer 1354, an oxide layer 1356, gate cut dielectric layers 1358 for the top transistors of the stacked transistor structure, the liner layer 1617 and the dielectric wall layer 1619, a gate stack for the top transistors of the stacked transistor structure including a gate dielectric layer 1360, a gate WFM layer 1362 and a gate metal layer 1364, gate SAC capping layers 1366, MOL contacts 1370-1 1370-2 and 1370-3 (collectively, MOL contacts 1370), BEOL interconnects 1372, a backside ILD layer 1374, backside contacts 1376 to the source/drain regions 1318 of the bottom transistors of the stacked transistor structure, backside contacts 1378 to the source/drain regions 1352 of the top transistors of the stacked transistor structure, and a BSPDN 1380 including power rails 1382 and dielectric layers 1384. FIG. 17A shows a first cross-sectional view 1700 taken along the gate axis where gate regions for the bottom and top transistors of the stacked transistor structure are formed (e.g., along the line A-A in the layout view 199 of FIG. 1B). FIG. 17B shows a second cross-sectional view 1775 taken along the gate axis where source ones of the source/drain regions 1318 and 1352 for the bottom and top transistors of the stacked transistor structure are formed (e.g., along the line B-B in the layout view 199 of FIG. 1B). FIG. 17C shows a third cross-sectional view 1785 taken along the gate axis where drain ones of the source/drain regions 1318 and 1352 for the bottom and top transistors of the stacked transistor structure are formed (e.g., along the line C-C in the layout view 199 of FIG. 1B).

In the structure of FIGS. 17A-17C, the dielectric wall layers 1319 and 1619 may prevent adjacent ones of the source/drain regions 1318 and 1352 from shorting one another in scaled cells.

The source/drain regions 1352, the liner layer 1354, the oxide layer 1356, the gate cut dielectric layers 1358, the gate dielectric layer 1360, the gate WFM layer 1362, the gate metal layer 1364, the gate SAC capping layers 1366, the MOL contacts 1370, the BEOL interconnects 1372, the backside ILD layer 1374, the backside contacts 1376, the backside contacts 1378, the BSPDN 1380, the power rails 1382 and the dielectric layers 1384 are formed of similar materials and with similar sizing and processing as that described above with respect to the source/drain regions 152, the liner layer 154, the oxide layer 156, the gate cut dielectric layers 158, the gate dielectric layer 160, the gate WFM layer 162, the gate metal layer 164, the gate SAC capping layers 166, the MOL contacts 170, the BEOL interconnects 172, the backside ILD layer 174, the backside contacts 176, the backside contacts 178, the BSPDN 180, the power rails 182 and the dielectric layers 184, respectively.

As shown in FIG. 17A, a set of mirrored stacked transistor cells 1701-1, 1701-2 and 1701-3 (collectively, stacked transistor cells 1701) are thus formed, where cell boundaries of the stacked transistor cells 1701 are defined by the gate cut dielectric layers 1324 and 1358 which are horizontally aligned with one another. The cell boundaries may also be defined by the dielectric walls (e.g., dielectric wall layers 1319 and 1619 which are formed below or above ones of the gate cut dielectric layers 1324 and 1358).

Figures 18A, 18B, 18C:
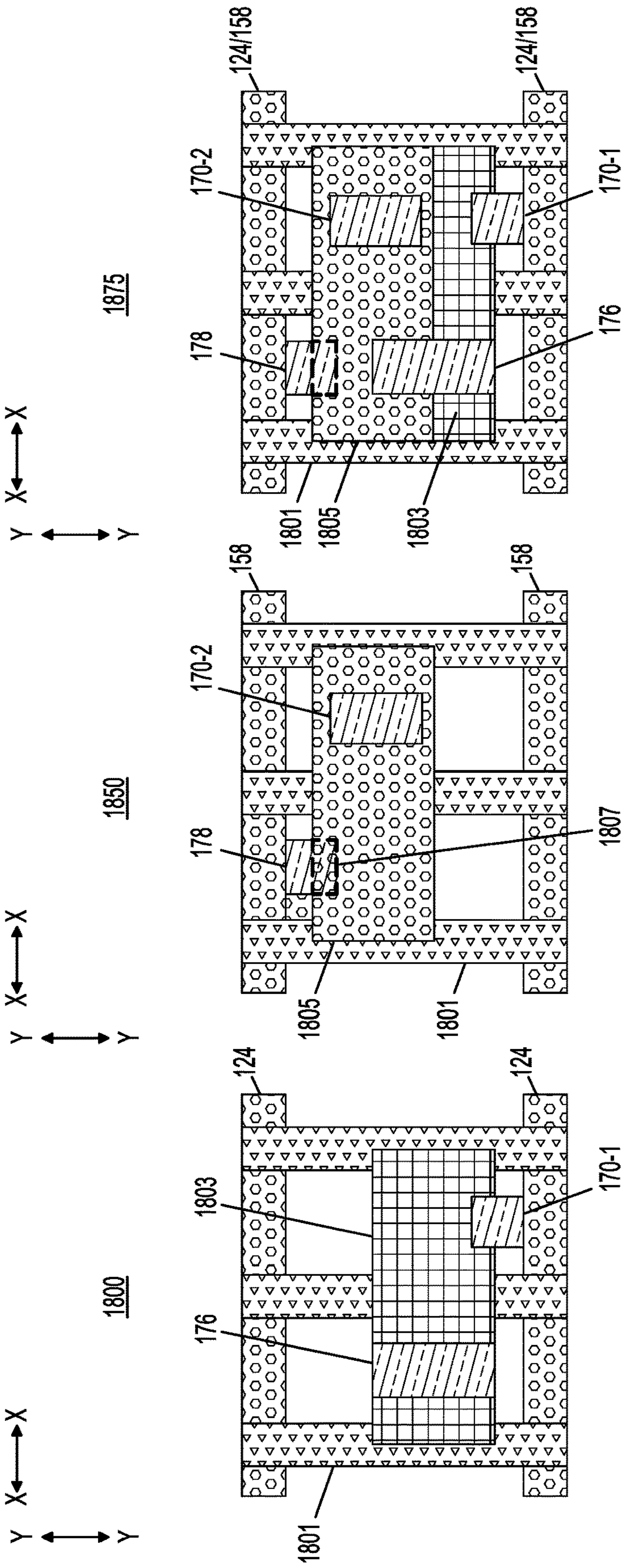
FIG. 18A depicts a top-down view illustrating a layout of a bottom transistor of a stacked transistor cell having aligned cell boundaries and shifted channels, according to an embodiment of the invention.
FIG. 18B depicts a top-down view illustrating a layout of a top transistor of the stacked transistor cell having aligned cell boundaries and shifted channels, according to an embodiment of the invention.
FIG. 18C depicts a top-down view superimposing the top-down views of FIGS. 18A and 18B, according to an embodiment of the invention.

FIGS. 18A-18C show different top-down views illustrating a layout of a stacked transistor cell having aligned cell boundaries and shifted channels. FIG. 18A shows a top-down view 1800 illustrating a layout of a bottom transistor of the stacked transistor cell, which includes aligned cell boundaries defined by the gate cut dielectric layers 124. FIG. 18A also shows gate regions 1801, an active region 1803 for the bottom transistor of the stacked transistor cell, as well as MOL contact 170-1 (e.g., a frontside source/drain terminal contact for the bottom transistor) and backside contact 176 (e.g., a backside source/drain terminal contact for the bottom transistor).

FIG. 18B shows a top-down view 1850 illustrating a layout of a top transistor of the stacked transistor cell, which includes aligned cell boundaries defined by the gate cut dielectric layers 158. FIG. 18B also shows the gate regions 1801, an active region 1805 for the top transistor of the stacked transistor cell, as well as MOL contact 170-2 (e.g., a frontside source/drain terminal contact for the top transistor) and backside contact 178 (e.g., a backside source/drain terminal contact for the top transistor). As shown in FIG. 18B, the backside contact 178, in region 1807, can at least partially overlap (in direction Y) with adjacent channel layers (e.g., at the intersections of the gate regions 1801 and the active region 1805). This is an example of an arrangement in which a contact extends from a backside of the structure (e.g., from a BSPDN) to a semiconductor terminal of a top transistor of a stacked transistor structure, where at least a portion of the contact is underneath at least a portion of the semiconductor terminal of the top transistor of the stacked transistor structure, and where that portion of the semiconductor terminal of the top transistor of the stacked transistor structure is laterally adjacent to channels of the top transistor of the stacked transistor structure.

FIG. 18C shows a top-down view 1875, with the top-down view 1850 superimposed over the top-down view 1800. As illustrated, the gate cut dielectric layers 124 and 158 for the bottom and top transistors of the stacked transistor cell are aligned with one another.

Figure 19:
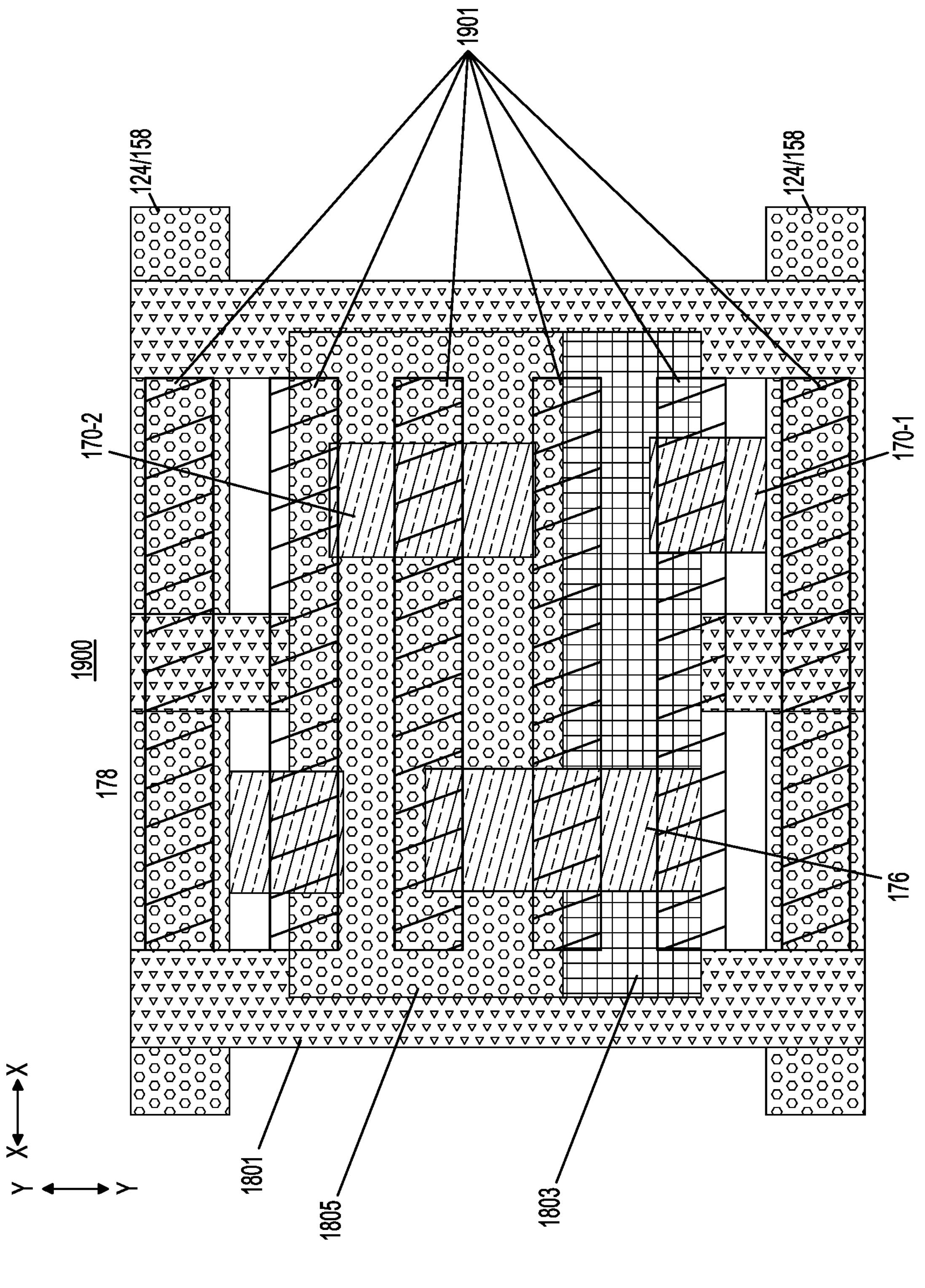
FIG. 19 depicts a top-down view of the structure of FIG. 18C including a mask level for a first metallization level of a back-end-of-line interconnect structure, according to an embodiment of the invention.

FIG. 19 shows a top-down view 1900, illustrating a mask level for a metal level 1901 of the BEOL interconnects 172 superimposed over the top-down view 1875 of FIG. 18C. In this example, the metal level 1901 includes metal contacts for a 5 transistor (5T) inverter cell. It should be noted that a layout for a 4 transistor (4T) inverter cell would have a similar configuration, but with different dimensions.

Figure 20:
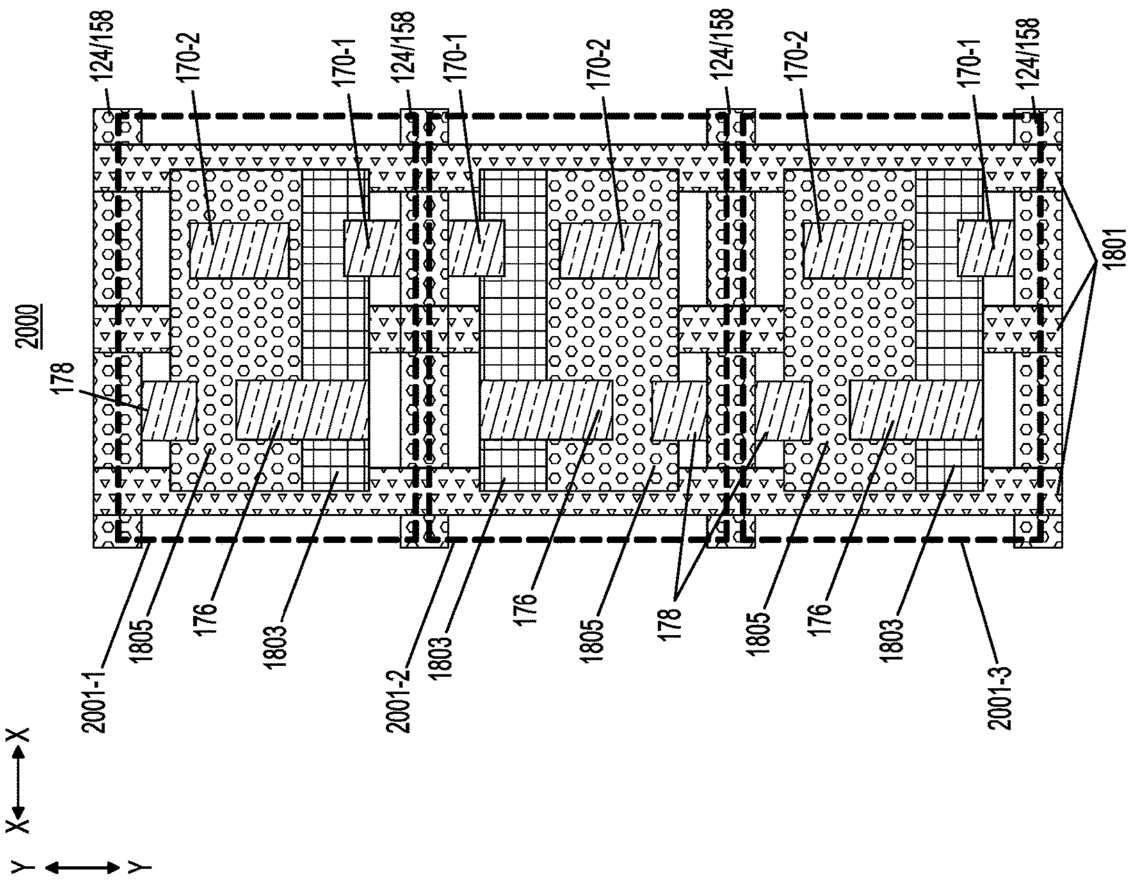
FIG. 20 depicts a top-down view of a set of mirrored stacked transistor cells having aligned cell boundaries and shifted channels, according to an embodiment of the invention.

FIG. 20 shows a top-down view 2000, illustrating a set of three mirrored stacked transistor cells 2001-1, 2001-2 and 2001-3 (collectively, stacked transistor cells 2001). Each of the stacked transistor cells 2001 is structured in a manner similar to that of the stacked transistor cell shown in FIGS. 18A-18C. Here, the cell boundaries between adjacent ones of the stacked transistor cells 2001 are defined by the gate cut dielectric layers 124/158 as illustrated.

Figure 21C:
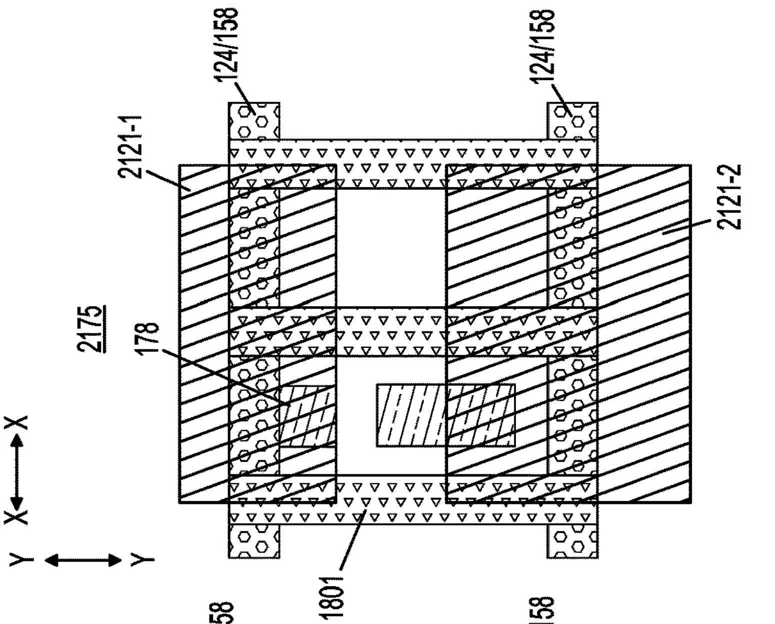
FIG. 21C depicts a top-down view of a stacked transistor cell layout with asymmetric outbound power tracks, according to an embodiment of the invention.
Figure 21B:
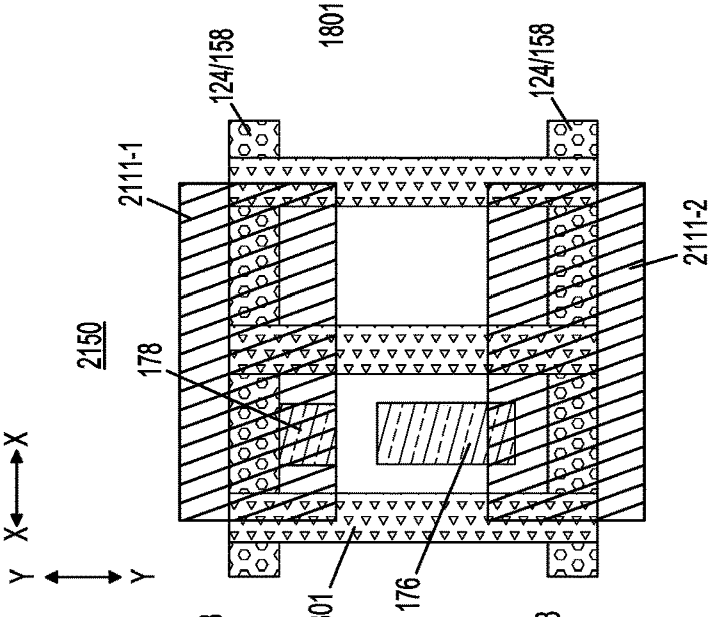
FIG. 21B depicts a top-down view of a stacked transistor cell layout with symmetric outbound power tracks, according to an embodiment of the invention.
Figure 21A:
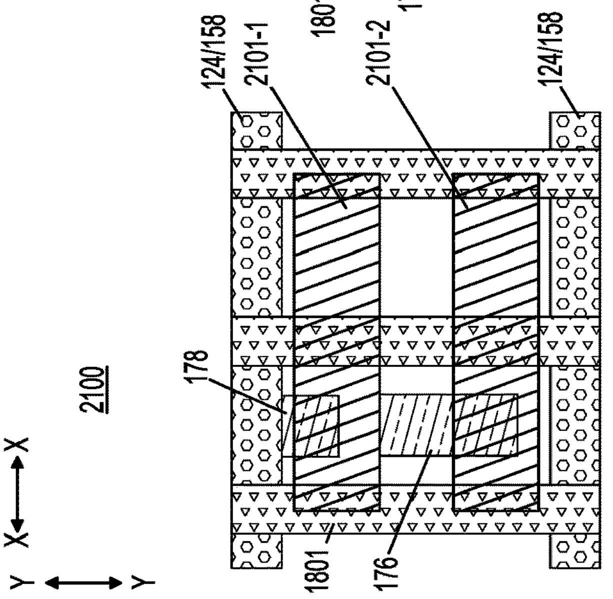
FIG. 21A depicts a top-down view of a stacked transistor cell layout with inbound power tracks, according to an embodiment of the invention.

FIGS. 21A-21C show top-down views of layouts for power tracks (e.g., the power rails 182/1382 in the BSPDN 180/1283 of the structures described above) in a stacked transistor cell with aligned cell boundaries and shifted channels. FIG. 21A shows a top-down view 2100 of a stacked transistor cell with boundaries defined by the gate cut dielectric layers 124/158, and having gate regions 1801, active region 1803 and active region 1805. FIG. 21A also shows the backside contacts 176 and 178, and respective power tracks 2101-1 and 2101-2 (collectively, power tracks 2101) which are connected to the backside contacts 176 and 178. In FIG. 21A, the power tracks 2101 are "inbound" power tracks which are contained within the stacked transistor cell boundary. Such an arrangement is suitable for larger stacked transistor cells.

FIG. 21B shows a top-down view 2150 of a stacked transistor cell with boundaries defined by the gate cut dielectric layers 124/158, and having gate regions 1801, active region 1803 and active region 1805. FIG. 21B also shows the backside contacts 176 and 178, and respective power tracks 2111-1 and 2111-2 (collectively, power tracks 2111) which are connected to the backside contacts 176 and 178. In FIG. 21B, the power tracks 2111 are "outbound" power tracks which are not contained within the stacked transistor cell boundary. The outbound power track arrangement allows for large and more separated power tracks which reduces the risk of shorting between the backside contacts 176 and 178. The outbound power track arrangement further provides benefits in terms of electrical resistance and capacitance, with lager power tracks generally being preferred to thin power tracks.

FIG. 21C shows a top-down view 2175 of a stacked transistor cell with boundaries defined by the gate cut dielectric layers 124/158, and having gate regions 1801, active region 1803 and active region 1805. FIG. 21C also shows the backside contacts 176 and 178, and respective power tracks 2121-1 and 2121-2 (collectively, power tracks 2121) which are connected to the backside contacts 176 and 178. In FIG. 21C, the power tracks 2121 are outbound power tracks which are not contained within the stacked transistor cell boundary, and are also "asymmetric" in that the power tracks 2121-1 and 2121-2 have different widths. The asymmetric outbound power track provides the same benefits of the "symmetric" outbound power tracks shown in FIG. 21B, while also allowing for optimizing the overlap with the backside contacts 176 and 178.

Semiconductor devices and methods for forming the same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require or otherwise utilize, for example, complementary metal-oxide-semiconductor (CMOS) transistors, metal-oxide-semiconductor field-effect transistors (MOSFETs), and/or fin field-effect transistors (FinFETs). By way of non-limiting example, the semiconductor devices can include, but are not limited to CMOS, MOSFET, and FinFET devices, and/or semiconductor devices that use CMOS, MOSFET, and/or FinFET technology.

Figure 22:
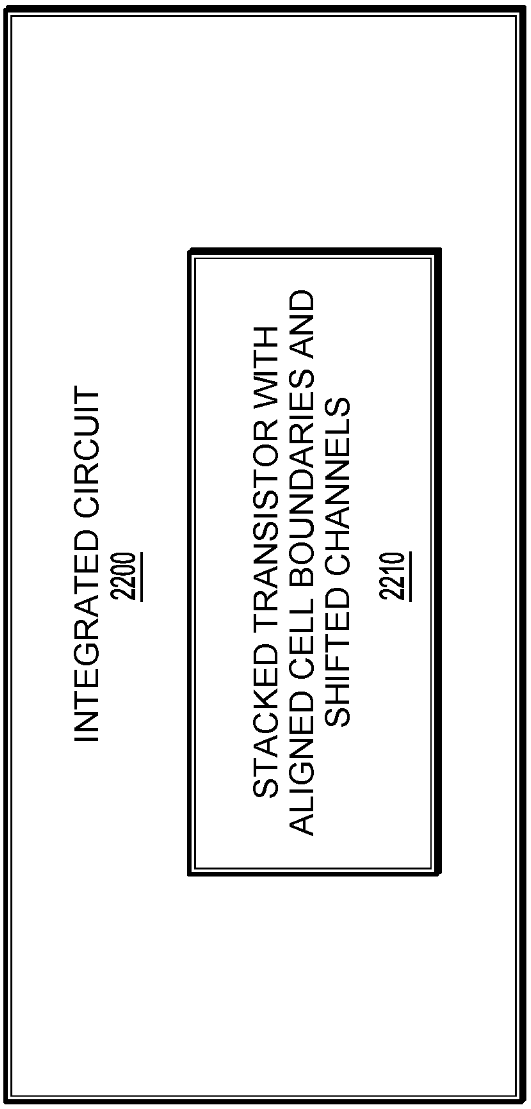
FIG. 22 shows an integrated circuit comprising one or more stacked transistor structures with aligned cell boundaries and shifted channels, according to an embodiment of the invention.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either: (a) an intermediate product, such as a motherboard, or (b) an end product. The end product can be any product that includes integrated circuit chips, ranging from toys and other low-end applications to advanced computer products having a display, a keyboard or other input device, and a central processor. FIG. 22 shows an example integrated circuit 2200 which includes one or more stacked transistor structures with aligned cell/device boundaries and shifted channels 2210.

It should be understood that the various layers, structures, and regions shown in the figures are schematic illustrations that are not drawn to scale. In addition, for ease of explanation, one or more layers, structures, and regions of a type commonly used to form semiconductor devices or structures may not be explicitly shown in a given figure. This does not imply that any layers, structures, and regions not explicitly shown are omitted from the actual semiconductor structures. Furthermore, it is to be understood that the embodiments discussed herein are not limited to the particular materials, features, and processing steps shown and described herein.

In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the figures to denote the same or similar features, elements, or structures, and thus, a detailed explanation of the same or similar features, elements, or structures are not repeated for each of the figures. It is to be understood that the terms "approximately" or "substantially" as used herein with regard to thicknesses, widths, percentages, ranges, temperatures, times and other process parameters, etc., are meant to denote being close or approximate to, but not exactly. For example, the term "approximately" or "substantially" as used herein implies that a small margin of error is present, such as ±5%, preferably less than 2% or 1% or less than the stated amount.

In the description above, various materials, dimensions and processing parameters for different elements are provided. Unless otherwise noted, such materials are given by way of example only and embodiments are not limited solely to the specific examples given. Similarly, unless otherwise noted, all dimensions and process parameters are given by way of example and embodiments are not limited solely to the specific dimensions or ranges given.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:

a first transistor;

a second transistor vertically stacked over the first transistor; and a gate merge contact between a first gate region of the first transistor and a second gate region of the second transistor;

wherein the first transistor and the second transistor have horizontally aligned cell boundaries; and wherein a first set of one or more channels of the first transistor are horizontally offset from a second set of one or more channels of the second transistor within the horizontally aligned cell boundaries; and wherein the gate merge contact is disposed within the horizontally aligned cell boundaries on a first side of the second set of channels and over a portion of the first set of channels.

2. The semiconductor structure of claim 1, wherein:

the first set of one or more channels of the first transistor have a first distance to the horizontally aligned cell boundaries at a first lateral side of the semiconductor structure and a second distance to the horizontally aligned cell boundaries at a second lateral side of the semiconductor structure opposite the first lateral side of the semiconductor structure, the first distance being greater than the second distance; and the second set of one or more channels of the second transistor have a third distance to the horizontally aligned cell boundaries at the first lateral side of the semiconductor structure and a fourth distance to the horizontally aligned cell boundaries at the second lateral side of the semiconductor structure opposite the first lateral side of the semiconductor structure, the third distance being less than the fourth distance.

3. The semiconductor structure of claim 1, wherein the first transistor is proximate a backside of the semiconductor structure and the second transistor is proximate a frontside of the semiconductor structure, and further comprising at least one contact extending from a backside power delivery network of the semiconductor structure to at least one semiconductor terminal of at least one of the second transistor, the at least one contact being underneath at least a portion of the at least one semiconductor terminal, the portion of the at least one semiconductor terminal being laterally adjacent to the second set of one or more channels.

4. The semiconductor structure of claim 1, wherein the first transistor is proximate a backside of the semiconductor structure and the second transistor is proximate a frontside of the semiconductor structure, and further comprising a contact which connects to a semiconductor terminal of the first transistor at the backside of the semiconductor structure, the contact having a first portion with a first width proximate a bottom surface of the semiconductor terminal of the first transistor and a second portion with a second width proximate a backside of the first portion, the first width being greater than the second width.

5. The semiconductor structure of claim 1, further comprising at least one contact to at least one of the first transistor and the second transistor which is within the horizontally aligned cell boundaries.

6. The semiconductor structure of claim 1, further comprising a first power rail which connects to a first semiconductor terminal of one of the first transistor and the second transistor and a second power rail which connects to a second semiconductor terminal of one of the first transistor and the second transistor, wherein the first power rail has a different width than the second power rail.

7. A semiconductor structure comprising:

a first stacked transistor cell comprising a first transistor and a second transistor vertically stacked over the first transistor, wherein a first set of one or more channels of the first transistor are horizontally offset from a second set of one or more channels of the second transistor within cell boundaries of the first stacked transistor cell; and a second stacked transistor cell comprising a third transistor and a fourth transistor vertically stacked over the third transistor, wherein a third set of one or more channels of the third transistor are horizontally offset from a fourth set of one or more channels of the fourth transistor within cell boundaries of the second stacked transistor cell;

wherein the second stacked transistor cell is laterally adjacent to the first stacked transistor cell.

8. The semiconductor structure of claim 7, wherein:

the first set of one or more channels of the first transistor have a first lateral distance from the third set of one or more channels of the third transistor;

the second set of one or more channels of the second transistor have a second lateral distance from the fourth set of one or more channels of the fourth transistor; and the first lateral distance is different than the second lateral distance.

9. The semiconductor structure of claim 7, wherein a first lateral distance between the first set of one or more channels of the first transistor and the third set of one or more channels of the third transistor than second set of one or more channels is less than a second lateral distance between the second set of one or more channels of the first transistor and the fourth set of one or more channels of the fourth transistor, and further comprising at least one of:

a first semiconductor terminal of the first transistor which is merged with a second semiconductor terminal of the third transistor; and a merged contact to the first semiconductor terminal of the first transistor and the second semiconductor terminal of the third transistor.

10. The semiconductor structure of claim 7, wherein a first lateral distance between the first set of one or more channels of the first transistor and the third set of one or more channels of the third transistor than second set of one or more channels is greater than a second lateral distance between the second set of one or more channels of the first transistor and the fourth set of one or more channels of the fourth transistor, and further comprising at least one of:

a first semiconductor terminal of the second transistor which is merged with a second semiconductor terminal of the fourth transistor; and a merged contact to the first semiconductor terminal of the second transistor and the second semiconductor terminal of the fourth transistor.

11. The semiconductor structure of claim 7, further comprising at least one of:

two separate contacts which extend from the first transistor and the third transistor and connect to a first common power rail; and two separate contacts which extend from the second transistor and the fourth transistor and connect to a second common power rail.

12. The semiconductor structure of claim 7, further comprising at least one power rail that is merged across the cell boundaries of the first stacked transistor cell and the second stacked transistor cell.

13. A semiconductor structure, comprising:

a first transistor;

a second transistor vertically stacked over the first transistor;

a first dielectric spacer at a first lateral edge of the first and second transistors; and a second dielectric spacer at a second lateral edge of the first and second transistors;

wherein a first set of one or more channels of the first transistor are laterally closer to the first dielectric spacer than the second dielectric spacer; and wherein a second set of one or more channels of the second transistor are laterally closer to the second dielectric spacer than the first dielectric spacer.

14. The semiconductor structure of claim 13, wherein the first dielectric spacer comprises a first portion surrounding the first set of one or more channels of the first transistor and a second portion above the first portion, wherein the first portion of the first dielectric spacer has a first width, wherein the second portion of the first dielectric spacer has a second width, and wherein the second width is greater than the first width.

15. The semiconductor structure of claim 14, wherein the first portion of the first dielectric spacer comprises a high-k dielectric liner and the second portion of the first dielectric spacer does not have the high-k dielectric liner.

16. The semiconductor structure of claim 14, wherein the second dielectric spacer comprises a first portion surrounding the second set of one or more channels of the second transistor and a second portion below the first portion, wherein the first portion of the second dielectric spacer has a third width, wherein the second portion of the second dielectric spacer has a fourth width, and wherein the third width is less than the fourth width.

17. A stacked transistor structure comprising:

a first stacked transistor cell comprising a first transistor and a second transistor stacked vertically over the first transistor;

a second stacked transistor cell comprising a third transistor and a fourth transistor stacked vertically over the third transistor; and a dielectric wall separating the first stacked transistor cell and the second stacked transistor cell;

wherein a first set of one or more channels of the first transistor have a first lateral distance to the dielectric wall and a second set of one or more channels of the second transistor have a second lateral distance to the dielectric wall, the first lateral distance being different than the second lateral distance; and wherein a third set of one or more channels of the third transistor have a third lateral distance to the dielectric wall and a fourth set of one or more channels of the fourth transistor have a fourth lateral distance to the dielectric wall, the third lateral distance being different than the fourth lateral distance.

18. The stacked transistor structure of claim 17, wherein the first lateral distance is smaller than the second lateral distance and the third lateral distance is smaller than the fourth lateral distance.

19. The stacked transistor structure of claim 17, wherein at least one of: the first lateral distance is different than the third lateral distance; and the second lateral distance is different than the fourth lateral distance.

20. The stacked transistor structure of claim 17, wherein the first transistor and the third transistor comprise one of n-type transistors and p-type transistors, and wherein the second transistor and the fourth transistor comprise the other one of n-type transistors and p-type transistors.

21. An integrated circuit comprising:

a semiconductor structure comprising:

a first transistor;

a second transistor vertically stacked over the first transistor;

a first power rail which connects to a first semiconductor terminal of one of the first transistor and the second transistor; and a second power rail which connects to a second semiconductor terminal of one of the first transistor and the second transistor, the first power rail having a different width than the second power rail;

wherein the first transistor and the second transistor have horizontally aligned cell boundaries; and wherein a first set of one or more channels of the first transistor are horizontally offset from a second set of one or more channels of the second transistor within the horizontally aligned cell boundaries.

22. The integrated circuit of claim 21, wherein:

the first set of one or more channels of the first transistor have a first distance to the horizontally aligned cell boundaries at a first lateral side of the semiconductor structure and a second distance to the horizontally aligned cell boundaries at a second lateral side of the semiconductor structure opposite the first lateral side of the semiconductor structure, the first distance being greater than the second distance; and the second set of one or more channels of the second transistor have a third distance to the horizontally aligned cell boundaries at the first lateral side of the semiconductor structure and a fourth distance to the horizontally aligned cell boundaries at the second lateral side of the semiconductor structure opposite the first lateral side of the semiconductor structure, the third distance being less than the fourth distance.

23. The integrated circuit of claim 21, wherein the semiconductor structure further comprises a gate merge contact between a first gate region of the first transistor and a second gate region of the second transistor, wherein the gate merge contact is disposed within the horizontally aligned cell boundaries on a first side of the second set of channels and over a portion of the first set of channels.

24. The integrated circuit of claim 21, wherein the semiconductor structure further comprises at least one contact to at least one of the first transistor and the second transistor which is within the horizontally aligned cell boundaries.

25. The integrated circuit of claim 21, wherein the first transistor is proximate a backside of the semiconductor structure and the second transistor is proximate a frontside of the semiconductor structure, and wherein the semiconductor structure further comprises a contact which connects to a semiconductor terminal of the first transistor at the backside of the semiconductor structure, the contact having a first portion with a first width proximate a bottom surface of the semiconductor terminal of the first transistor and a second portion with a second width proximate a backside of the first portion, the first width being greater than the second width.

* * * * *